United States Patent
Kimura et al.

(10) Patent No.: US 8,355,015 B2
(45) Date of Patent: Jan. 15, 2013

(54) SEMICONDUCTOR DEVICE, DISPLAY DEVICE AND ELECTRONIC DEVICE INCLUDING A DIODE ELECTRICALLY CONNECTED TO A SIGNAL LINE

(75) Inventors: Hajime Kimura, Atsugi (JP); Yu Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 858 days.

(21) Appl. No.: 11/128,321

(22) Filed: May 13, 2005

(65) Prior Publication Data

US 2005/0259494 A1 Nov. 24, 2005

(30) Foreign Application Priority Data

May 21, 2004 (JP) .................. 2004-152601

(51) Int. Cl.
*G06F 3/038* (2006.01)
*G09G 5/00* (2006.01)
(52) U.S. Cl. .......................... 345/212; 345/82
(58) Field of Classification Search .......... 345/204–215, 345/690–699, 76–111; 315/169.1–169.3
See application file for complete search history.

(56) References Cited

U.S. PATENT DOCUMENTS

| | | | |
|---|---|---|---|
| 4,066,918 A | 1/1978 | Heuner et al. | |
| 4,131,928 A | 12/1978 | Davis et al. | |
| 4,393,380 A | 7/1983 | Hosokawa et al. | |
| 4,427,979 A | 1/1984 | Clerc et al. | |
| 4,523,189 A | 6/1985 | Takahara et al. | |
| 4,559,535 A | 12/1985 | Watkins et al. | |
| 4,803,536 A | 2/1989 | Tuan | |
| 4,876,584 A | 10/1989 | Taylor | |
| 4,897,757 A | 1/1990 | Tailliet et al. | |
| 4,908,710 A | 3/1990 | Wakai et al. | |
| 4,930,036 A | 5/1990 | Sitch | |
| 5,068,748 A | 11/1991 | Ukai et al. | |
| 5,087,955 A | 2/1992 | Futami | |

(Continued)

FOREIGN PATENT DOCUMENTS

JP 62-007167 1/1987

(Continued)

OTHER PUBLICATIONS

Horowitz et al., "The Art of Electronics," pp. 176-177 and 182-184.

(Continued)

*Primary Examiner* — Chanh Nguyen
*Assistant Examiner* — Long D Pham
(74) *Attorney, Agent, or Firm* — Eric J. Robinson; Robinson Intellectual Property Law Office, P.C.

(57) ABSTRACT

When writing a signal current from a current source to a current source circuit, noise occurs in some cases in a wiring through which a current flows, which may cause a potential of the wiring to be outside the normal range. As the potential does not turn back within the normal range easily at this time, writing to the current source circuit is delayed. According to the invention, when the potential becomes outside the normal range due to noise occurring in a wiring through which a current flows when writing a signal current from a current source to a current source circuit, a current is supplied from other than the current source, thereby the potential of the wiring can turn back within the normal range rapidly.

28 Claims, 50 Drawing Sheets

U.S. PATENT DOCUMENTS

| | | | |
|---|---|---|---|
| 5,113,181 A | 5/1992 | Inoue et al. | |
| 5,144,392 A | 9/1992 | Brotherton | |
| 5,159,518 A * | 10/1992 | Roy | 361/56 |
| 5,165,075 A | 11/1992 | Hiroki et al. | |
| 5,200,876 A | 4/1993 | Takeda et al. | |
| 5,204,988 A | 4/1993 | Sakurai | |
| 5,220,443 A | 6/1993 | Noguchi | |
| 5,264,839 A | 11/1993 | Kanno et al. | |
| 5,414,442 A | 5/1995 | Yamazaki et al. | |
| 5,585,949 A | 12/1996 | Yamazaki et al. | |
| 5,631,793 A * | 5/1997 | Ker et al. | 361/56 |
| 5,646,808 A * | 7/1997 | Nakayama | 361/56 |
| 5,784,073 A | 7/1998 | Yamazaki et al. | |
| 5,956,105 A | 9/1999 | Yamazaki et al. | |
| 6,229,506 B1 | 5/2001 | Dawson et al. | |
| 6,303,443 B1 * | 10/2001 | Hsu | 438/281 |
| 6,333,661 B1 * | 12/2001 | Ando et al. | 327/313 |
| 6,373,454 B1 | 4/2002 | Knapp et al. | |
| 6,377,105 B1 * | 4/2002 | Hughes | 327/333 |
| 6,778,231 B1 | 8/2004 | Yamazaki et al. | |
| 6,859,193 B1 | 2/2005 | Yumoto | |
| 7,742,019 B2 | 6/2010 | Takahara | |
| 7,777,698 B2 | 8/2010 | Takahara | |
| 7,924,248 B2 | 4/2011 | Takahara | |
| 7,932,880 B2 | 4/2011 | Takahara | |
| 2001/0045998 A1 * | 11/2001 | Nagata et al. | 349/40 |
| 2002/0053884 A1 * | 5/2002 | Kimura | 315/169.3 |
| 2003/0058687 A1 | 3/2003 | Kimura | |
| 2003/0128200 A1 * | 7/2003 | Yumoto | 345/211 |
| 2003/0156102 A1 * | 8/2003 | Kimura | 345/204 |
| 2003/0174009 A1 * | 9/2003 | Kimura et al. | 327/427 |
| 2003/0214245 A1 * | 11/2003 | Yamazaki et al. | 315/169.3 |
| 2004/0032544 A1 * | 2/2004 | Kim et al. | 349/40 |
| 2004/0227749 A1 * | 11/2004 | Kimura | 345/211 |
| 2005/0052391 A1 | 3/2005 | Yamazaki et al. | |
| 2005/0180083 A1 * | 8/2005 | Takahara et al. | 361/152 |
| 2007/0080905 A1 * | 4/2007 | Takahara | 345/76 |
| 2008/0084365 A1 | 4/2008 | Takahara et al. | |
| 2009/0184984 A1 | 7/2009 | Takahara | |

FOREIGN PATENT DOCUMENTS

| | | |
|---|---|---|
| JP | 62-252964 | 11/1987 |
| JP | 63-010558 | 1/1988 |
| JP | 63-074034 | 4/1988 |
| JP | 63-085586 | 4/1988 |
| JP | 63-133124 | 6/1988 |
| JP | 03-002838 | 1/1991 |
| JP | 03-050528 | 3/1991 |
| JP | 10-010493 A | 1/1998 |
| JP | 2002-514320 | 5/2002 |
| JP | 2002-517806 | 6/2002 |
| JP | 2002-303847 A | 10/2002 |
| JP | 2004-029755 A | 1/2004 |
| JP | 2004-054200 | 2/2004 |
| JP | 2004-361571 | 12/2004 |
| WO | WO 01/06484 | 1/2001 |
| WO | WO 02/39420 | 5/2002 |
| WO | WO/2004/100118 | * 11/2004 |

OTHER PUBLICATIONS

Lancaster, "CMOS Cookbook," Jan. 1, 1977, pp. 25-27.
McKelvey, Solid State and Semiconductor Physics, Jan. 1, 1971, pp. 424-428.
Horowitz et al., "The Art of Electronics," published Jul. 28, 1989 by Cambridge University Press, pp. 176-177 and 182-184.

\* cited by examiner

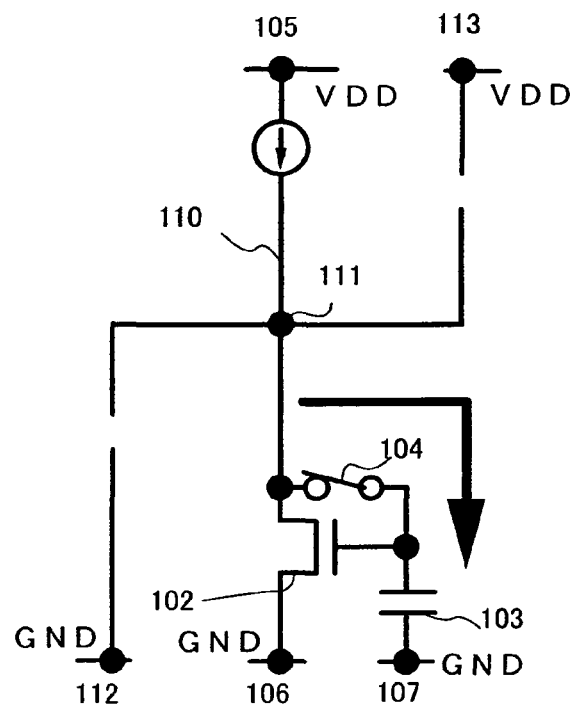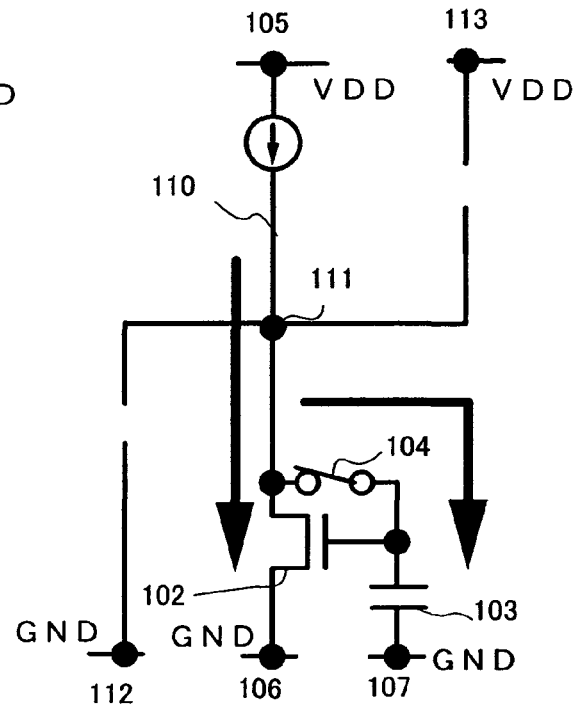
FIG. 2A
FIG. 2B
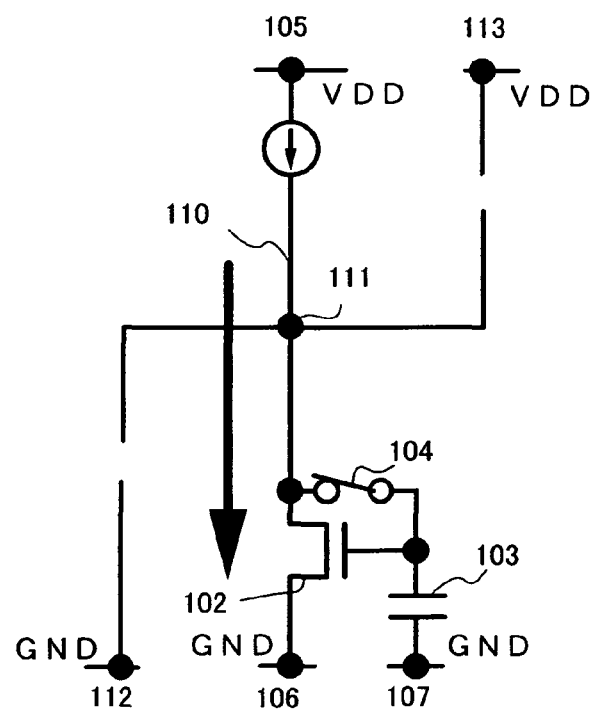
FIG. 2C

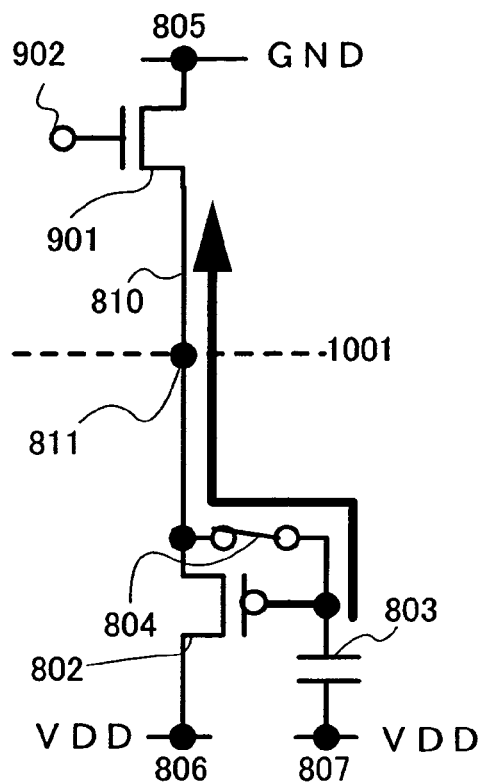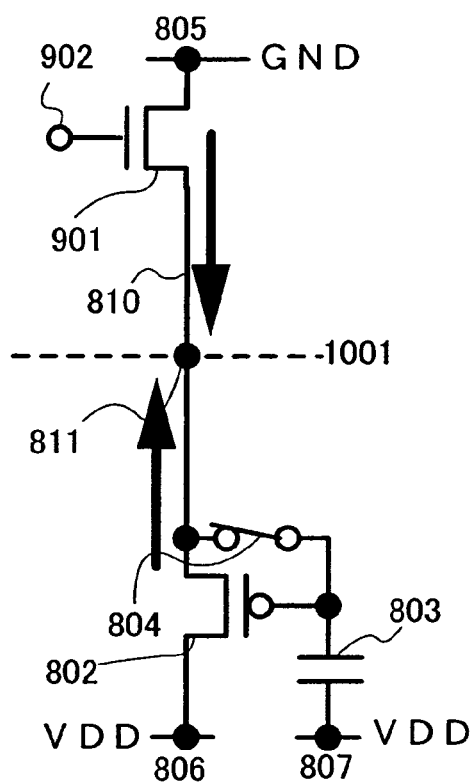
FIG. 10A  FIG. 10B
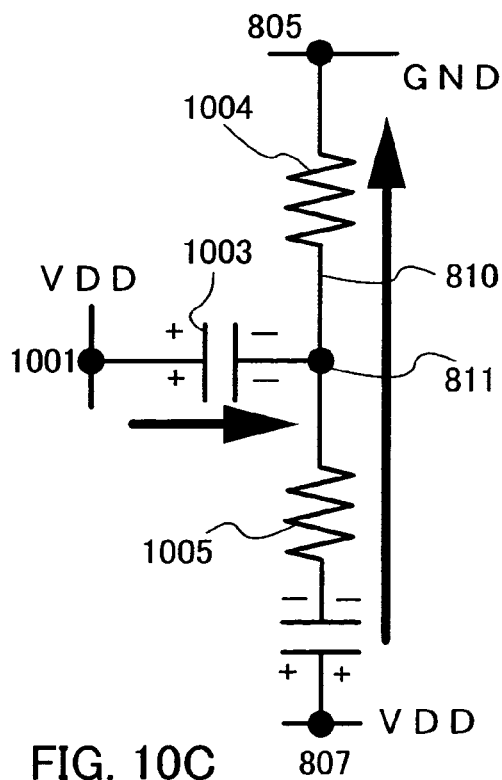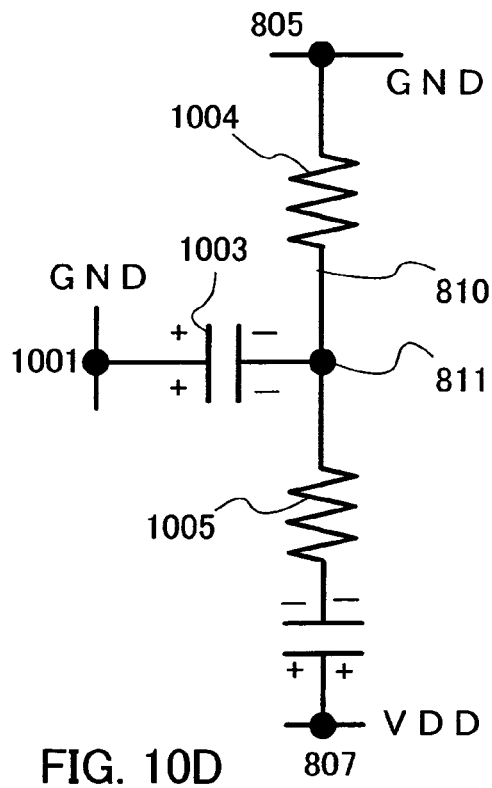
FIG. 10C  FIG. 10D

SIGNAL INPUTTING PERIOD

SIGNAL INPUTTED PERIOD

LIGHT EMITTING PERIOD

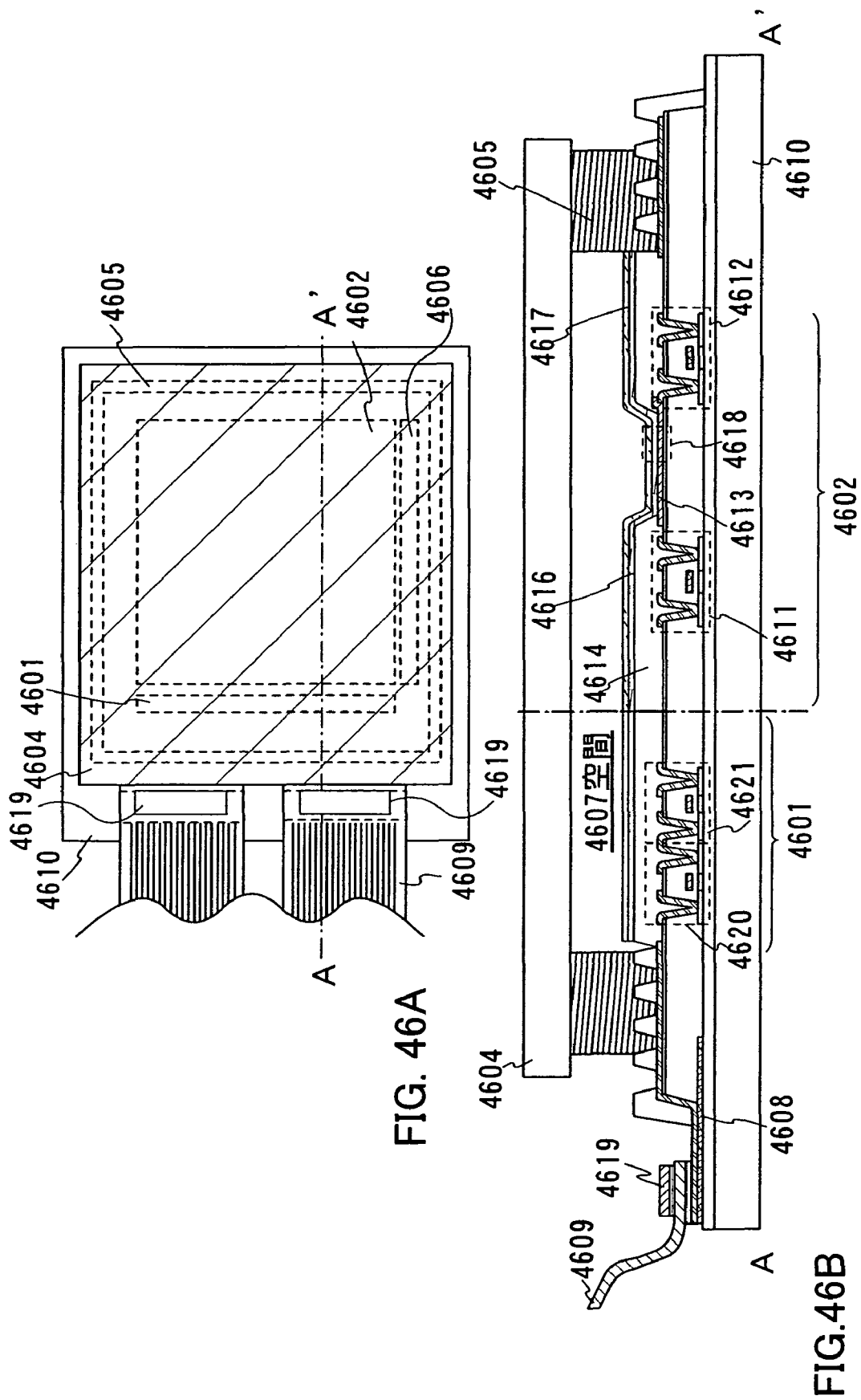

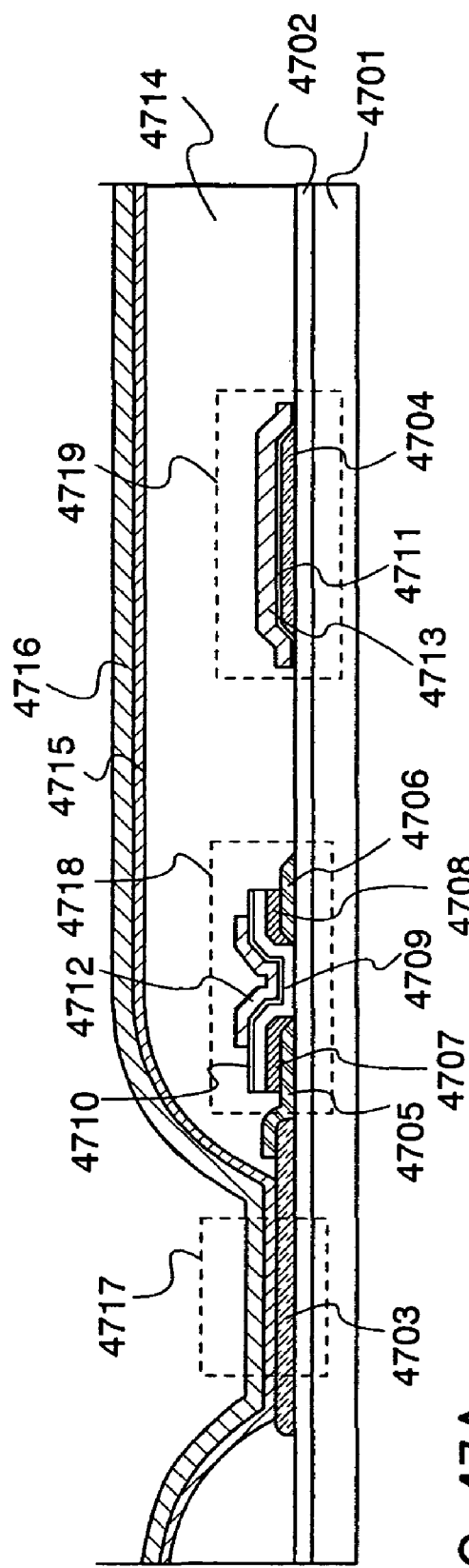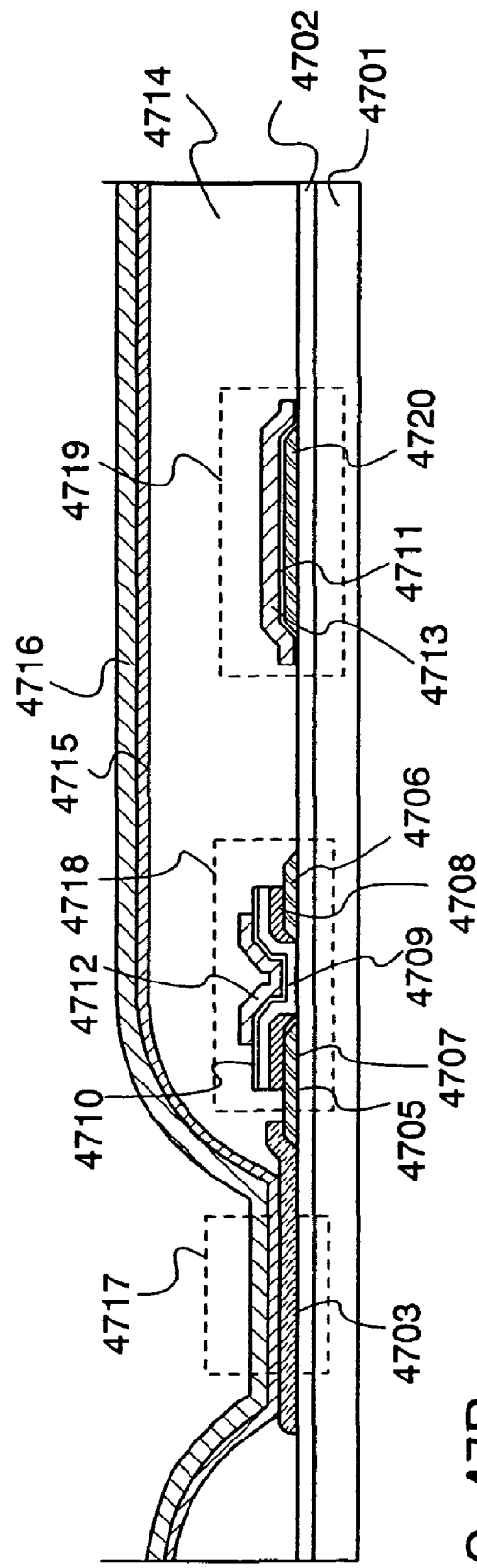
FIG. 47A
FIG. 47B

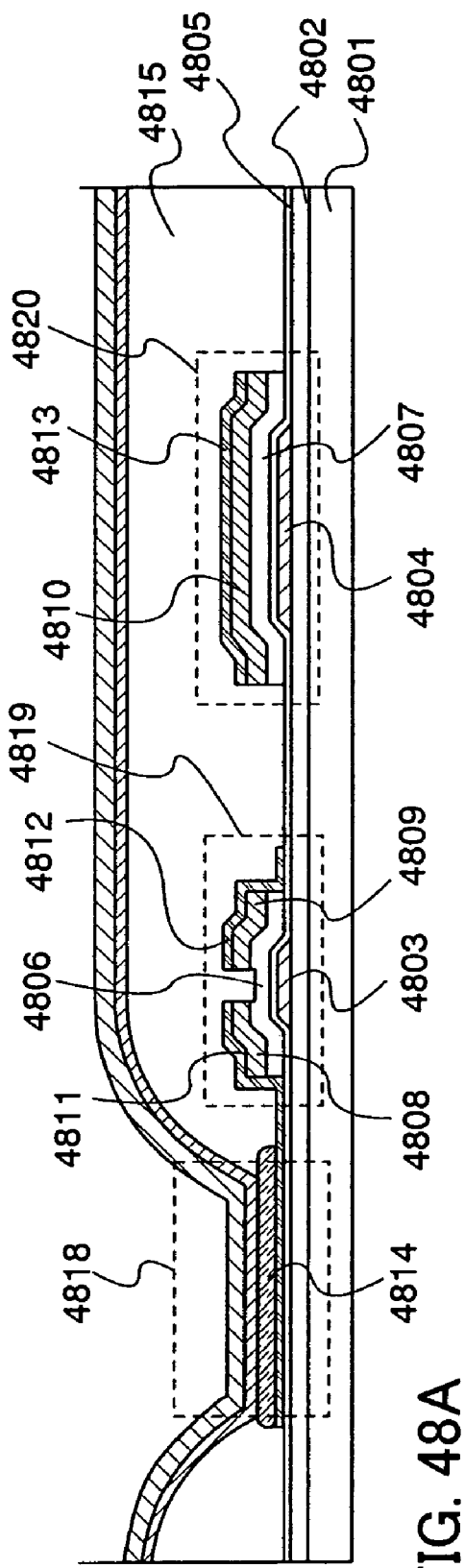
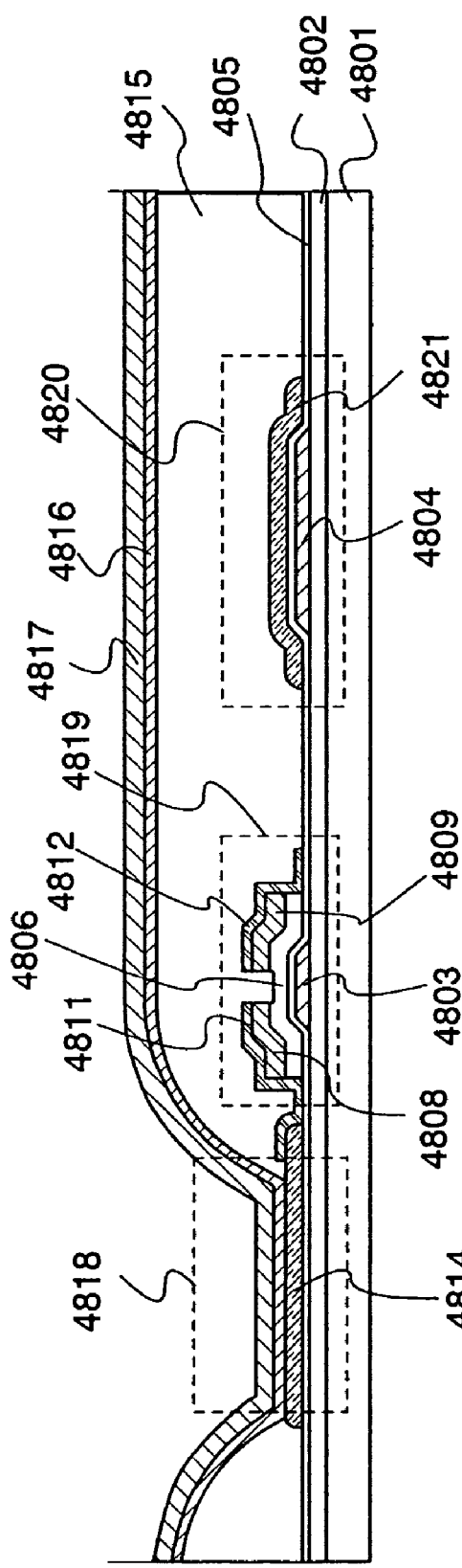
FIG. 48A
FIG. 48B

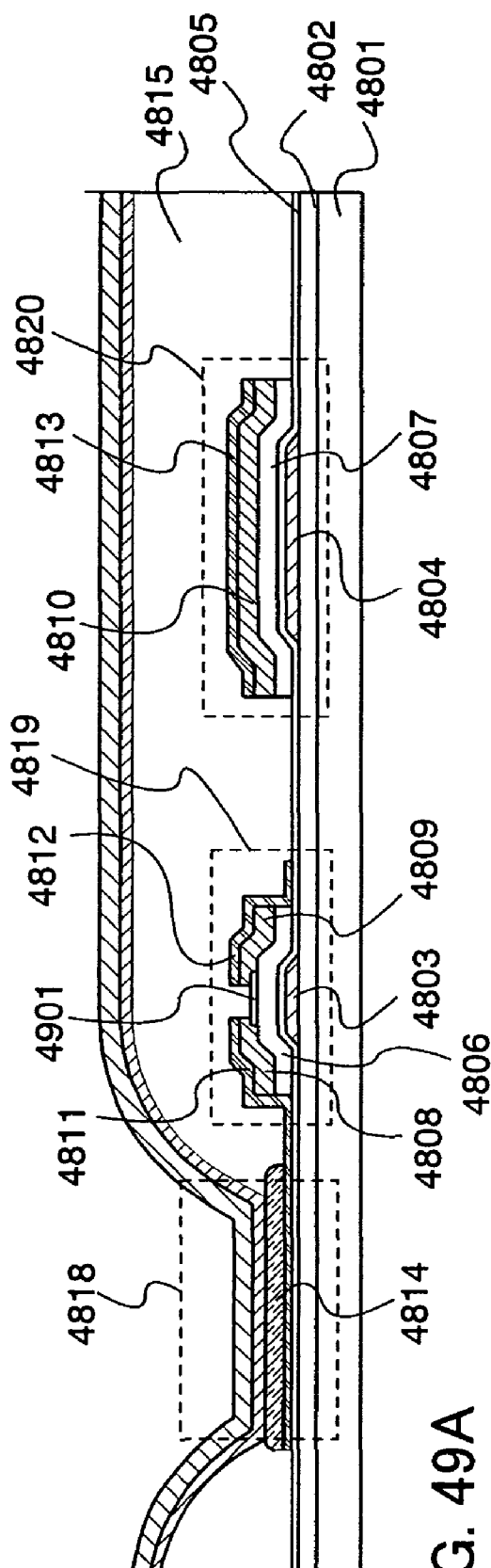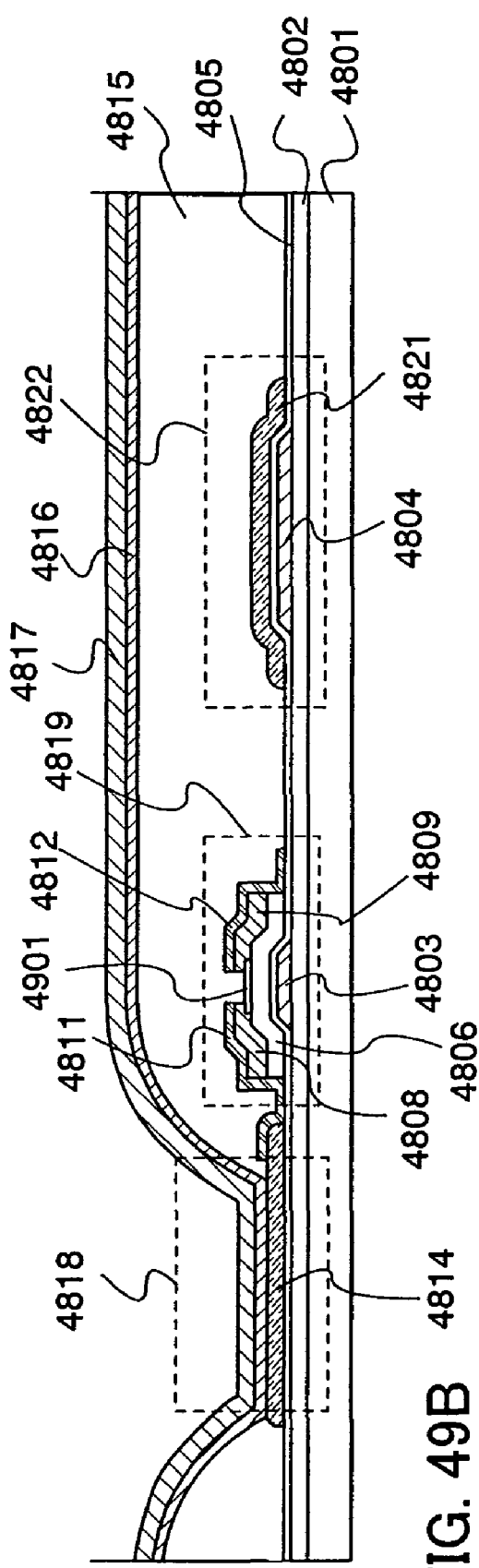
FIG. 49A
FIG. 49B

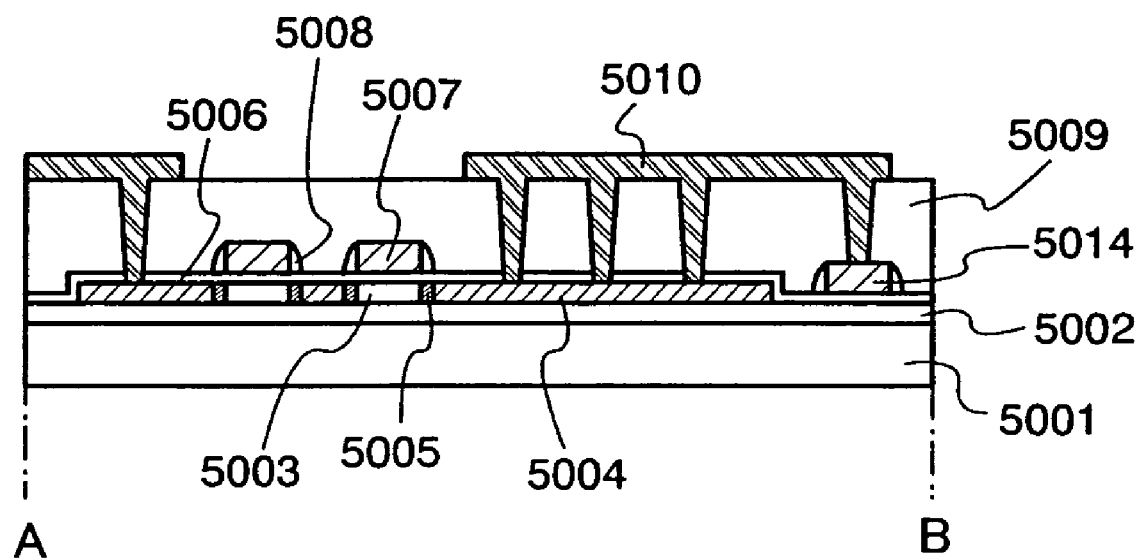
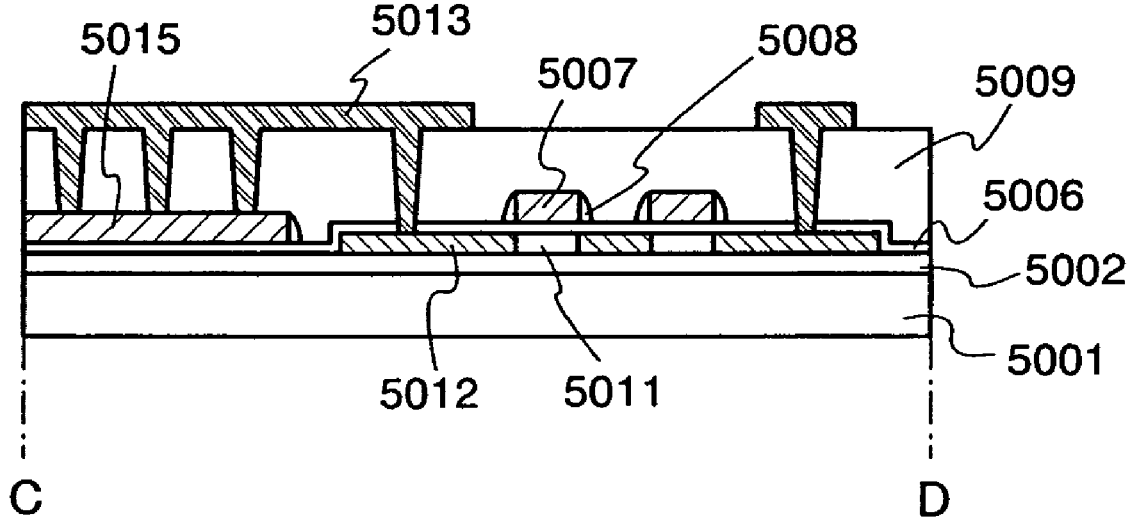
FIG. 50

SEMICONDUCTOR DEVICE, DISPLAY DEVICE AND ELECTRONIC DEVICE INCLUDING A DIODE ELECTRICALLY CONNECTED TO A SIGNAL LINE

BACKGROUND OF THE INVENTION

1. Field of the Invention

The present invention relates to a semiconductor device provided with a function to control a current supply to a load by a transistor. In particular, the invention relates to a semiconductor device including a pixel formed of a current driving light emitting element of which luminance changes according to current, and a signal driver circuit thereof.

2. Description of the Related Art

In recent years, what is called a self-light emitting display device of which pixel is formed of a light emitting element such as a light emitting diode (LED) is attracting attentions. As a light emitting element used for such a self-light emitting display device, an organic light emitting diode (OLED), an organic EL element, an electroluminescence (EL) element and the like are attracting attentions and used for an organic EL display and the like.

A light emitting element such as an OLED which is a self-light emitting element is advantageous as compared to a liquid crystal display in that a pixel provides a high visibility, a backlight is not required, a high response speed is achieved, and the like. The luminance of a light emitting element is controlled by a current value supplied thereto.

As a driving method of a display device using such a self-light emitting element, a passive matrix method and an active matrix method are known. With the passive matrix method, a structure is simple but a large display of high luminance is difficult to achieve. The active matrix method in which a current supplied to a light emitting element is controlled by a thin film transistor (TFT) provided in a pixel circuit is more actively developed recently.

In the case of such an active matrix display device, there is a problem in that a luminance changes when a current supplied to a light emitting element changes due to variations in current characteristics of driving TFTs.

In other words, in the case of such an active matrix display device, driving TFTs which drive a current supplied to a light emitting element is used in a pixel circuit. When the characteristics of these driving TFTs vary, a current supplied to a light emitting element changes, leading to vary the luminance. In view of this, various circuits for suppressing variations in luminance have been suggested, in which a current supplied to a light emitting element does not change even when characteristics of driving TFTs in a pixel circuit vary.

[Patent Document 1]
Published Japanese Translation of PCT International Publication for Patent Application No. 2002-517806
[Patent Document 2]
International Publication WO01/06484
[Patent Document 3]
Published Japanese Translation of PCT International Publication for Patent Application No. 2002-514320
[Patent Document 4]
International Publication WO02/39420

Patent Documents 1 to 4 each discloses a structure of an active matrix display device. Patent Documents 1 to 3 each discloses a circuit configuration in which a current supplied to a light emitting element does not change due to variations in characteristics of driving TFTs provided in a pixel circuit. This structure is referred to as a current write type pixel, a current input type pixel or the like. Patent Document 4 discloses a circuit configuration for suppressing a change of signal current due to variations of TFTs in a source driver circuit.

FIG. 31 shows a first schematic example of a conventional active matrix display device disclosed in Patent Document 1. The pixel in FIG. 31 includes a source signal line 3101, first to third gate signal lines 3102 to 3104, a current supply line 3105, TFTs 3106 to 3109, a capacitor 3110, an EL element 3111, a signal current input current source 3112.

A gate electrode of the TFT 3106 is connected to the first gate signal line 3102, a first electrode thereof is connected to the source signal line 3101, a second electrode thereof is connected to a first electrode of the TFT 3107, a first electrode of the TFT 3108, and a first electrode of the TFT 3109. A gate electrode of the TFT 3107 is connected to a second gate signal line 3103, and a second electrode thereof is connected to a gate electrode of the TFT 3108. A second electrode of the TFT 3108 is connected to a current supply line 3105. A gate electrode of the TFT 3109 is connected to a third gate signal line 3104 and a second electrode thereof is connected to an anode of the EL element 3111. The capacitor 3110 is connected between the gate electrode and an input electrode of the TFT 3108 and holds a gate-source voltage of the TFT 3108. The current supply line 3105 and a cathode of the EL element 3111 are inputted with predetermined potentials respectively and have a potential difference therebetween.

An operation from writing of a signal current to light emission is described with reference to FIGS. 32A to 32E. In FIGS. 32A to 32E, reference numerals which denote each portion are referred in FIG. 31. FIGS. 32A to 32C each shows a current flow schematically. FIG. 32D shows a relationship of a current flowing through each path when writing a signal current. FIG. 32E shows a gate-source voltage of the TFT 3108, which is a voltage accumulated in the capacitor 3110 when writing a signal current.

First, a pulse is inputted to the first gate signal line 3102 and the second gate signal line 3103, thereby the TFTs 3106 and 3107 are turned on. At this time a current flowing through a source signal line, which is a signal current is called Idata.

As a current Idata flows through a source signal line, a current path is divided into I1 and I2 in a pixel as shown in FIG. 32A. The relationship between these is shown in FIG. 32D. It is to be noted that Idata=I1+I2 is satisfied, needless to say.

A charge is not held in the capacitor 3110 just after the TFT 3106 is turned on, therefore, the TFT 3108 is off. Accordingly, I2=0 is satisfied and Idata=I1 is satisfied. That is to say, only a current accumulated in the capacitor 3110 flows at this time.

After that, a charge is accumulated in the capacitor 3110 gradually, which generates a potential difference between both electrodes (FIG. 32E). When the potential difference between the both electrodes becomes Vth (point A in FIG. 32E), the TFT 3108 is turned on and I2 generates. As described above, as Idata=I1+I2 is satisfied, I1 decreases gradually, however, a current still flows and a charge keeps being accumulated in the capacitor.

In the capacitor 3110, a charge keeps being accumulated until the potential difference between the both electrodes, which is a gate-source voltage of the TFT 3108 reaches a desired voltage, which is a voltage (VGS) high enough for the TFT 3108 to flow a current Idata. When the charge accumulation is terminated (point B in FIG. 32E), the current I1 stops flowing and a current corresponding to VGS at that time flows through the TFT 3108, leading to satisfy Idata=I2 (FIG. 32B). In this manner, a steady state is achieved. The writing operation of a signal is completed in this manner. At last, selection of the first gate signal line 3102 and the second gate signal line 3103 is terminated, which turns off the TFTs 3106 and 3107.

Subsequently, a light emitting operation starts. A pulse is inputted to the third gate signal line 3104, thereby the TFT 3109 is turned on. As VGS which is just written is held in the capacitor 3110, the TFT 3108 is on and a current Idata flows from the current supply line 3105 to the EL element 3111. Accordingly, the EL element 3111 emits light. At this time, by setting the TFT 3108 to operate in the saturation region, Idata can flow without change even when a drain-source voltage of the TFT 3108 changes.

An operation to output a set current in this manner is called an output operation. The current write type pixel of which example is shown above is advantageous in that a desired current can be accurately supplied to an EL element since a gate-source voltage required to flow the current Idata is held in the capacitor 3110 even when characteristics and the like of the TFT 3108 vary. Accordingly, variations in luminance due to variations in characteristics of TFTs can be suppressed.

The aforementioned example relates to a technique for correcting a change of current due to variations of driving TFTs in a pixel circuit. A similar problem occurs in a source driver circuit as well. Patent Document 4 discloses a circuit configuration for suppressing a change of signal current due to variations of TFTs in a source driver circuit.

SUMMARY OF THE INVENTION

In this manner, a current is used as a signal in a current input type circuit. When a steady state is achieved, writing of a signal is completed. Here, noise may occur in a wiring for supplying a current. In that case, a potential largely changes at the noise. In that case, it takes time to turn back to the original potential since a signal is inputted by using a current source, which also takes time to obtain to the steady state.

In the case of a normal operation, it can be expected that a wiring for supplying a current has a potential of a certain range. Therefore, in the case where the potential is outside the range due to noise and the like, a current is supplied from other than a current source for supplying a signal so that the potential can turn back within the normal range rapidly. This prevents a write time of a signal from being too long.

According to a first structure of the invention, a semiconductor device is provided with a transistor, a current source, a wiring for connecting a drain terminal of the transistor and a current source, and a capacitor for holding a gate potential of the transistor. When a potential of a wiring becomes outside a set range, the potential of the wiring is turned back within the set range.

According to a second structure of the invention, a semiconductor device is provided with a transistor, a current source, a wiring for connecting a source terminal of the transistor and a current source, and a capacitor for holding a gate-source voltage of the transistor. When a potential of a wiring becomes outside a set range, the potential of the wiring is turned back within the set range.

According to a third structure of the invention, a semiconductor device is provided with a transistor, a current source, a wiring connected between a drain terminal of the transistor and one terminal of the current source, a capacitor of which one terminal is connected to a gate terminal of the transistor while the other terminal is connected to a power source line having the same potential as a source terminal of the transistor, a switch connected between the gate terminal and the drain terminal of the transistor, a first rectifying element of which one terminal is connected to the wiring while the other terminal thereof is connected to a first power source line, and a second rectifying element of which one terminal is connected to the wiring while the other terminal thereof is connected to a second power source line. When a potential of a wiring becomes outside a set range, a current keeps flowing to the first or second rectifying element until the potential of the wiring becomes within the set range.

According to a fourth structure of the invention, a semiconductor device is characterized in that a potential of the first power source line is higher than a potential of the second power source line in the third structure.

According to a fifth structure of the invention, a semiconductor device is characterized in that the set range is from the potential of the second power source line to the potential of the first power source line in the fourth structure.

According to a sixth structure of the invention, a semiconductor device is provided with a transistor, a current source, a wiring, a capacitor, a switch, a first rectifying element, and a second rectifying element. The current source and a drain terminal of the transistor are connected through the wiring, one electrode of the capacitor is connected to a gate terminal of the transistor, the gate terminal and the drain terminal of the transistor are connected through the switch, one terminal of the first rectifying element is connected to a first power source line while the other terminal thereof is connected to the wiring, one terminal of the second rectifying element is connected to a second power source line while the other terminal thereof is connected to the wiring, a forward current of the first rectifying element is a direction from the first power source line to the wiring, and a forward current direction of the second rectifying element is from the wiring to the second power source line.

According to a seventh structure of the invention, a semiconductor device is provided with an N-channel transistor, a current source, a wiring, a capacitor, a switch, and a rectifying element. The current source and a drain terminal of the N-channel transistor are connected through the wiring, a gate terminal of the transistor is connected to one electrode of the capacitor, the gate terminal and the drain terminal of the transistor are connected through the switch, one terminal of the rectifying element is connected to the power source line while the other terminal thereof is connected to the wiring, and a forward current direction of the rectifying element is from the power source line to the wiring.

According to an eighth structure of the invention, a semiconductor device is provided with a P-channel transistor, a current source, a wiring, a capacitor, a switch, and a rectifying element. The current source and a drain terminal of the P-channel transistor are connected through the wiring, a gate terminal of the transistor is connected to one electrode of the capacitor, the gate terminal and the drain terminal of the transistor are connected through the switch, one terminal of the rectifying element is connected to a power source line while the other terminal thereof is connected to the wiring, and a forward current direction of the rectifying element is a direction from the wiring to the power source line.

According to a ninth structure of the invention, a semiconductor device is characterized in that the rectifying element is a diode-connected transistor in the aforementioned structure.

According to a tenth structure of the invention, a semiconductor device is characterized in that a pixel is arranged in matrix corresponding to a first wiring provided in a row direction for selecting a pixel, and a second wiring provided in a column direction to which a signal current is inputted. A rectifying element is connected to each of the second wirings.

According to an eleventh structure of the invention, a semiconductor device is characterized in that a pixel is arranged in matrix corresponding to a gate line and a source signal line, a signal current is inputted to the source signal line, and a rectifying element is connected to each source signal line.

According to a twelfth structure of the invention, a semiconductor device is characterized in that a pixel arranged in matrix corresponding to a gate line and a source signal line, and a signal driver circuit are provided. The signal driver circuit includes a current source, a current source circuit, and a wiring for connecting the current source and the current source circuit. The wiring is connected to a rectifying element.

According to a thirteenth structure of the invention, a semiconductor device is provided with a pixel arranged in matrix corresponding to a gate line and a source signal line, and a signal driver circuit. The signal driver circuit includes a current source, a current source circuit, and a wiring for connecting the current source and the current source circuit. The current source circuit is provided for each of the source signal line. A rectifying element is connected to the wiring corresponding to the current source circuit.

According to a fourteenth structure of the invention, a semiconductor device is characterized in that the rectifying element is a diode-connected transistor in the aforementioned structure.

According to a fifteenth structure of the invention, an electronic apparatus including the display device of the aforementioned structure in a display portion is provided.

It is to be noted that a connection in the invention means an electrical connection. Therefore, another element, a switch and the like may be provided between the connections.

The kind of a transistor applicable in the invention is not particularly limited. For example, a thin film transistor (TFT) can be used. A TFT may have any of an amorphous, polycrystal, or single crystal semiconductor layer. As other transistors, a transistor formed over a single crystalline substrate, an SOI substrate, a glass substrate, a plastic substrate, or any substrates may be used. Besides, a transistor formed of an organic substance or a carbon nanotube may be used. A MOS transistor or a bipolar transistor can be used as well.

A semiconductor device according to the invention is a device including a circuit which has a transistor, a capacitor and the like.

According to the invention, when a potential of a wiring through which a signal current flows when writing a signal to a current source circuit becomes outside a range of a potential of a normal operation, the potential can be set within the normal range rapidly. Therefore, a write time of a signal can be short.

BRIEF DESCRIPTION OF THE DRAWINGS

FIGS. 2A to 2C are diagrams showing operations of the current source circuit of the invention.

FIGS. 10A to 10D are diagrams showing operations of the current source circuit of the invention.

FIGS. 46A and 46B are a diagram showing the display panel of the invention.

FIGS. 47A and 47B are sectional diagrams of a portion of a pixel portion.

FIGS. 48A and 48B are sectional diagrams of a portion of a pixel portion.

FIGS. 49A and 49B are sectional diagrams of a portion of a pixel portion.

FIG. 50 shows sectional diagrams of a portion of a diode-connected transistor.

DETAILED DESCRIPTION OF THE INVENTION

Although the present invention will be fully described by way of example with reference to the accompanying drawings, it is to be understood that various changes and modifications will be apparent to those skilled in the art. Therefore, unless such changes and modifications depart from the scope of the invention, they should be construed as being included therein.

The invention can be applied to various analog circuits having a current source as well as to a pixel having a light emitting element such as an EL element. First, a basic principle of the invention is described in this embodiment mode.

Figure 1:
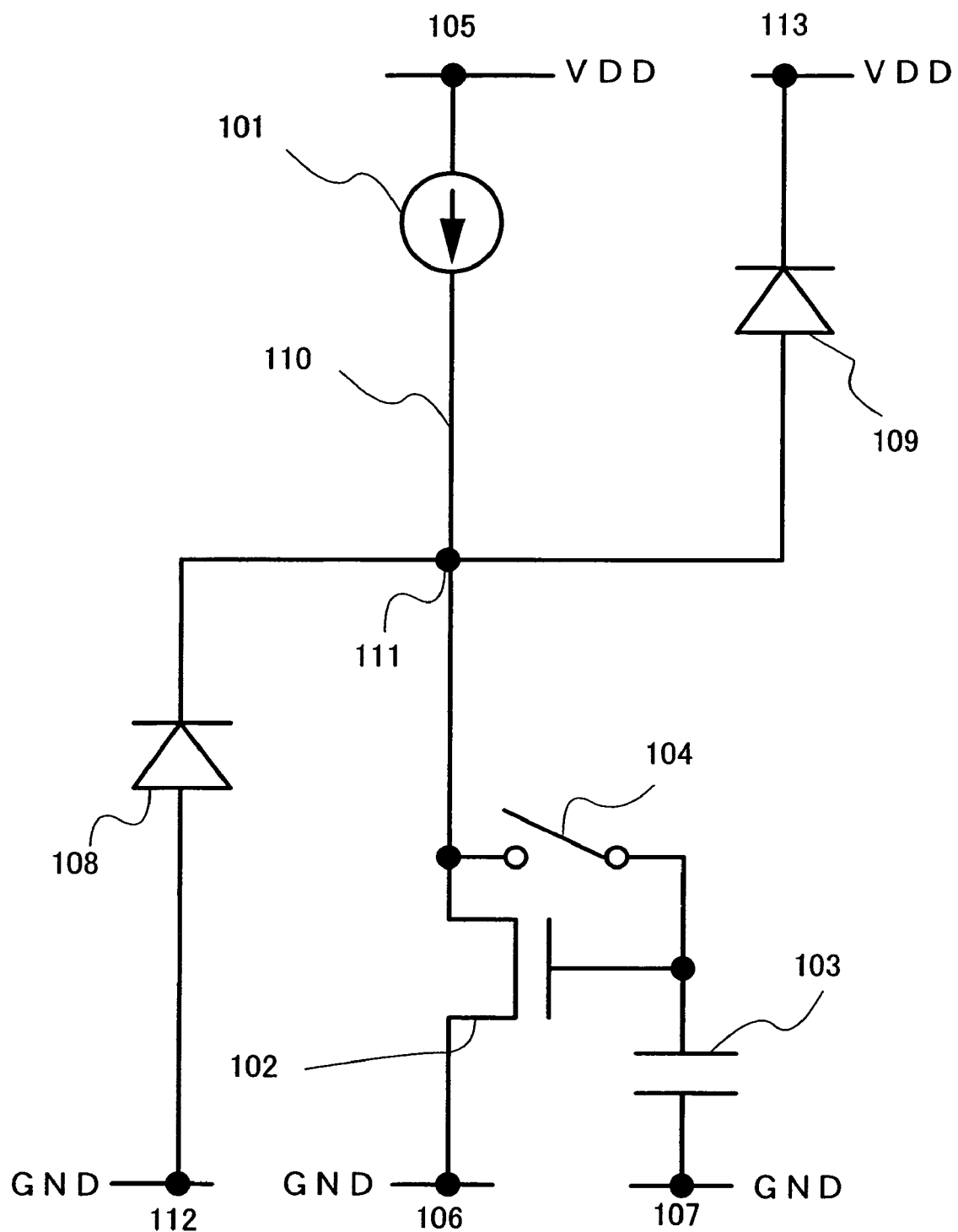
FIG. 1 is a diagram showing a configuration of the current source circuit of the invention.

First, a configuration of a current source circuit based on the basic principle of the invention is shown in FIG. 1. One side of a wiring 110 is connected to a wiring 105 through a reference current source 101. The other side of the wiring 110 is connected to a drain terminal of a transistor 102 and to a gate terminal and one terminal of a capacitor 103 through a switch 104. The other terminal of the capacitor is connected to a wiring 107 and a source terminal of the transistor 102 is connected to a wiring 106. Therefore, the capacitor 103 can hold a potential of the gate terminal of the transistor 102. The wiring 110 is connected to a wiring 112 through a rectifying element 108 and connected to a wiring 113 at a point 111 through a rectifying element 109. A potential of the wiring 112 connected to one terminal of the rectifying element 108 is equal to those of the wirings 106 and 107. A forward direction of the rectifying element 108 is a direction from the wiring 112 to the point 111. A potential of the wiring 113 connected to one terminal of the rectifying element 109 has a potential equal to that of a wiring 105. A forward direction of the rectifying element 109 is a direction from the point 111 to the wiring 113. That is to say, the rectifying elements 108 and 109 are non-conductive in the normal operation.

It is to be noted in this embodiment mode that the wirings 106, 107, and 112 each has a potential of GND, however, these wirings may be an identical wiring or different wirings and may have a potential other than GND, and may have different potentials respectively. In other words, the wirings 106, 107, and 112 are only required to have a potential lower than those of the wirings 105 and 113. Moreover, depending on the characteristics of the rectifying element 108, it is sometimes preferable that the potential of the wiring 112 be a little higher than those of the wirings 106 and 107, however, it may be a potential a little lower than those of the wirings 106 and 107 as well. That is to say, the potential of the wiring 112 is only required to be high enough to turn on the rectifying element 108 when the potential of the point 111 becomes outside a normal range. Although the wirings 105 and 113 each has a potential of VDD, these wirings may be an identical wiring or different wirings and may have a potential other than VDD or different potentials respectively. Moreover, depending on the characteristics of the rectifying element 109, it is sometimes preferable that the potential of the wiring 113 be a little lower than that of the wiring 105, however, it may be a potential a little higher than that of the wiring 105 as well. That is to say, the potential of the wiring 113 is only required to be high enough to turn on the rectifying element 109 when the potential of the point 111 becomes outside a normal range. The rectifying elements 109 and 108 are connected at the point 111, however, the invention is not limited to this and they may be connected at a different point as well. They are only required to be connected to the wiring 110.

The operation principle of the current source circuit shown in FIG. 1 is described. First, an operation of the current source circuit with a potential of the wiring 110 in a normal range is described with reference to FIGS. 2A to 2C. When writing a signal to the current source circuit, the switch 104 is turned on as shown in FIGS. 2A to 2C. A charge is not accumulated in the capacitor 103 just after the switch 104 is turned on, therefore, a gate-source voltage of the transistor 102 is zero, thus the transistor 102 is off. Accordingly, a current from the reference current source 101 flows only to the capacitor 103 (see FIG. 2A). The current flows to the capacitor 103 and a gate potential of the transistor 102 is accumulated in the capacitor 103. When a potential difference between a potential of the wiring 106 connected to the source terminal of the transistor 102 and a gate potential of the transistor 102 accumulated in the capacitor 103 reaches a threshold voltage, the transistor 102 is turned on. That is, a current starts flowing through the transistor 102 as well (see FIG. 2B). Gradually, a current stops flowing to the capacitor 103 and a current flows only through the transistor 102 (see FIG. 2C). That is to say, a steady state is achieved. The gate potential of the transistor 102 accumulated in the capacitor 103 at this time is high enough to flow a signal current from the reference current source. In this manner, writing of a signal current is terminated.

In this manner, when the current source circuit operates with the potential of the wiring 110 in the normal range, a current does not flow to the rectifying elements 108 and 109.

Here, noise may occur in the wiring 110. This noise is caused by parasitic capacitance (intersection capacitance) and the like generated at a portion where the wiring 110 intersects the other wirings. The potential of the wiring 110 becomes higher or lower than the potential in the normal operation due to this noise. Then, the potential of the wiring 110 does not easily turn back to the normal value, which delays the completion of the writing. Thus the gate potential of the transistor 102 for supplying a desired signal current cannot be obtained because when a set write time passes, the next operation starts without waiting for the completion of the signal writing. In the case of writing to a pixel, for example, writing to the next pixel starts. In such a case, this pixel cannot be inputted with a desired signal, therefore, a desired display cannot be performed. In this manner, when noise occurs in a wiring, an operating defect is caused. In particular, when the potential of the wiring 110 becomes outside the normal range, the noise becomes a serious problem.

Figure 3B:
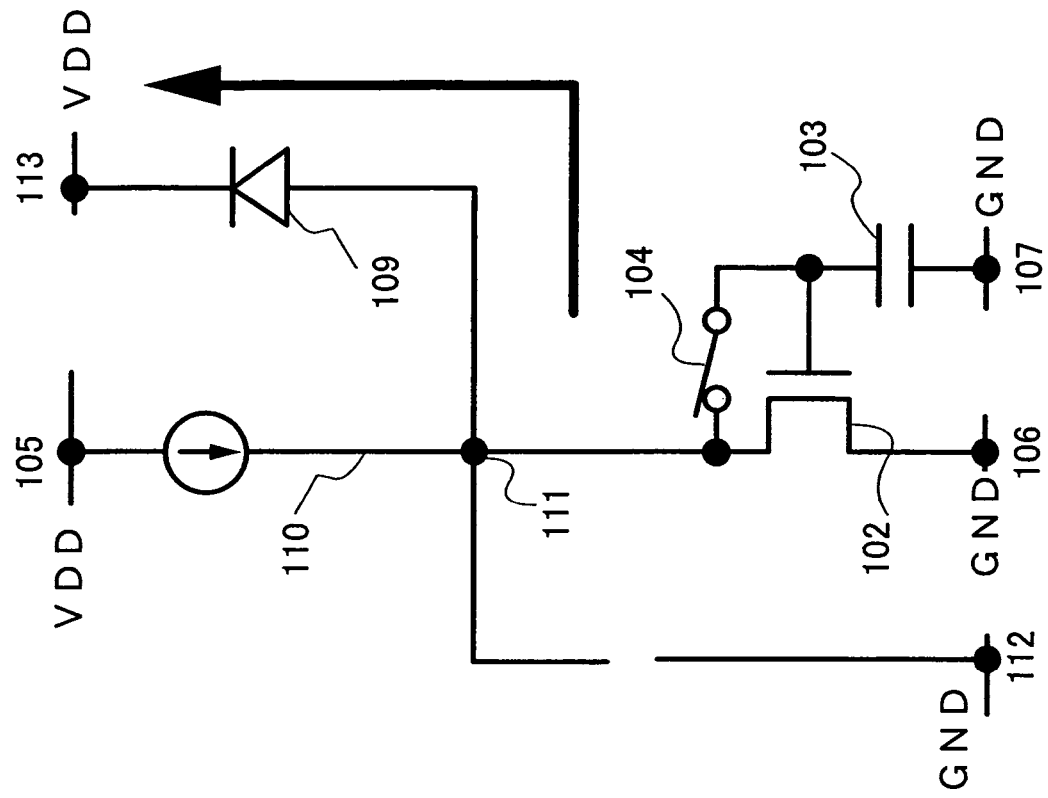
FIGS. 3A and 3B are diagrams showing operations of the current source circuit of the invention.
Figure 3A:
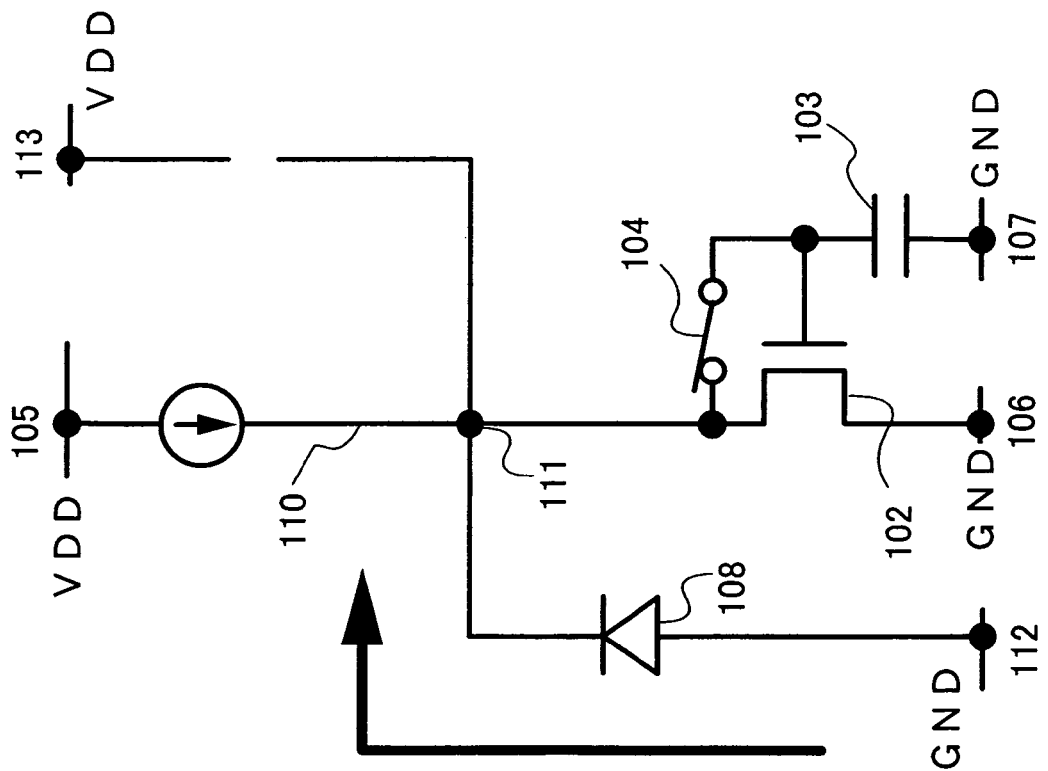

Operations of the rectifying elements 108 and 109 when noise occurs in the wiring 110 are described with reference to FIGS. 3A and 3B. When noise occurs in the wiring 110 and the potential of the point 111 becomes lower than that of the wiring 112, a current flows from the wiring 112 to the point 111 as shown in FIG. 3A until the potential of the point 111 becomes equal to that of the wiring 112. This is caused by the operation of the rectifying element 108 being conductive. When noise occurs in the wiring 110 and the potential of the point 111 becomes higher than that of the wiring 113, a current flows from the point 111 to the wiring 113 as shown in FIG. 3B until the potential of the point 111 becomes equal to that of the wiring 113. This is caused by the operation of the rectifying element 109 being conductive.

In this manner, when the potential of the wiring 110 becomes outside the normal range due to noise, the potential can turn back within the range rapidly.

Moreover, static electricity is included in noise which could occur in the wiring 110. The potential of the wiring 110 can turn back within the normal range even when it becomes an abnormal value due to the static electricity. Further, it can also be prevented that a transistor is broken due to static electricity.

Figures 13A, 13B:
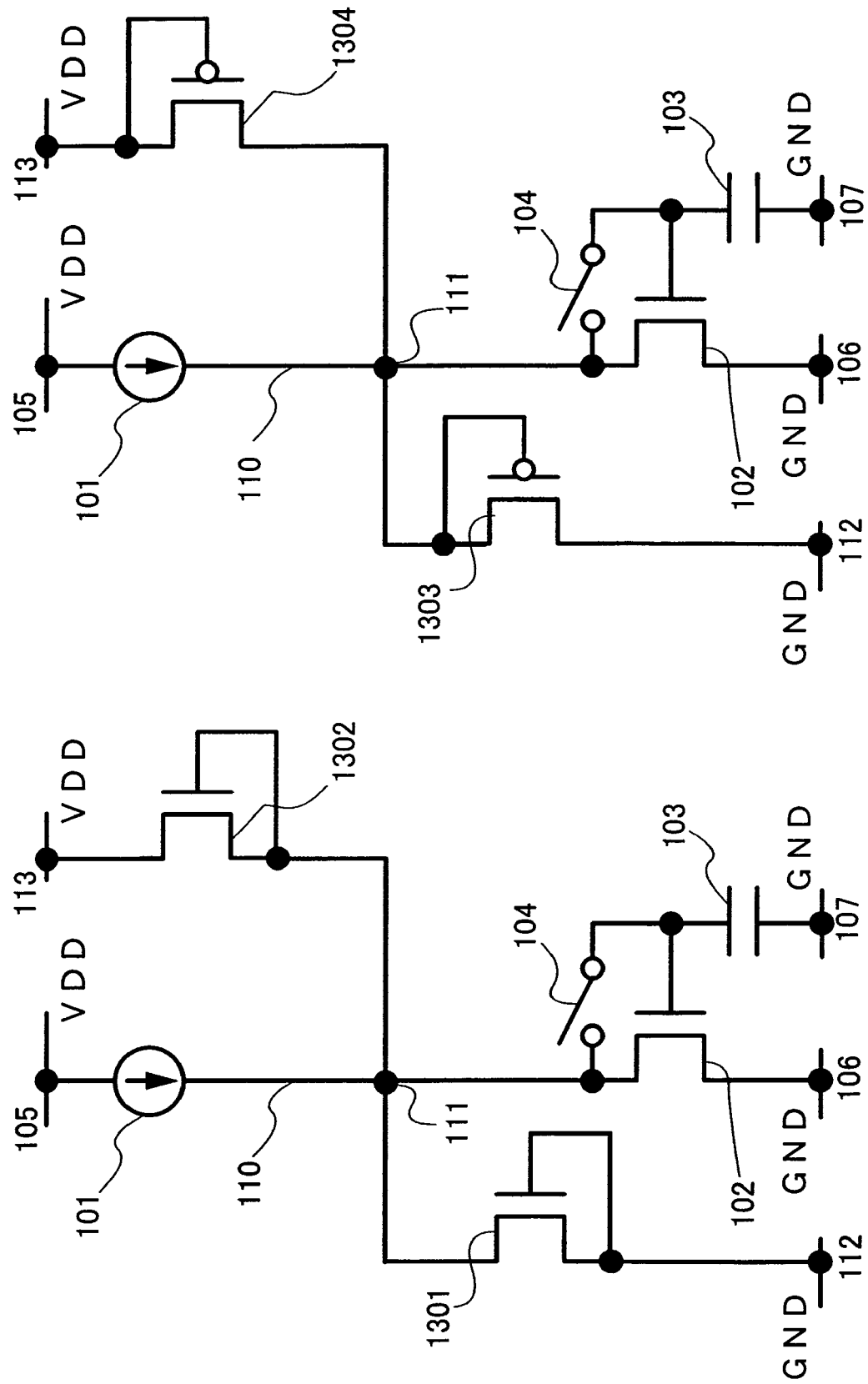
FIGS. 13A and 13B are diagrams showing configurations of the current source circuit of the invention.

It is to be noted that a diode-connected transistor can be used as the rectifying element, for example. FIG. 13A shows a configuration in which a diode-connected N-channel transistor is applied as the rectifying element of the current source circuit shown in FIG. 1 and FIG. 13B shows a configuration in which a P-channel transistor is applied thereto.

Transistors 1301 and 1302 shown in FIG. 13A correspond to the rectifying elements 108 and 109 in FIG. 1 respectively. A gate terminal of the transistor 1301 is connected to a terminal which is connected to the wiring 112. That is, when the current source circuit operates with the potential of the point 111 within the normal range, a gate terminal and a source terminal of the transistor 1301 are short-circuited because the potential of the wiring 112 is lower than that of the point 111. Accordingly, the transistor 1301 is turned off and a current does not flow. However, when the potential of the point 111 becomes lower than that of the wiring 112, the gate terminal and a drain terminal of the transistor 1301 are connected, thus a potential difference generates between the gate and source of the transistor 1301, which turns on the transistor 1301 to flow a current.

A gate terminal of the transistor 1302 is connected to a terminal which is connected to the wiring 110. That is, when the current source circuit operates with the potential of the point 111 within the normal range, the gate terminal and a source terminal of the transistor 1302 are short-circuited because the potential of the wiring 113 is higher than that of the point 111. Accordingly, the transistor 1302 is turned off and a current does not flow. However, when the potential of the point 111 becomes higher than that of the wiring 113, the gate terminal and a drain terminal of the transistor 1302 are connected, thus a potential difference generates between the gate and source of the transistor 1302, which turns on the transistor 1302 to flow a current.

Alternatively, P-channel transistors 1303 and 1304 may be used for the rectifying elements 108 and 109 in FIG. 1, as shown in FIG. 13B. A gate terminal of the transistor 1303 is short-circuited with a terminal thereof which is connected to the wiring 110. That is, when the current source circuit operates with the potential of the point 111 within the normal range, the gate terminal and a source terminal of the transistor 1303 are short-circuited because the potential of the point 111 is lower than that of the wiring 112. Accordingly, the transistor 1303 is turned off and a current does not flow. However, when the potential of the point 111 becomes lower than that of the wiring 112, the gate terminal and a drain terminal of the transistor 1303 are connected, thus a potential difference generates between the gate and source of the transistor 1303, which turns on the transistor 1303 to flow a current.

A gate terminal of the transistor 1304 is short-circuited with a terminal thereof which is connected to the wiring 113. That is, when the current source circuit operates with the potential of the point 111 within the normal range, the gate terminal and a source terminal of the transistor 1304 are short-circuited because the potential of the point 111 is lower than that of the wiring 113. Accordingly, the transistor 1304 is turned off and a current does not flow. However, when the potential of the point 111 becomes higher than that of the wiring 113, the gate terminal and a drain terminal of the transistor 1304 are connected, thus a potential difference generates between the gate and source of the transistor 1304, which turns on the transistor 1304 to flow a current.

Figures 33A, 33B:
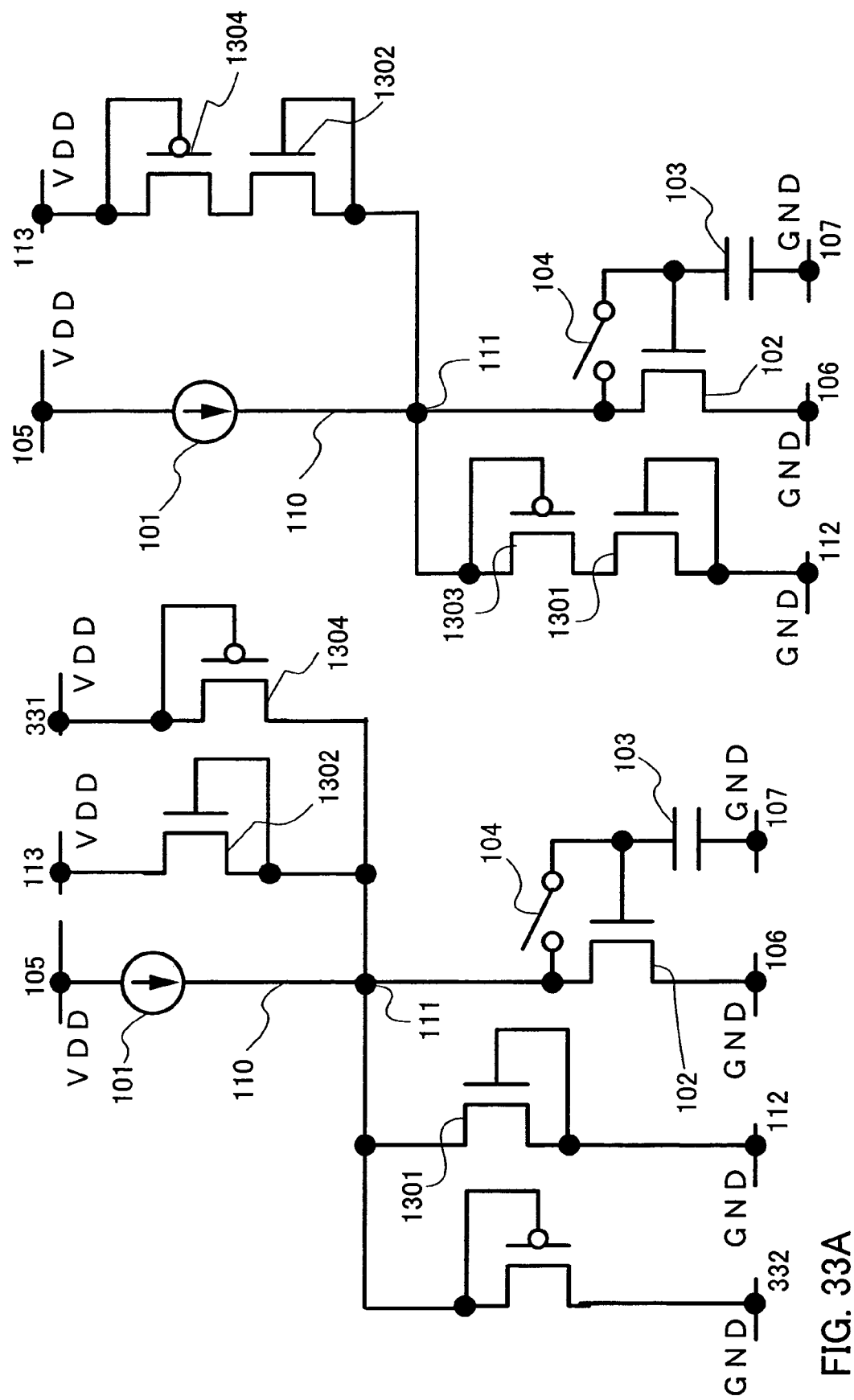
FIGS. 33A and 33B are diagrams showing configurations of the current source circuit of the invention.

These transistors may be changed arbitrarily such that the transistor 1302 in FIG. 13A is changed to the transistor 1304 shown in FIG. 13B, the transistor 1301 in FIG. 13A is changed to the transistor 1303 shown in FIG. 13B, and the like. Alternatively, a rectifying element may be formed by combining a plurality of these transistors. For example, a diode-connected N-channel transistor and a diode-connected P-channel transistor may be connected in parallel as shown in FIG. 33A, or an N-channel transistor and a diode-connected P-channel transistor may be connected in series as shown in FIG. 33B.

It is to be noted that the switch shown in FIG. 1 and the like may be anything such as an electrical switch and a mechanical switch as long as it can control a current flow. It may be a transistor, a diode, or a logic circuit configured with them. Therefore, in the case of applying a transistor as a switch, polarity thereof (conductivity) is not particularly limited because it operates just as a switch. However, when an off current is preferred to be small, a transistor of polarity with small off current is favorably used. For example, the transistor which provides an LDD region has small off current. Further, it is desirable that an N-channel transistor is employed when a potential of a source terminal of the transistor as a switch is closer to the power source potential on the low potential power source (VSS, VGND, 0V and the like), and a P-channel transistor is desirably employed when the potential of the source terminal is closer to the power source potential on the high potential power source (VDD and the like). This helps the switch operate efficiently as the absolute value of the gate-source voltage of the transistor can be increased. It is also to be noted that a CMOS switch can be also applied by using both N-channel and P-channel transistors.

As a rectifying element applied to the invention, a PN or PIN junction diode, a Schottky diode, a carbon nanotube diode and the like can be used as well as a diode-connected transistor. These diodes may also be used in combination with a diode-connected transistor.

In the case where the wiring 112 is set to have the same potential as the wirings 106 and 107 or the case where the wiring 113 is set to have the same potential as the wiring 105, it is preferable that a threshold voltage Vth of the transistors 1301 to 1304 be low. Accordingly, a current can flow to the transistors 1301 to 1304 right after the potential of the point 111 becomes outside the normal range to turn the potential back within the normal range.

It is preferable that the capacitor 103 be connected between the gate and source of the transistor 102 to hold a gate-source voltage of the transistor 102. When a potential of the source terminal of the transistor 102 changes, Vgs thereof does not change.

The capacitor 103 can be omitted by utilizing gate capacitance of the transistor 102.

A diode-connected transistor preferably has a small off current. With a large off current, an accurate current does not flow. Therefore, a multi-gate structure or an LDD structure may be employed.

Figure 8:
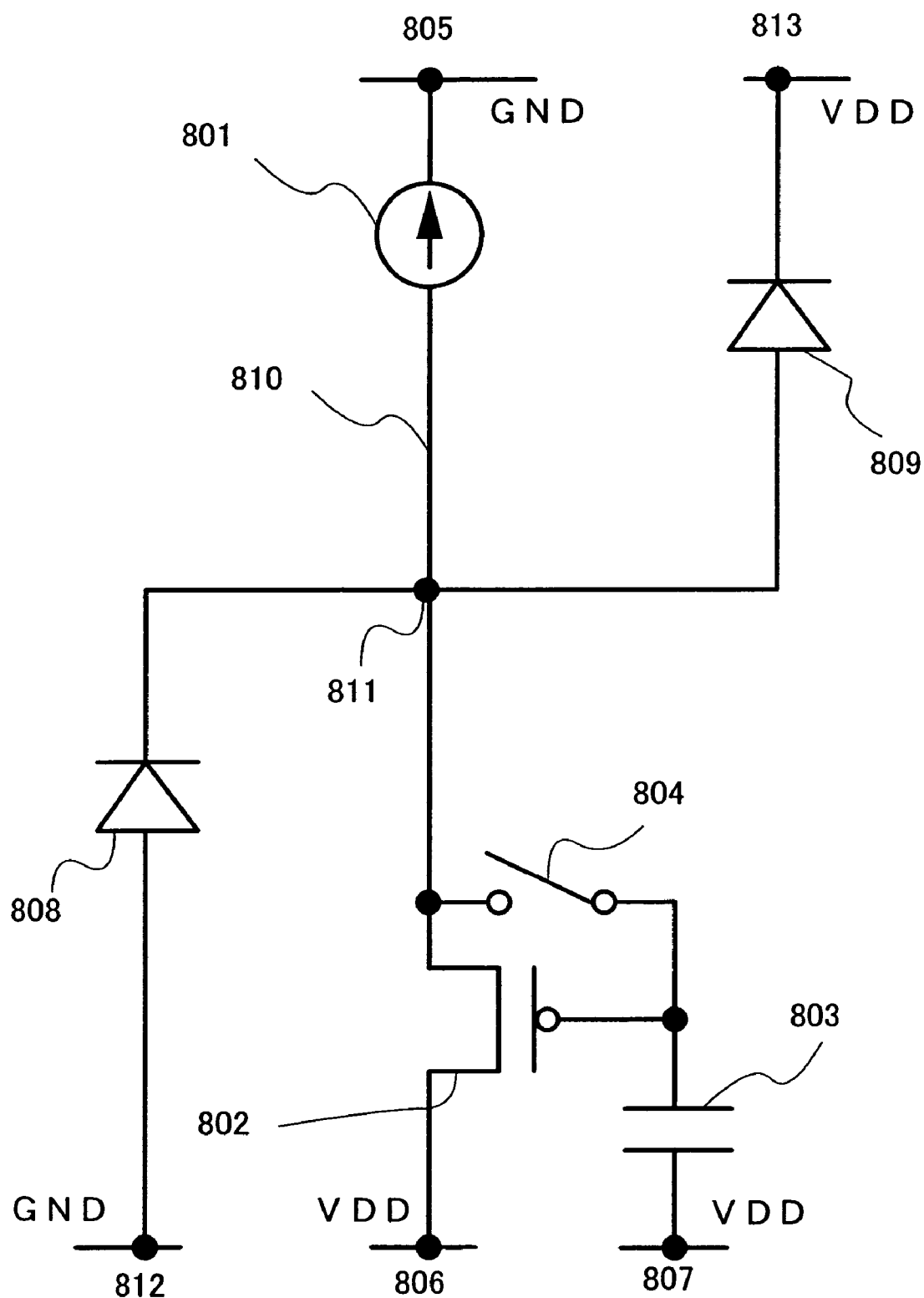
FIG. 8 is a diagram showing a configuration of the current source circuit of the invention.

The invention can be applied to the case where a direction of a signal current from the reference current source is reverse. A configuration in this case is shown in FIG. 8.

One side of a wiring 810 is connected to a wiring 805 through a reference current source 801. The other side of the wiring 810 is connected to a drain terminal of a transistor 802 and to a gate terminal of the transistor 802 and one terminal of a capacitor 803 through a switch 804. The other terminal of the capacitor 803 is connected to a wiring 807 and a source terminal of the transistor 802 is connected to a wiring 806. Therefore, the capacitor 803 can hold a potential of the gate terminal of the transistor 802. The wiring 810 is connected to a wiring 812 through a rectifying element 808 and connected to a wiring 813 through a rectifying element 809 at a point 811. A potential of the wiring 812 connected to one terminal of the rectifying element 808 is equal to that of the wiring 805. A forward direction of the rectifying element 808 is a direction from the wiring 812 to the point 811. A potential of the wiring 813 connected to one terminal of the rectifying element 809 has a potential equal to that of the wirings 806 and 807. A forward direction of the rectifying element 809 is a direction from the point 811 to the wiring 813. That is to say, the rectifying elements 808 and 809 are non-conductive in the normal operation.

It is to be noted in this embodiment mode that the wirings 806, 807, and 813 each has a potential of VDD, however, these wirings may be an identical wiring or different wirings and may have a potential other than VDD or different potentials respectively. In other words, the wirings 806, 807, and 813 are only required to have a potential higher than that of the wirings 805 and 812. Moreover, depending on the characteristics of the rectifying element 809, it is sometimes preferable that the potential of the wiring 813 be a little higher than that of the wirings 806 and 807, however, it may be a potential a little lower than that of the wirings 806 and 807 as well. That is to say, the potential of the wiring 813 is only required to be high enough to turn on the rectifying element 809 when the potential of the point 811 becomes outside a normal range. Although the wirings 805 and 812 each has a potential of GND, however, these wirings may be an identical wiring or different wirings and may have a potential other than GND or different potentials respectively. Moreover, depending on the characteristics of the rectifying element 808, it is sometimes preferable that the potential of the wiring 812 be a little lower than that of the wiring 805, however, it may be a potential a little higher than that of the wiring 805 as well. That is to say, the potential of the wiring 813 is only required to be high enough to turn on the rectifying element 808 when the potential of the point 811 becomes outside a normal range.

With this structure as well, when the potential of the wiring 810 becomes outside the normal range due to noise, the potential can turn back within the normal range rapidly.

It is to be noted that a diode-connected transistor can be used as the rectifying element, for example. FIG. 14A shows a configuration in which a diode-connected P-channel transistor is applied as the rectifying element of the current source circuit shown in FIG. 8, and FIG. 14B shows a configuration in which an N-channel transistor is applied thereto.

Transistors 1401 and 1402 shown in FIG. 14A correspond to the rectifying elements 808 and 809 in FIG. 8 respectively. A gate terminal of the transistor 1401 is connected to a terminal which is connected to the wiring 810. That is, when the current source circuit operates with the potential of the point 811 within the normal range, a gate terminal and a source terminal of the transistor 1401 are short-circuited because the potential of the wiring 812 is lower than that of the point 811. Accordingly, the transistor 1401 is turned off and a current does not flow. However, when the potential of the point 811 becomes lower than that of the wiring 812, the gate terminal and a drain terminal of the transistor 1401 are connected, thus a potential difference generates between the gate and source of the transistor 1401, which turns on the transistor 1401 to flow a current.

A gate terminal of the transistor 1402 is short-circuited with a terminal thereof which is connected to the wiring 813. That is, when the current source circuit operates with the potential of the point 811 within the normal range, the gate terminal and a source terminal of the transistor 1402 are short-circuited because the potential of the point 811 is lower than that of the wiring 813. Accordingly, the transistor 1402 is turned off and a current does not flow. However, when the potential of the point 811 becomes higher than that of the wiring 813, the gate terminal and a drain terminal of the transistor 1402 are connected, thus a potential difference generates between the gate and source of the transistor 1402, which turns on the transistor 1402 to flow a current.

Figure 14B:
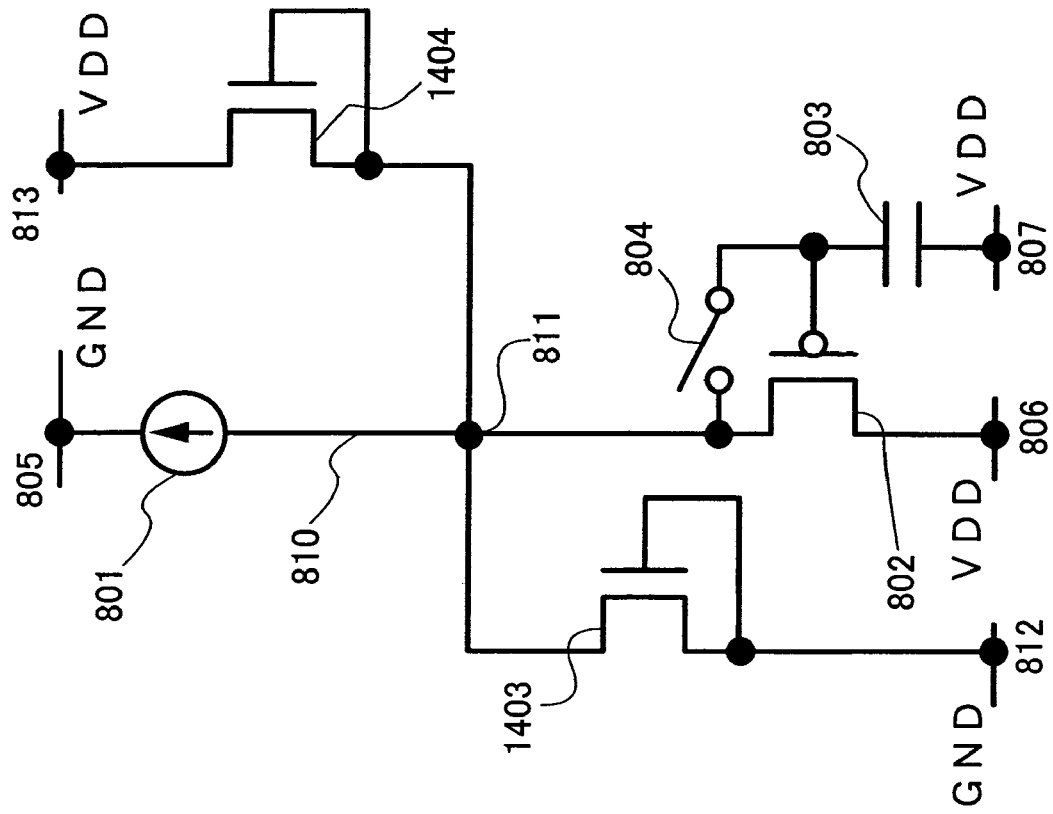
FIGS. 14A and 14B are diagrams showing configurations of the current source circuit of the invention.
Figure 14A:
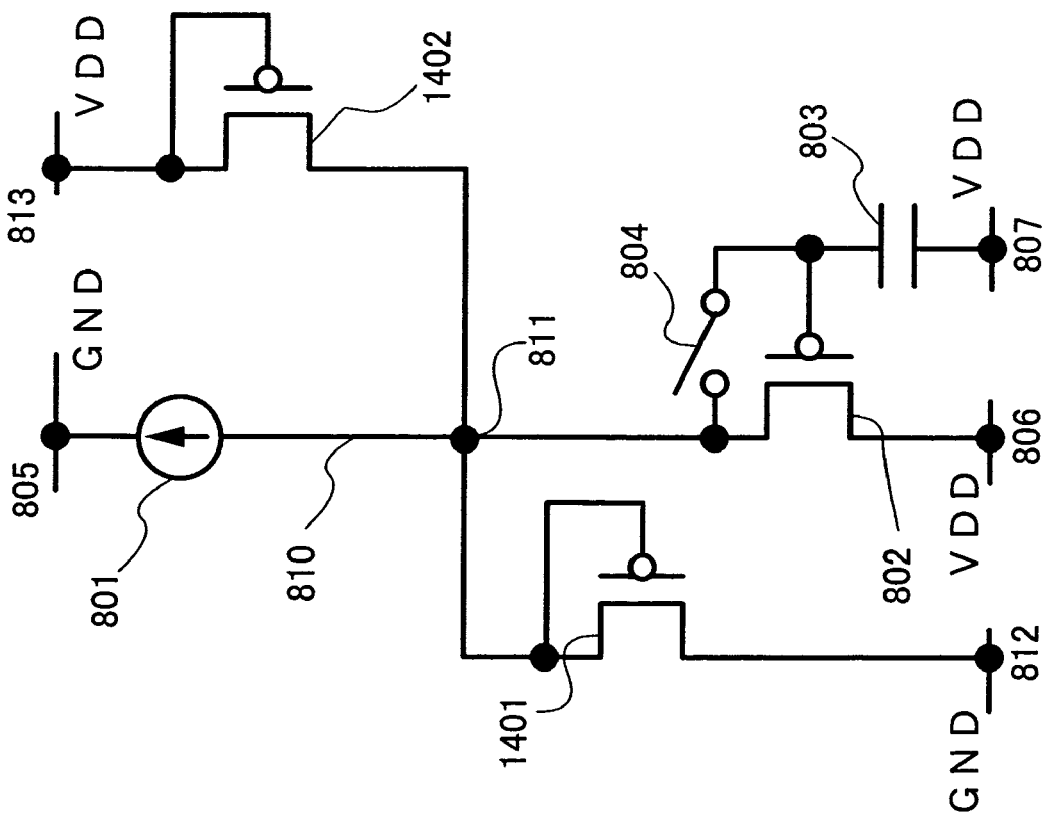

Alternatively, N-channel transistors 1403 and 1404 may be used for the rectifying elements 808 and 809 in FIG. 8, as shown in FIG. 14B. A gate terminal of the transistor 1403 is short-circuited with a terminal thereof which is connected to the wiring 810. That is, when the current source circuit operates with the potential of the point 811 within the normal range, the gate terminal and a source terminal of the transistor 1403 are short-circuited because the potential of the point 811 is higher than that of the wiring 812. Accordingly, the transistor 1403 is turned off and a current does not flow. However, when the potential of the point 811 becomes lower than that of the wiring 812, the gate terminal and a drain terminal of the transistor 1403 are connected, thus a potential difference generates between the gate and source of the transistor 1403, which turns on the transistor 1403 to flow a current.

A gate terminal of the transistor 1404 is connected to a terminal thereof which is connected to the wiring 810. That is, when the current source circuit operates with the potential of the point 811 within the normal range, the gate terminal and a source terminal of the transistor 1404 are short-circuited because the potential of the wiring 813 is higher than that of the point 811. Accordingly, the transistor 1404 is turned off and a current does not flow. However, when the potential of the point 811 becomes higher than that of the wiring 812, the gate terminal and a drain terminal of the transistor 1404 are connected, thus a potential difference generates between the gate and source of the transistor 1404, which turns on the transistor 1404 to flow a current.

As a rectifying element applied to the invention, a PN or PIN junction diode, a Schottky diode, a carbon nanotube diode and the like can be used as well as a diode-connected transistor. These diodes may also be used in combination with a diode-connected transistor.

In the case where the wiring 112 is set to have the same potential as the wirings 106 and 107 or the case where the wiring 113 is set to have the same potential as the wiring 105, it is preferable that a threshold voltage Vth of the transistors 1401 to 1404 be low. Accordingly, a current can flow to the transistors 1401 to 1404 right after the potential of the point 811 becomes outside the normal range to turn the potential back within the normal range.

It is preferable that the capacitor 803 be connected between the gate and source of the transistor 802 to hold a gate-source voltage of the transistor 802. In the preferable connection, when a potential of the source terminal of the transistor 802 changes, Vgs thereof does not change.

The capacitor 803 can be omitted by utilizing gate capacitance of the transistor 802.

A diode-connected transistor preferably has a small off current. With a large off current, an accurate current does not flow. Therefore, a multi-gate structure and an LDD structure may be employed as well.

Figures 34A, 34B:
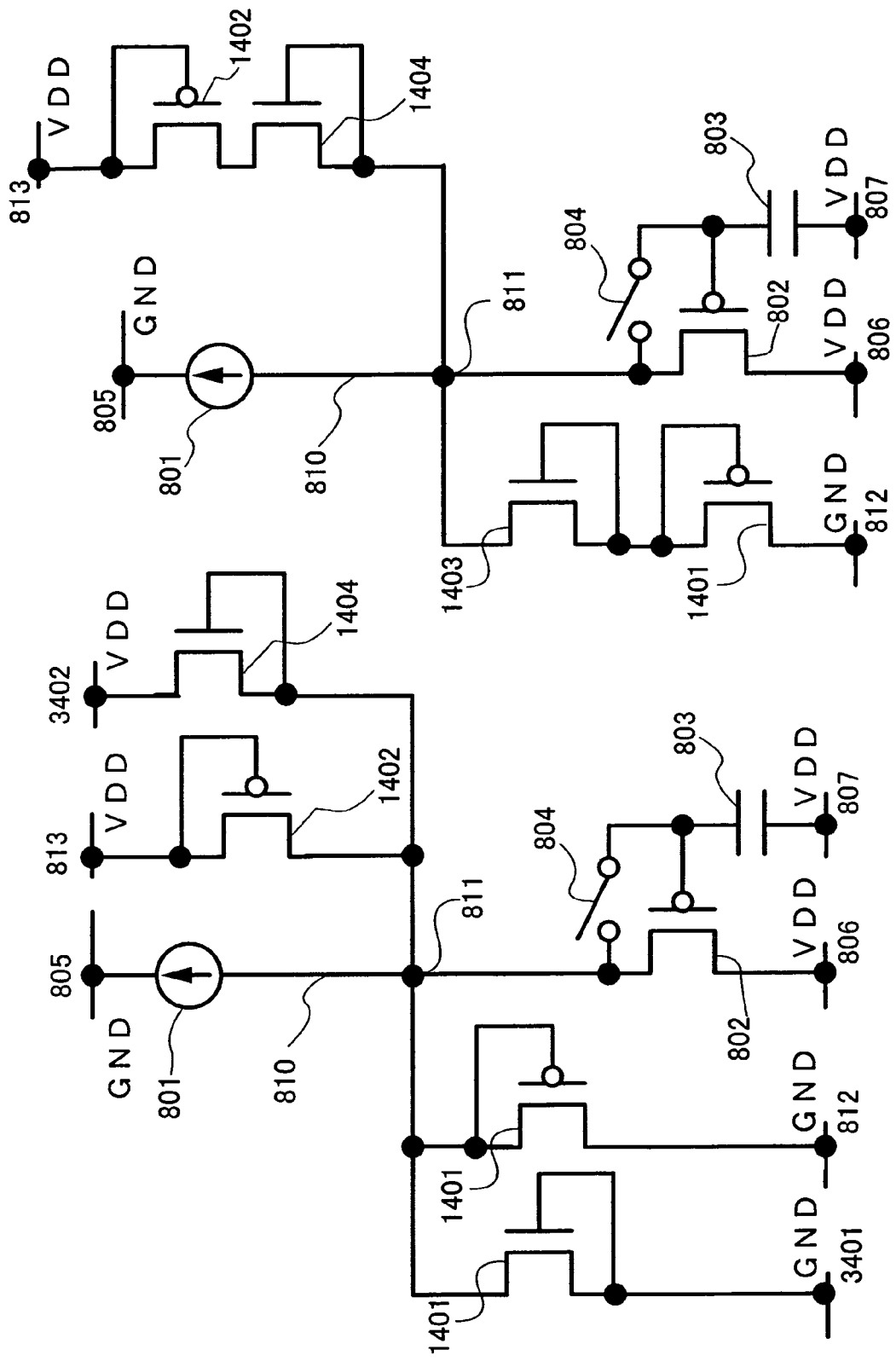
FIGS. 34A and 34B are diagrams showing configurations of the current source circuit of the invention.

These transistors may be changed arbitrarily such that the transistor 1402 in FIG. 14A is changed to the transistor 1404 shown in FIG. 14B, the transistor 1401 in FIG. 14A is changed to the transistor 1403 shown in FIG. 14B, and the like. Alternatively, a rectifying element may be formed by combining a plurality of these transistors. For example, a diode-connected N-channel transistor and a diode-connected P-channel transistor may be connected in parallel as shown in FIG. 34A, or an N-channel transistor and a diode-connected P-channel transistor may be connected in series as shown in FIG. 34B.

Embodiment Mode 1

As the reference current source 101 in FIG. 1, a transistor which operates in the saturation region is often used. In this embodiment mode, a principle of the invention in the case of applying a transistor which operates in the saturation region to the reference current source 101 is described.

Figure 4:
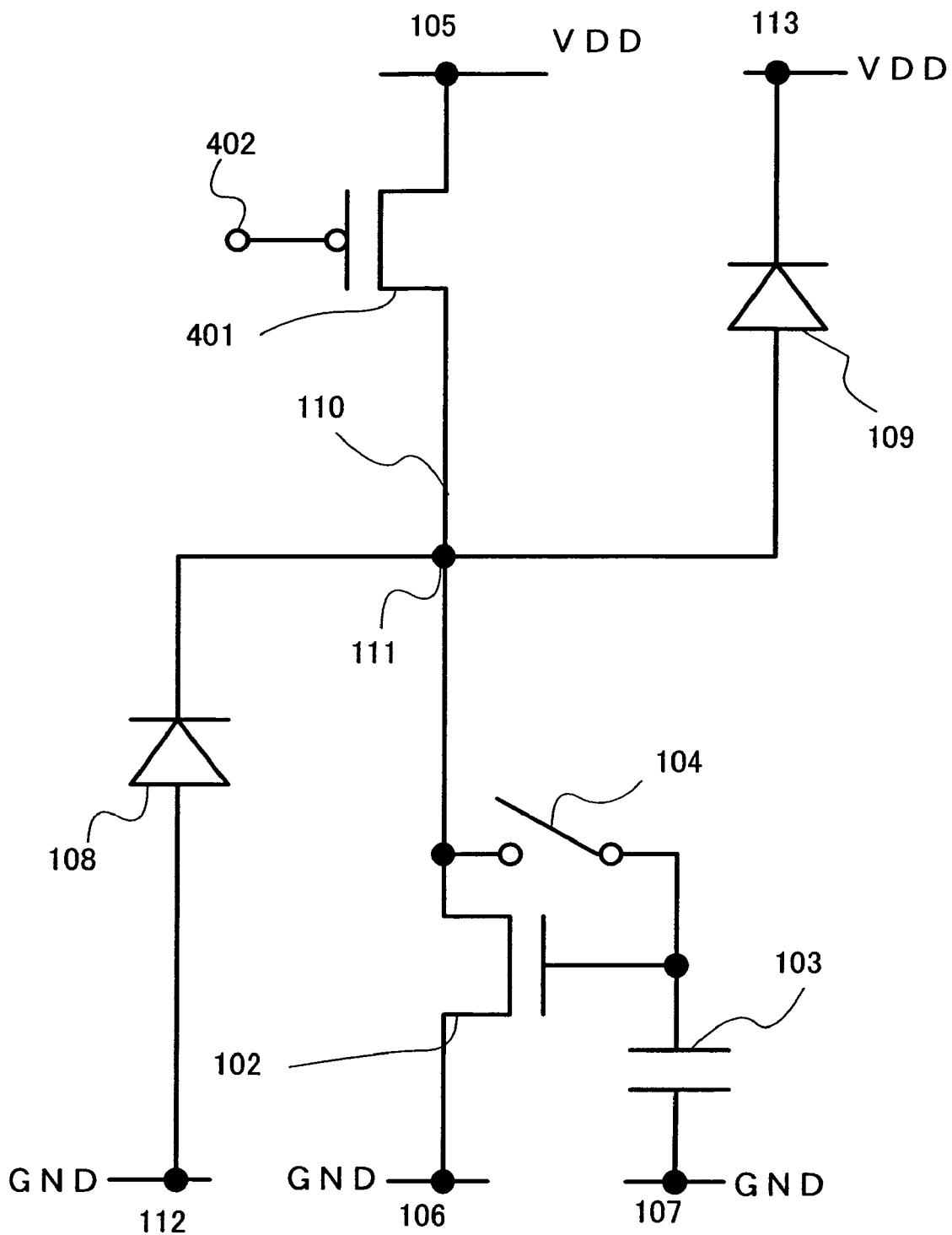
FIG. 4 is a diagram showing a configuration of the current source circuit of the invention.

FIG. 4 shows a configuration of a current source circuit in the case of applying a transistor 401 which operates in the saturation region to the reference current source 101 shown in FIG. 1. A source terminal of the transistor 401 is connected to the wiring 105 and a drain terminal thereof is connected to the wiring 110. A gate terminal 402 of the transistor 401 is applied a predetermined potential. The transistor 401 operates in the saturation region, therefore, a current value is mostly determined by a potential difference between the gate terminal 402 and the source terminal and is not affected by a potential of the drain terminal.

That is to say, the source terminal has a constant potential since it is connected to the wiring 105, therefore, a current value is determined by a gate potential. Thus, the transistor 401 operates as a current source. Accordingly, the transistor 401 which operates in the saturation region can function as the reference current source. It is to be noted that common portions to those in the configuration of FIG. 1 are denoted by the same reference numerals.

The gate terminal of the transistor 401 is sometimes applied a voltage of certain magnitude. Otherwise, the gate potential of the transistor 401 is determined by short-circuiting the gate terminal and the drain terminal thereof and supplying a predetermined current to the drain terminal to generate a gate voltage of appropriate magnitude.

Here, noise may occur in the wiring 110 of the current source circuit itself. This noise is caused by parasitic capacitance (intersection capacitance) and the like generated at a portion where the wiring 110 intersects the other wirings. The potential of the wiring 110 becomes higher or lower than the potential in the normal operation due to this noise.

Operations of the rectifying elements 108 and 109 when noise occurs in the wiring 110 are described. When noise occurs in the wiring 110 and the potential of the point 111 becomes lower than that of the wiring 112, a current flows from the wiring 112 to the point 111 until the potential of the point 111 becomes equal to that of the wiring 112. This is caused by the operation of the rectifying element 108 being conductive. When noise occurs in the wiring 110 and the potential of the point 111 becomes higher than that of the wiring 105, a current flows from the point 111 to the wiring 113 as shown in FIG. 3B until the potential of the point 111 becomes equal to that of the wiring 113. This is caused by the operation of the rectifying element 109 being conductive.

A problem in the case where noise occurs when writing a signal to a conventional current source circuit is described with reference to FIGS. 5 and 6. It is to be noted that common portions to the configuration of FIG. 4 are denoted by the same reference numerals.

FIG. 5 shows a phenomenon that the potential of the point 111 of the wiring 110 becomes lower than that of the wiring 106 and an operation of the conventional current source circuit at that time.

Figure 5A:
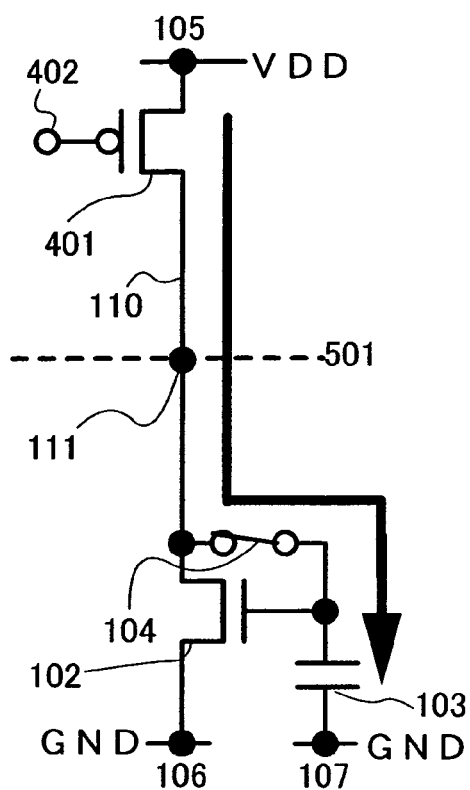
FIGS. 5A to 5D are diagrams showing operations of the current source circuit of the invention.
Figure 5B:
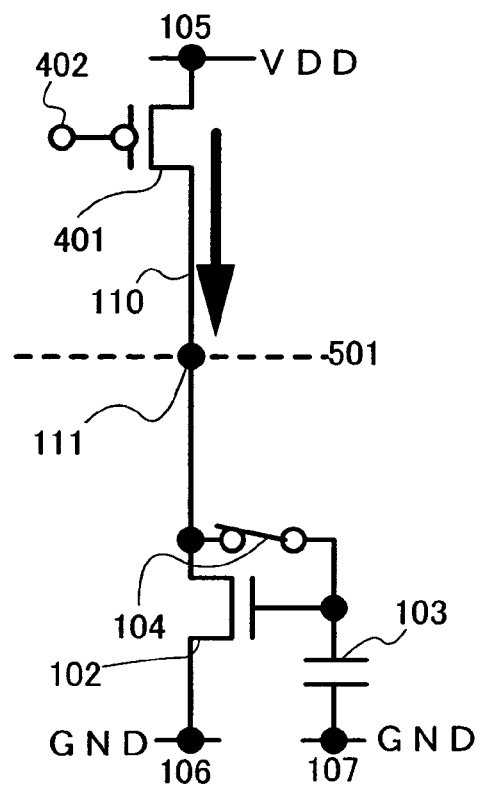
Figure 5C:
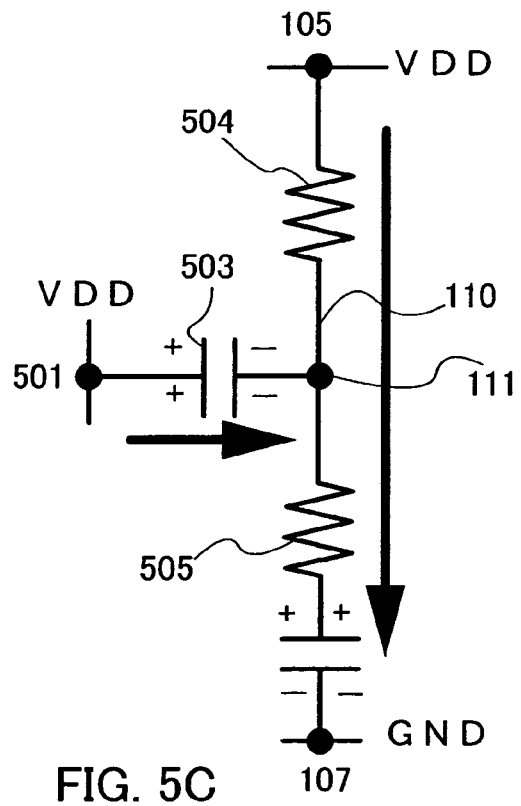

In FIG. 5A, the wiring 110 intersects another wiring 501 at the point 111, thereby parasitic capacitance is formed. A gate potential of the transistor 102 which is off is accumulated in the capacitor 103. FIG. 5C is a schematic diagram showing an equivalent circuit of the current source circuit of FIG. 5A when writing a signal to the current source circuit with the wiring 501 at VDD which intersects the wiring 110 at the point 111. At this time, a signal current is written from the wiring 105 to the wiring 107 and a current flows from the wiring 501 to the point 111, thus a charge is accumulated in parasitic capacitance 503. A potential difference between the wiring 501 and the point 111 is held in the parasitic capacitance. It is to be noted that a resistor 504 denotes wiring resistance of the wiring 110, internal resistance of the transistor 401 and the like while a resistor 505 denotes wiring resistance of the wiring 110, contact resistance of the switch 104 (internal resistance of the transistor when the switch is a transistor), and the like. The resistors 504 and 505 have variable resistance, however, they are denoted as constant resistors schematically in this embodiment mode.

Figure 5D:
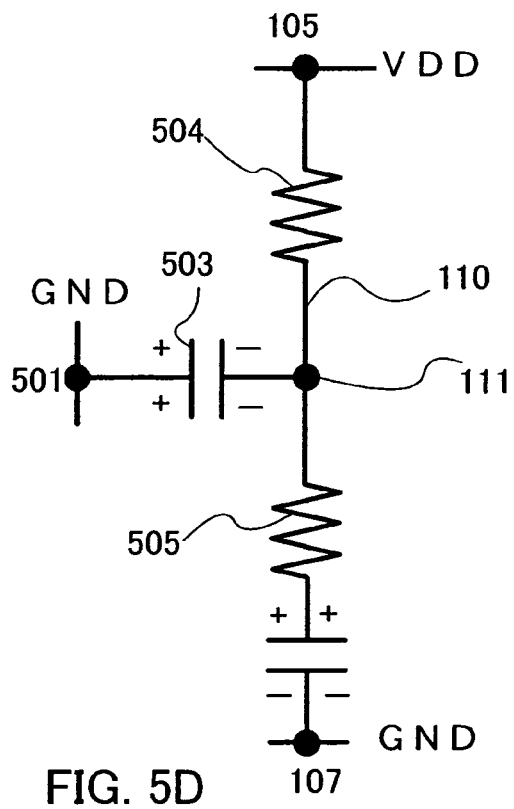

As shown in FIG. 5D, when a potential of the wiring 501 changes from VDD to GND, the point 111 on the low potential side becomes low by (VDD−GND) as the parasitic capacitance 503 holds a potential difference between the wiring 501 and the point 111 and becomes lower than GND.

In this manner, when noise occurs at the point 111 of the wiring 110, the point 111 has a potential lower than that of the wiring 106. At this time, a source terminal of the transistor 401 is connected to the wiring 105, therefore a gate-source voltage thereof does not change. Although a drain-source voltage of the transistor 401 increases, a current from the wiring 105 does not increase almost at all because the transistor 401 operates in the saturation region. Accordingly, a potential of the point 111 does not increase easily from the potential lower than GND. In the transistor 102, a terminal connected to the wiring 110 side of the transistor 102 corresponds to a source terminal, thus a gate terminal and a source terminal have equal potentials. That is to say, Vgs of the transistor 102 becomes 0 V and the transistor 102 is turned off. Accordingly, a current does not flow from the wiring 106 to the point 111. Therefore, the potential of the point 111 does not easily increase from the potential lower than GND.

That is to say, a current from the wiring 105 does not increase almost at all when the potential of the wiring 110 becomes low. As a terminal connected to the wiring 106 side of the transistor 102 has a lower potential than a terminal thereof connected to the wiring 110 side, the terminal connected to the wiring 110 side corresponds to a source terminal of the transistor 102. Then, the source terminal and the gate terminal of the transistor 102 are short-circuited through the switch 104, therefore, the transistor 102 is turned off and a current is not supplied from the wiring 106 either. Accordingly, it takes some time to turn the potential of the point 111 back within the normal range.

On the other hand, FIG. 6 shows a phenomenon that the potential of the point 111 of the wiring 110 becomes higher than the potential of the wiring 107 and an operation of the conventional current source circuit at that time.

Figure 6A:
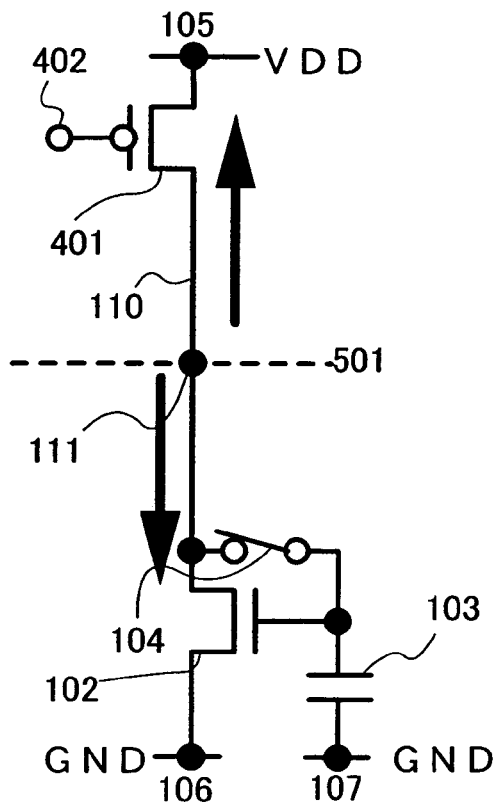
FIGS. 6A to 6C are diagrams showing operations of the current source circuit of the invention.
Figure 6B:
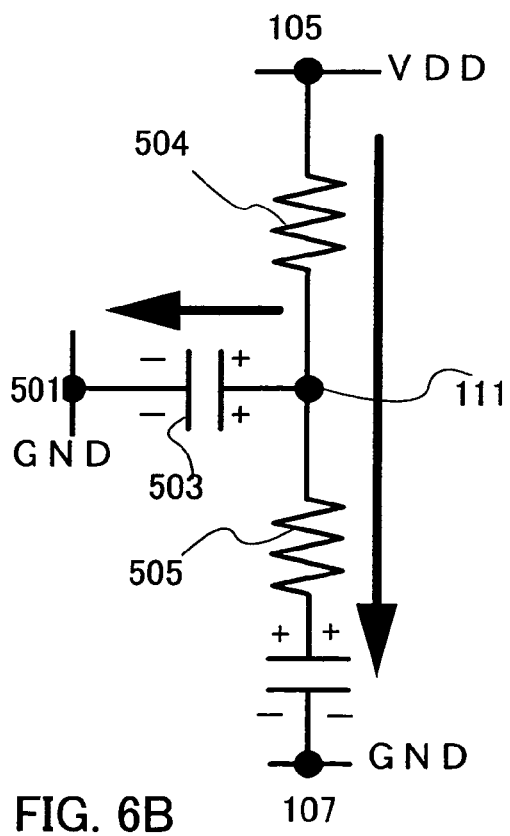

FIG. 6B is a schematic diagram showing an equivalent circuit of a current source circuit when writing a signal current to the current source circuit with the potential of the wiring 501 being GND which intersects the wiring 110 at the point 111 of the current source circuit shown in FIG. 5. At this time, a signal current is written to the wiring 107 from the wiring 105 and a current flows from the wiring 501 to the point 111, thus a charge is accumulated in the parasitic capacitance 503. A potential difference between the wiring 501 and the point 111 is held in the parasitic capacitance. It is to be noted that the resistor 504 denotes wiring resistance of the wiring 110, internal resistance of the transistor 401 and the like while the resistor 505 denotes wiring resistance of the wiring 110, contact resistance of the switch 104 (internal resistance of the transistor when the switch is a transistor), and the like. The resistors 504 and 505 have variable resistors, however, they are denoted as constant resistors schematically in this embodiment mode.

Figure 6C:
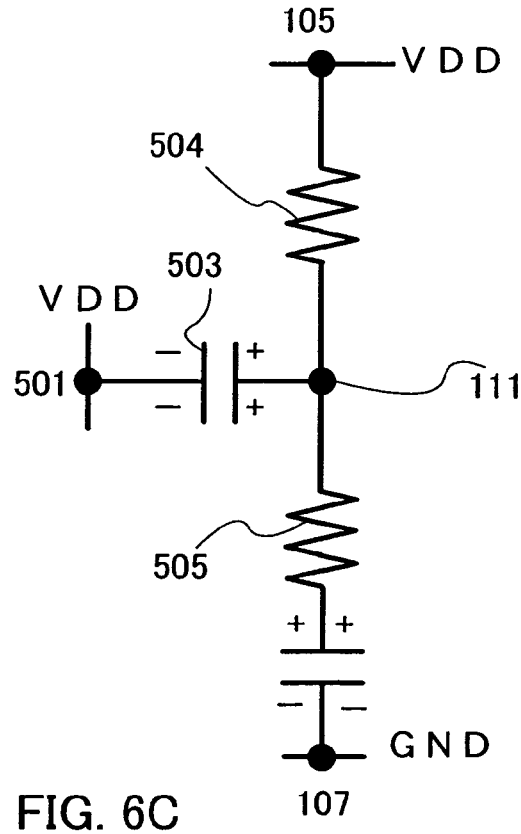

As shown in FIG. 6C, when a potential of the wiring 501 changes from GND to VDD, the point 111 on the high potential side becomes higher by (VDD−GND) and becomes higher than VDD as the parasitic capacitance 503 holds a potential difference between the wiring 501 and the point 111.

In this manner, when noise occurs at the point 111 of the wiring 110 and the point 111 has a potential higher than that of the wiring 105, a terminal which is connected to the wiring 110 of the transistor 401 corresponds to a source terminal, resulting in increasing an absolute value of a gate-source voltage of the transistor 401. As a result, a current flows from the point 111 to the wiring 105 as shown in FIG. 6A and the potential of the point 111 decreases. However, when the potential of the point 111 decreases, an absolute value of Vgs of the transistor 401 becomes small, which lets a smaller current flow through the transistor 401. Accordingly, it takes some time to turn the potential of the point 111 back within the normal range. On the other hand, a gate-source voltage of the transistor 102 is increased, which lets a current flow from the point 111 to the wiring 106. Consequently, the potential of the point 111 is decreased. However, the Vgs of the transistor 102 becomes low as the potential of the point 111 decreases. Thus a current flowing to the transistor 102 is reduced. Accordingly, it takes some time to turn the potential of the point 111 back within the normal range. In this manner, when the potential of the point 111 becomes higher, a current easily flows through the transistor 102 and then to the transistor 401, thus the potential turns back within the normal range rather easily as compared to the case where the potential becomes lower.

Figure 7:
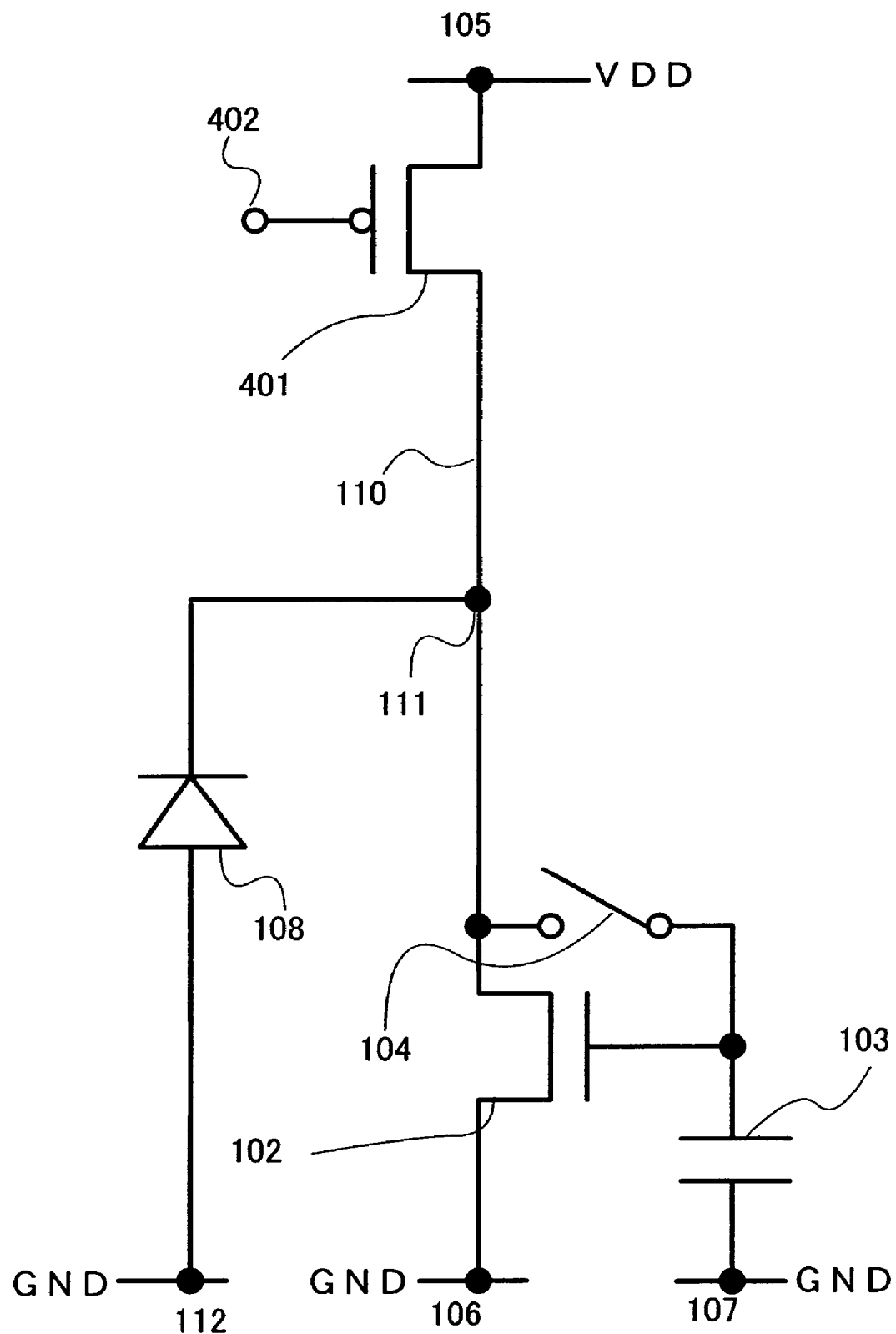
FIG. 7 is a diagram showing a configuration of the current source circuit of the invention.

In view of this, in this embodiment mode, by setting a current drive capacity of the rectifying element 108 shown in FIG. 4 larger than that of the rectifying element 109, the potential of the wiring 110 can turn back to the normal potential in the case where it becomes outside the range of normal operation due to noise. For example, the current drive capacity of the rectifying element 108 is set twice as large as that of the rectifying element 109 or larger, or more preferably five times as large or larger. Therefore, the rectifying element 108 only may be provided as shown in FIG. 7 in some cases. With this structure also, the potential which is outside the normal range due to noise can turn back within the normal range more rapidly.

Embodiment Mode 2

Figure 9:
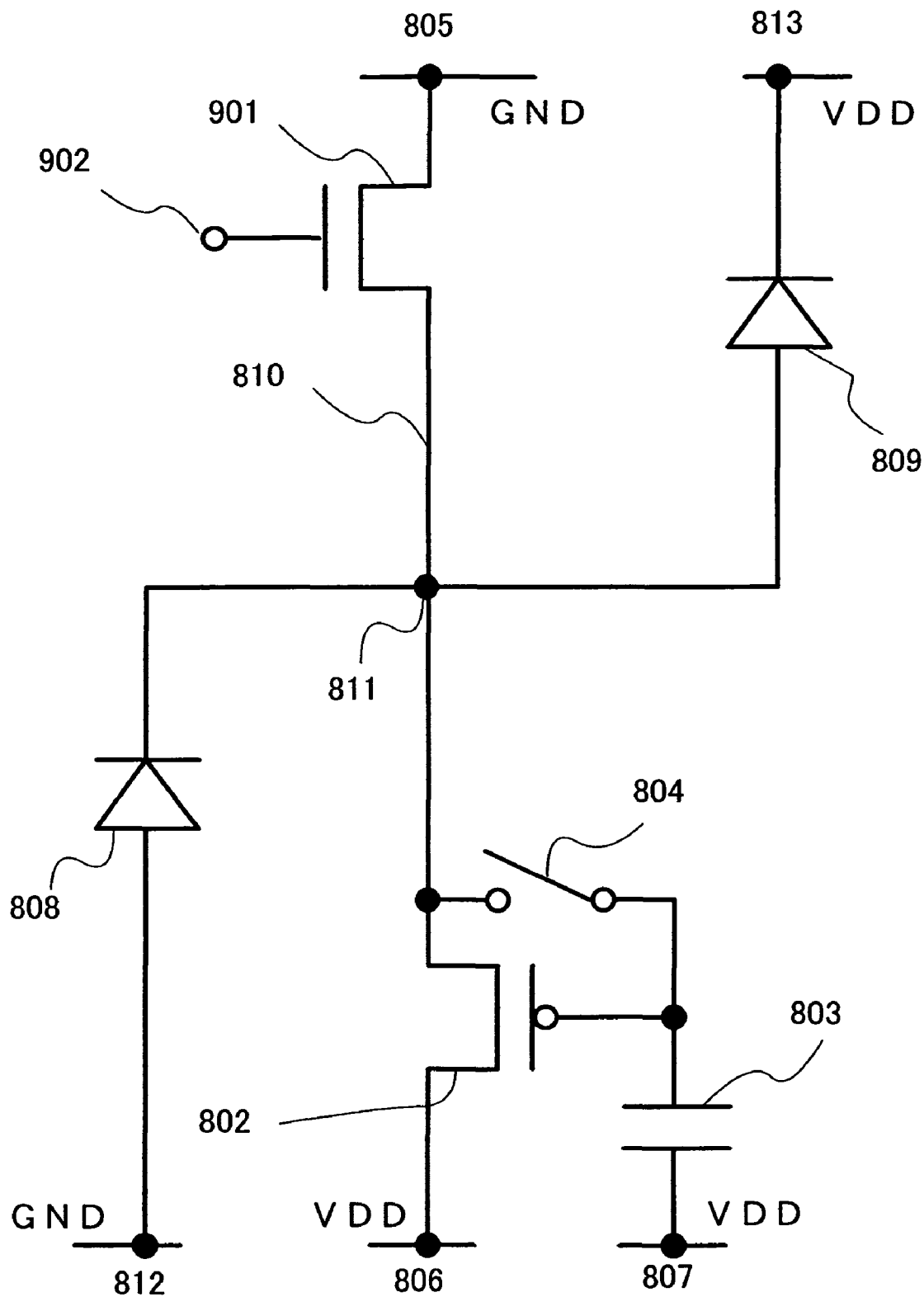
FIG. 9 is a diagram showing a configuration of the current source circuit of the invention.

The structure described in Embodiment Mode 1 employs a P-channel transistor which functions as a reference current source, however, the invention is not limited to this. FIG. 9 shows an example of the case of changing the polarity (conductivity) of transistor which functions as a reference current source without changing the connection of the circuit with respect to the circuit shown in FIG. 4. It is to be noted in FIG. 9 that an N-channel transistor is employed as the reference current source 801 in FIG. 8.

A source terminal of a transistor 901 is connected to a wiring 805 while a drain terminal thereof is connected to a wiring 810. A gate terminal of the transistor 901 is inputted with a predetermined potential. The transistor 901 operates in the saturation region, therefore, a current value is mostly determined by a potential difference between the gate terminal 902 and the source terminal and is not affected by a potential of the drain terminal. That is to say, the source terminal has a constant potential since it is connected to the wiring 805, therefore, a current value is determined by a gate potential. Thus, the transistor 901 operates as a current source. Accordingly, the transistor 901 which operates in the saturation region can function as the reference current source. It is to be noted that common portions to those in the configuration of FIG. 8 are denoted by the same reference numerals.

The gate terminal of the transistor 901 is sometimes applied a voltage of certain magnitude. Otherwise, the gate potential of the transistor 901 is determined by short-circuiting the gate terminal and the drain terminal thereof and supplying a predetermined current to the drain terminal to generate a gate voltage of appropriate magnitude.

Here, noise may occur in the wiring 810. This noise is caused by parasitic capacitance (intersection capacitance) and the like generated at a portion where the wiring 810 intersects the other wirings. A static electricity could be a cause as well. The potential of the wiring 810 becomes higher or lower than the potential in the normal operation due to this noise.

Operations of the rectifying elements 808 and 809 when noise occurs in the wiring 810 are described. When noise occurs in the wiring 810 and the potential of the point 811 becomes lower than that of the wiring 812, a current flows from the wiring 812 to the point 811 until the potential of the point 811 becomes equal to that of the wiring 812. This is caused by the operation of the rectifying element 808 being conductive. When noise occurs in the wiring 810 and the potential of the point 811 becomes higher than that of the wiring 813, a forward voltage is applied to the rectifying element 809 and a current flows from the point 811 to the wiring 813 until the potential of the point 811 becomes equal to that of the wiring 813. This is caused by the operation of the rectifying element 809 being conductive.

A problem in the case where noise occurs when writing a signal to a conventional current source circuit is described with reference to FIGS. 10A to 11C. It is to be noted that common portions to the configuration of FIG. 9 are denoted by the same reference numerals.

FIGS. 10A to 10D each shows a phenomenon that the potential of the point 811 of the wiring 810 becomes lower than that of the wiring 805 and an operation of the conventional current source circuit at that time.

In FIG. 10A, the wiring 810 intersects another wiring 1001 at the point 811, thereby parasitic capacitance is formed. A gate potential of the transistor 802 which is off is accumulated in the capacitor 803. FIG. 10C is a schematic diagram showing an equivalent circuit of the current source circuit of FIG. 10A when writing a signal to the current source circuit with the wiring 1001 at VDD which intersects the wiring 810 at the point 811. At this time, a signal current is written from the wiring 807 to the wiring 805 and a current flows from the wiring 1001 to the wiring 811, thus a charge is accumulated in parasitic capacitance 1003. A potential difference between the wiring 1001 and the point 811 is held in the parasitic capacitance 1003. It is to be noted that a resistor 1004 denotes wiring resistance of the wiring 810, internal resistance of the transistor 901 and the like while a resistor 1005 denotes wiring resistance of the wiring 810, contact resistance of the switch 804 (internal resistance of the transistor when the switch is a transistor), and the like. The resistors 1004 and 1005 are shown schematically, however, the transistor 901 which operates in the saturation region operates like a variable resistor and is designed so that there is almost no resistance due to the switch 804.

Here, as shown in FIG. 10D, when the potential of the wiring 1001 changes from VDD to GND, the point 811 on the low potential side becomes lower than GND as the parasitic capacitance 1003 holds a potential difference between the wiring 1001 and the point 811.

In this manner, when noise occurs at the point 811 of the wiring 810, the wiring 810 has a potential lower than that of the wiring 805. At this time, a terminal of the transistor 901 which is connected to the wiring 810 corresponds to a source terminal, therefore an absolute value of a gate-source voltage thereof increases. As a result, a current flows from the wiring 805 to the point 811 as shown in FIG. 10B, thus the potential of the point 811 increases. However, when the potential of the point 811 increases, an absolute value of Vgs of the transistor 901 decreases. Accordingly, a current flowing through the transistor 901 becomes small. Therefore, it takes some time to turn the potential of the point 811 back within the normal range. On the other hand, an absolute value of a gate-source voltage of the transistor 802 increases, thus a current flows from the wiring 806 to the point 811. Therefore, the potential of the point 811 increases. However, Vgs of the transistor 802 becomes low when the potential of the point 811 increases, thus a current flowing through the transistor 802 becomes small. Therefore, it takes time to turn the potential of the point 811 back within the normal range. In this manner, when the potential of the point 811 becomes low, a current easily flows to the transistor 802 and then to the transistor 901, thus the potential turns back within the normal range rather easily as compared to the case where the potential becomes higher.

Figure 11A:
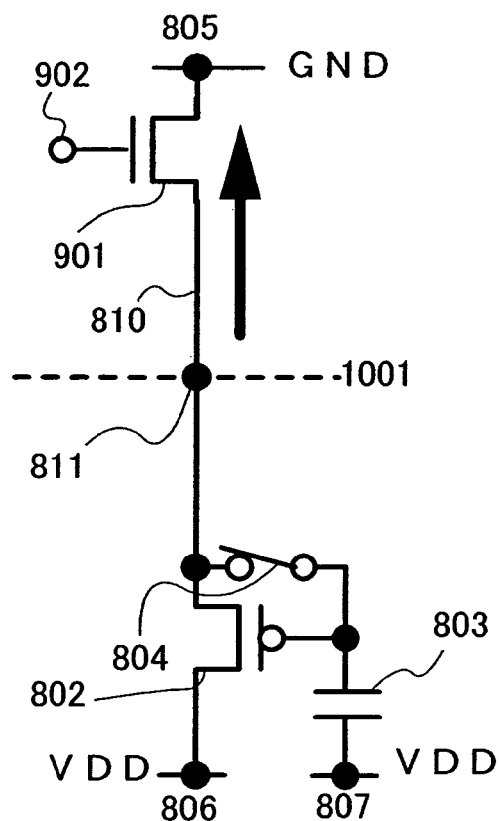
FIGS. 11A to 11C are diagrams showing operations of the current source circuit of the invention.
Figure 11B:
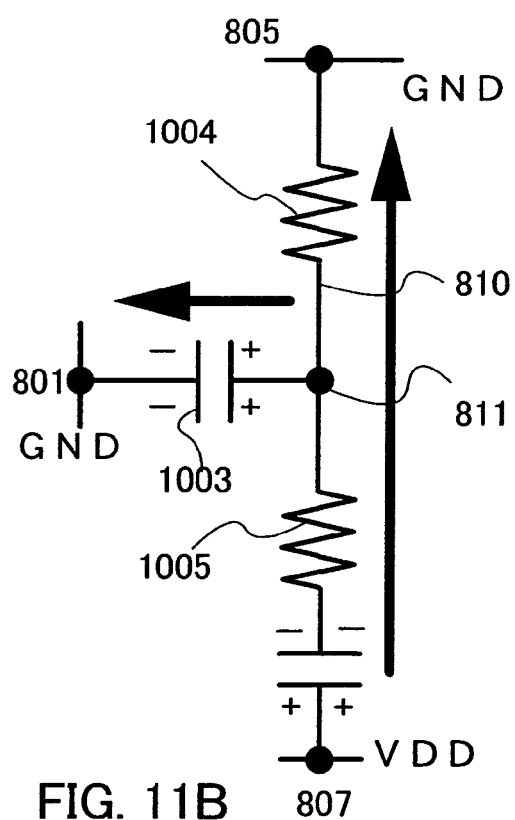
Figure 11C:
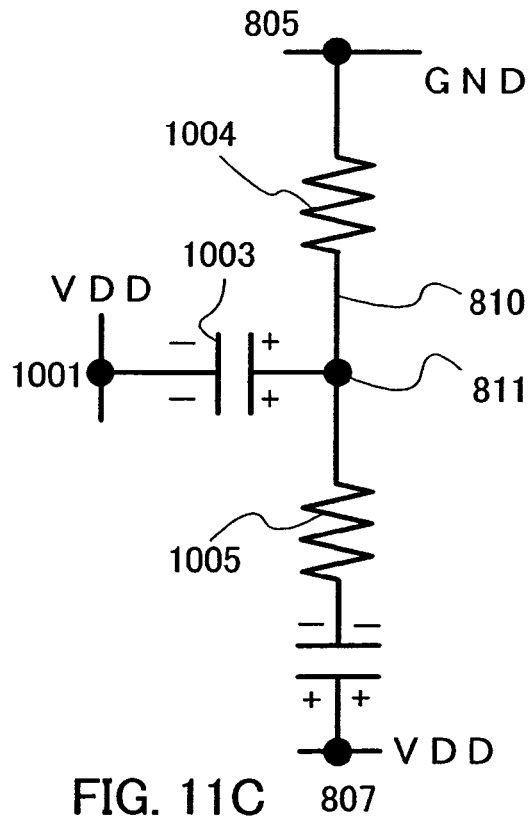

FIGS. 11A to 11C each shows a phenomenon that the potential of the point 811 of the wiring 810 becomes higher than the potential of the wiring 807 and an operation of the conventional current source circuit at that time.

FIG. 11B is a schematic diagram showing an equivalent circuit of a current source circuit when writing a signal current to the current source circuit with the potential of the wiring 1001 at GND which intersects the wiring 810 of the current source circuit shown in FIG. 10A at the point 811. At this time, a current flows from the wiring 807 to the wiring 805 to write a signal current and a current flows from the point 811 to the wiring 1001 at the same time as the signal current wiring, thus a charge is accumulated in parasitic capacitance. A potential difference between the wiring 1001 and the point 811 is held in the parasitic capacitance. It is to be noted that the resistor 1004 denotes wiring resistance of the wiring 810, internal resistance of the transistor 902 and the like while the resistor 1005 denotes wiring resistance of the wiring 810, contact resistance of the switch 804 (internal resistance of the transistor when the switch is a transistor), and the like. The resistors 1004 and 1005 are shown schematically, however, the transistor 901 which operates in the saturation region operates like a resistor and is designed so that there is almost no resistance due to the switch 804.

As shown in FIG. 11C, when a potential at the wiring 1001 changes from GND to VDD, the point 811 on the high potential side becomes high by (VDD−GND) as the parasitic capacitance 1003 holds a potential difference between the wiring 1001 and the point 811 and becomes higher than VDD. In this manner, a signal of the wiring 1001 becomes noise, which makes the potential of the point 811 higher than VDD which in the normal range of the current source circuit.

In this manner, noise occurs at the point 811 of the wiring 810 and the potential of the point 811 becomes higher than that of the wiring 805. At this time, a source terminal of the transistor 901 is connected to the wiring 805, therefore a gate-source voltage thereof does not change. Although a drain-source voltage of the transistor 901 increases, a current flowing to the wiring 805 does not increase almost at all because the transistor 901 operates in the saturation region. Accordingly, a potential of the point 811 does not decrease easily from the potential higher than VDD. In the transistor 802, a terminal connected to the wiring 811 side of the transistor 802 corresponds to a source terminal, thus a gate terminal and a source terminal have equal potentials. That is to say, Vgs of the transistor 802 becomes 0 V and the transistor 802 is turned off. Accordingly, a current does not flow from the point 811 to the wiring 806. Therefore, the potential of the point 811 does not easily decrease from the potential higher than VDD.

That is to say, a current flowing to the wiring 805 does not increase much when the potential of the wiring 810 becomes high. As a terminal connected to the wiring 110 side of the transistor 802 has a higher potential than a terminal thereof connected to the wiring 806 side, the terminal connected to the wiring 811 side corresponds to a source terminal of the transistor 802. Then, the source terminal and the gate terminal of the transistor 802 are short-circuited through the switch 804, therefore, the transistor 802 is turned off and a current does not flow to the wiring 806 either. Accordingly, it takes some time to turn the potential of the point 811 back within the normal range.

Figure 12:
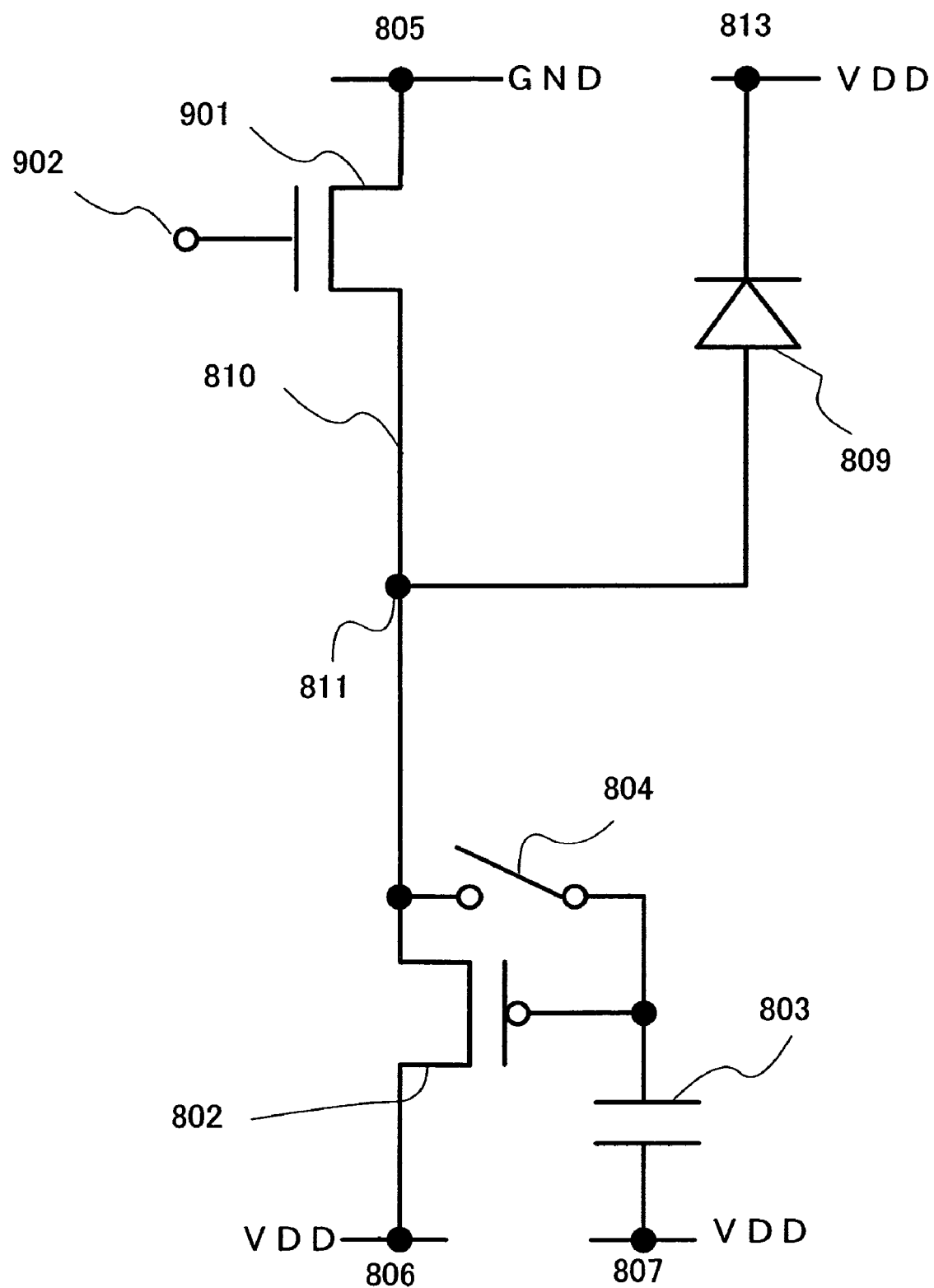
FIG. 12 is a diagram showing a configuration of the current source circuit of the invention.

In view of this, by setting a current drive capacity of the rectifying element 809 shown in FIG. 9 larger than that of the rectifying element 808 in this embodiment mode, the potential of the wiring 810 can turn back to the normal potential efficiently in the case where it becomes outside the range of normal operation due to noise. For example, the current drive capacity of the rectifying element 809 is set twice as large as that of the rectifying element 808 or larger, or more preferably five times as large or larger. Therefore, the rectifying element 809 only may be provided as shown in FIG. 12 in some cases. With this structure also, the potential which is outside the normal range due to noise can turn back within the normal range more rapidly as compared with a conventional structure.

Embodiment Mode 3

Another configuration of a current source circuit to which the invention can be applied is described. In a current source TFT of a current source circuit of this embodiment mode, a source terminal thereof is not connected to a fixed potential.

In other words, the invention is applicable to a current source circuit having a configuration where a potential of the source terminal of the current source TFT changes like the configuration described in this embodiment mode.

Figure 35:
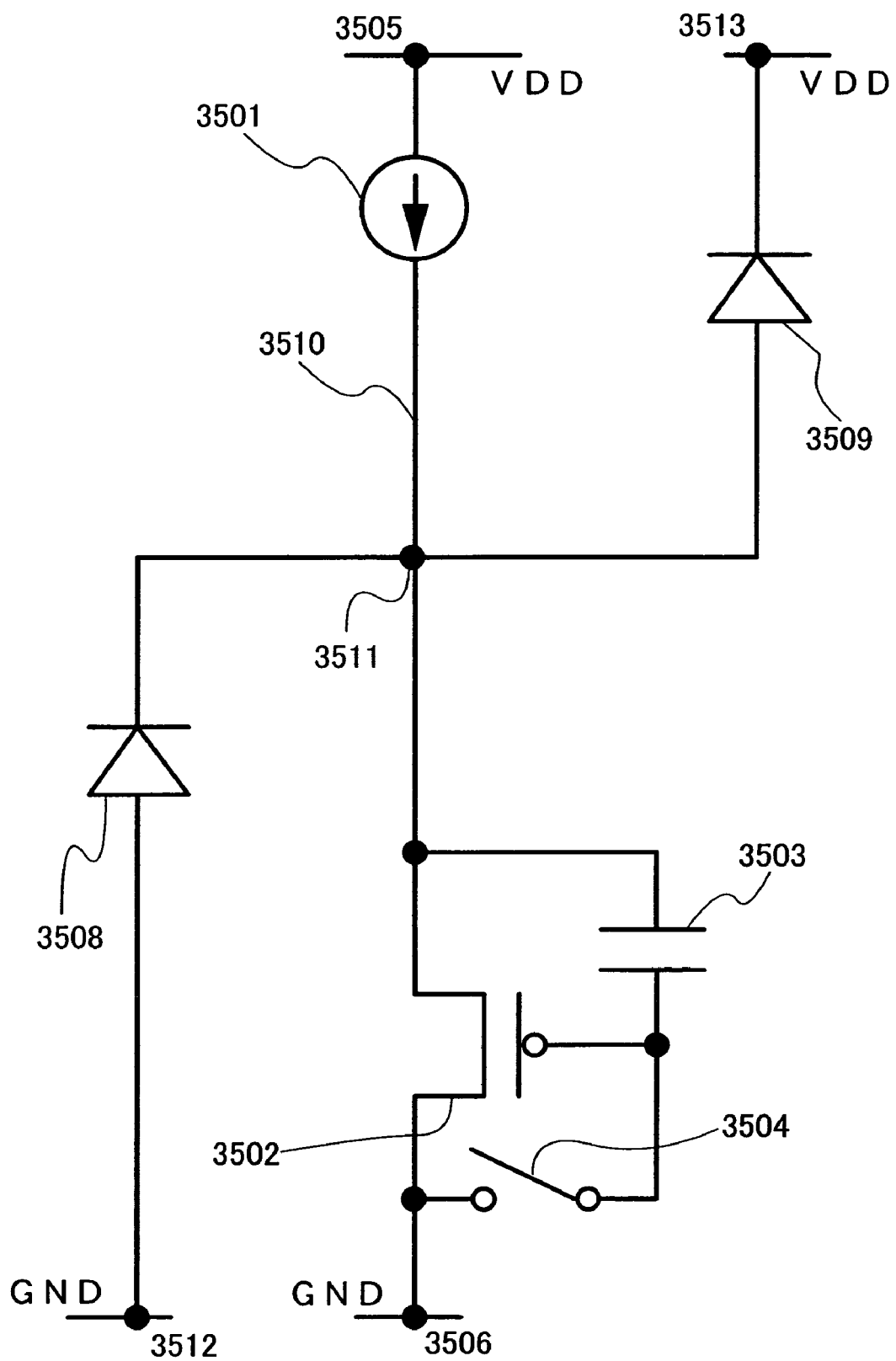
FIG. 35 is a diagram showing the current source circuit of the invention.

First, a configuration of the current source circuit of this embodiment mode is shown in FIG. 35. One side of a wiring 3510 is connected to a wiring 3505 through a reference current source 3501. The other side of the wiring 3510 is connected to a source terminal of a transistor 3502 and then to a gate terminal thereof through a capacitor 3503. Further, the gate terminal of the transistor 3502 is connected to a drain terminal of the transistor 3502 and to a wiring 3506 through a switch 3504. Accordingly, the capacitor 3503 can hold a potential of the gate terminal of the transistor 3502. At a point 3511, the wiring 3510 is connected to a wiring 3512 through a rectifying element 3508 and to a wiring 3513 through a rectifying element 3509. A potential of the wiring 3512 connected to one terminal of the rectifying element 3508 is equal to that of the wiring 3506. A forward direction of the rectifying element 3508 is a direction from the wiring 3512 to the point 3511. A potential of the wiring 3513 connected to one terminal of the rectifying element 3509 is equal to that of the wiring 3505. A forward direction of the rectifying element 3509 is a direction from the point 3511 to the wiring 3513. That is to say, the rectifying elements 3508 and 3509 are non-conductive in the normal operation.

An operation of writing a signal to the current source circuit of this configuration is briefly described. When writing a signal to the current source circuit, the switch 3504 is turned on. Then, a signal current from a reference current source 3501 flows to the capacitor 3503, thus a potential of the transistor 3502 is accumulated in the capacitor 3503. When a current stops flowing to the capacitor 3503, the signal writing is completed and a steady state is achieved. Then, the switch 3504 is turned off. In this manner, a gate-source voltage of the transistor 3502 required to flow a signal current therethrough is held in the capacitor 3503.

When noise occurs at the point 3511 of the wiring 3510 by this signal writing and a potential of the wiring 3510 changes outside the range of normal operation, a current flows to the rectifying element 3508 or 3509, which turns the potential of the wiring 3510 back within the normal range.

Figure 36:
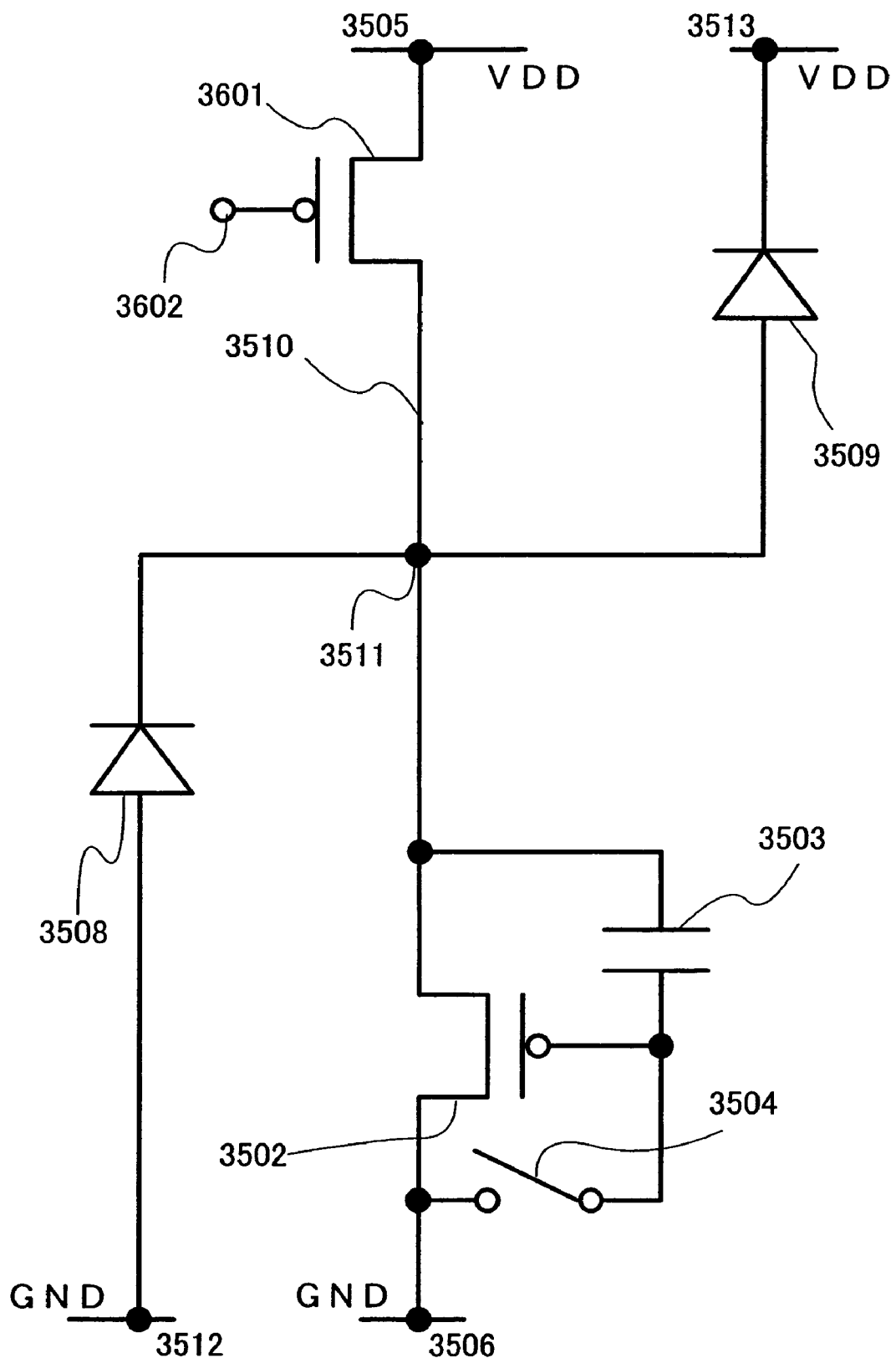
FIG. 36 is a diagram showing the current source circuit of the invention.

It is to be noted that a P-channel transistor 3601 is often used as the reference current source 3501 as shown in FIG. 36.

Here, the potential of the wiring 3510 may become outside the normal range due to noise occurring when writing a signal to the current source circuit.

When noise occurs at the point 3511 of the wiring 3510, the potential of the wiring 3510 becomes lower than that of the wiring 3506. At this time, a source terminal of the transistor 3501 is connected to the wiring 3505, therefore, a gate-source voltage of the transistor 3501 does not change. It is to be noted that a drain-source voltage of the transistor 3501 increases, however, a current from the wiring 3505 does not increase almost at all since the transistor 3501 operates in the saturation region. Accordingly, the potential of the point 3511 does not easily increase from a potential lower than GND. A terminal of the transistor 3502 which is connected to the wiring 3506 side corresponds to a source terminal. When writing a signal to the current source circuit, the switch 3504 is on, therefore, a gate terminal and the source terminal of the transistor 3502 are short-circuited and have equal potentials. That is to say, Vgs of the transistor 3502 becomes 0 V, thus the transistor 3502 is turned off. Accordingly, a current does not flow from the wiring 3506 to the point 3511. Thus, the potential of the point 3511 does not easily increase from a potential lower than GND.

In other words, when the potential of the wiring 3510 becomes lower than that of the wiring 3505, a current from the wiring 3505 does not increase almost at all. As a terminal of the transistor 3502 which is connected to the wiring 3510 side has a lower potential than a terminal of the transistor 3502 which is connected to the wiring 3506 side, thus the terminal of the transistor 3502 which is connected to the wiring 3506 side corresponds to a source terminal of the transistor 3502 which is a P-channel transistor. The source terminal and the gate terminal of the transistor 3502 are short-circuited through the switch 3504, therefore, the transistor 3502 is also turned off, and a current is not supplied from the wiring 3506. Therefore, it takes some time to turn the potential of the point 3511 back within the normal range.

On the other hand, when the potential of the wiring 3510 becomes higher than that of the wiring 3505, a terminal of the transistor 3501 which is connected to the wiring 3510 corresponds to a source terminal, thus an absolute value of the gate-source voltage of the transistor 3501 increases. As a result, a current flows from the point 3511 to the wiring 3505, thereby the potential of the point 3511 decreases. However, when the potential of the point 3511 decreases, an absolute value of Vgs of the transistor 3501 becomes small. Accordingly, a current flowing to the transistor 3501 becomes small. Thus, it takes time to turn the potential of the point 3511 back within the normal range. On the other hand, a current from the point 3511 to the wiring 3506 flows to the transistor 3502. Therefore, the potential of the point 3511 decreases. However, when the potential of the point 3511 decreases, Vgs of the transistor 3502 becomes small, which supplies a small current through the transistor 3502. Therefore, it takes some time to turn the potential of the point 3511 back within the normal range. In this manner, when the potential of the point 3511 becomes high, a current easily flows through the transistor 3502 and to the transistor 3501, therefore, the potential of the point 3511 turns back within the normal range rather easily than the case where the potential of the wiring 3510 becomes lower than that of the wiring 3505.

In view of this, by setting a current drive capacity of the rectifying element 3508 shown in FIG. 36 larger than that of the rectifying element 3509 in this embodiment mode, the potential of the wiring 3510 can turn back to the normal potential efficiently in the case where it becomes outside the range of normal operation due to noise. For example, the current drive capacity of the rectifying element 3508 is set twice as large as that of the rectifying element 3509 or larger, or more preferably five times as large or larger. Therefore, the rectifying element 3508 only may be provided in some cases. With this structure also, the potential which is outside the normal range due to noise can turn back within the normal range more rapidly as compared with a conventional structure.

Figure 37:
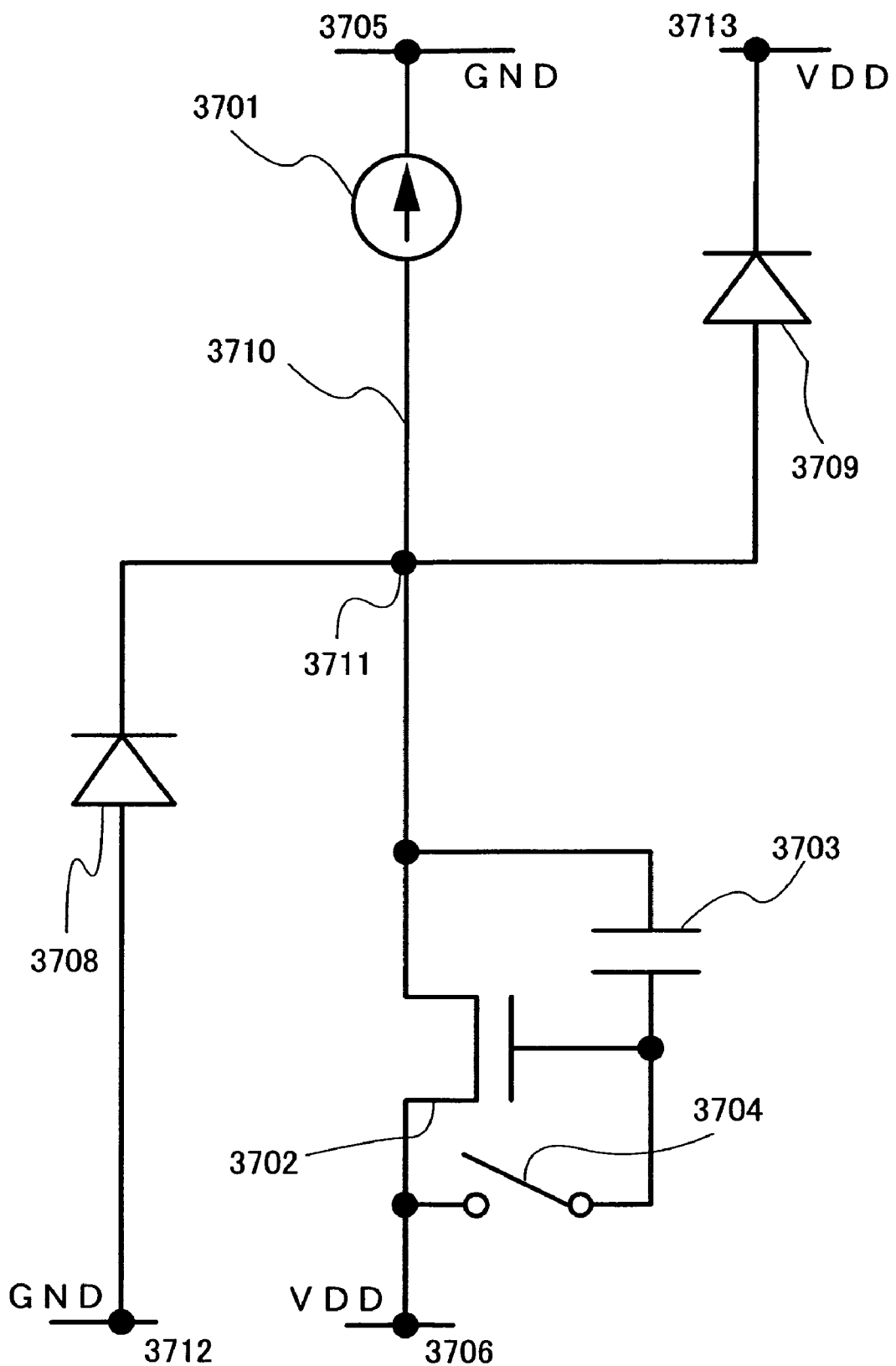
FIG. 37 is a diagram showing the current source circuit of the invention.
Figure 38:
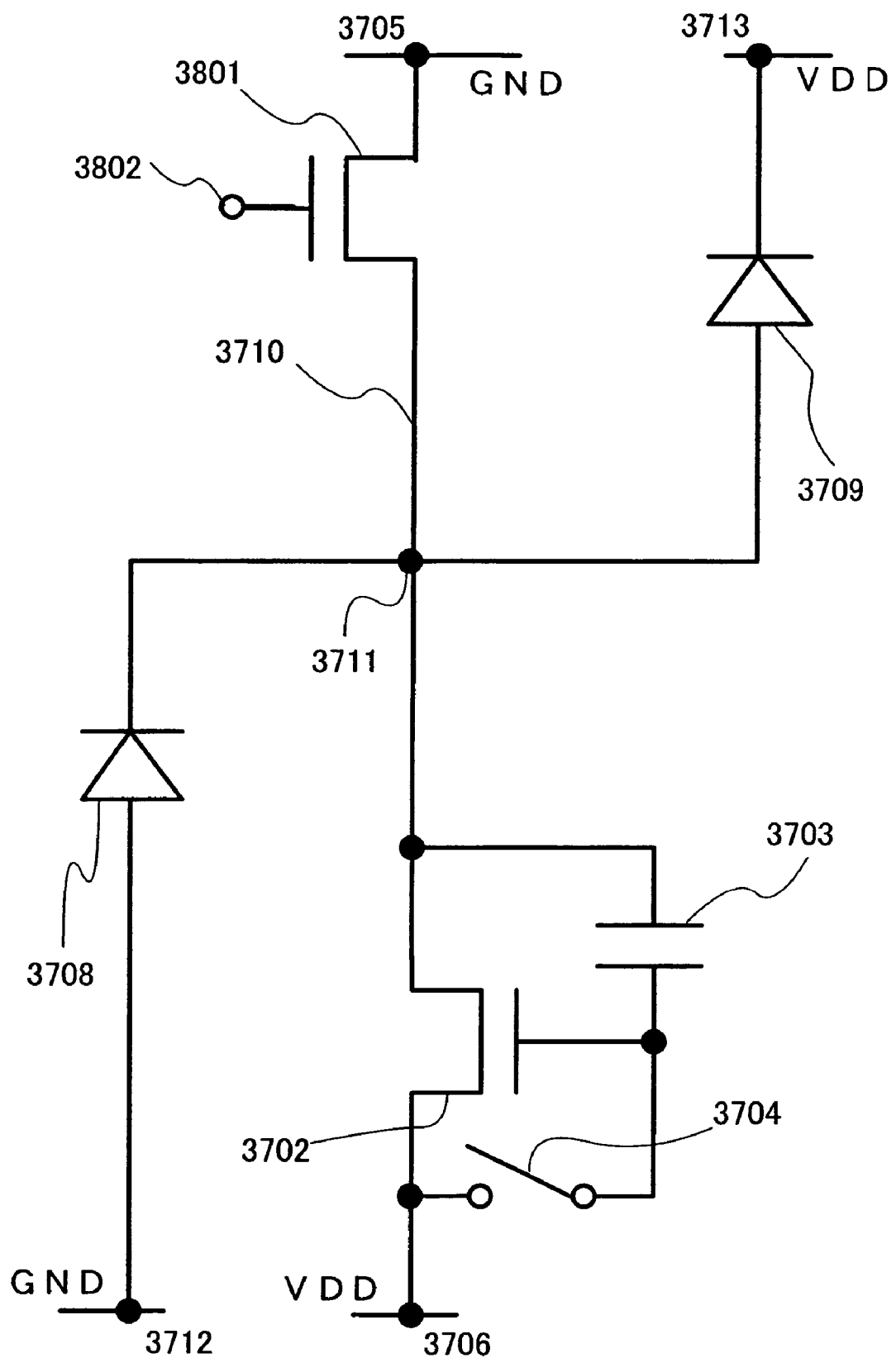
FIG. 38 is a diagram showing the current source circuit of the invention.

The structure described with reference to FIG. 36 employs a P-channel transistor which functions as a reference current source, however, the invention is not limited to this. FIG. 38 shows an example of the case of changing the polarity (conductivity) of transistor which functions as a reference current source without changing the connection of the circuit with respect to the circuit shown in FIG. 36. It is to be noted in FIG. 38 that an N-channel transistor is employed as the reference current source 3701 in FIG. 37.

In this manner, when noise occurs at a point 3711 of a wiring 3710, the wiring 3710 has a potential lower than that of a wiring 3705. At this time, a terminal of the transistor 3801 which is connected to the wiring 3710 corresponds to a source terminal, therefore an absolute value of a gate-source voltage thereof increases. As a result, a current flows from the wiring 3705 to the point 3711, thus the potential of the point 3711 increases. However, when the potential of the point 3711 increases, an absolute value of Vgs of the transistor 3801 decreases. Accordingly, a current flowing through the transistor 3801 becomes small. Therefore, it takes time to turn the potential of the point 3711 back within the normal range. On the other hand, a current flows from a wiring 3706 to the point 3711. Therefore, the potential of the point 3711 increases. However, Vgs of a transistor 3702 becomes low when the potential of the point 3711 increases, thus a current flowing through the transistor 3702 becomes small. Therefore, it takes time to turn the potential of the point 3711 back within the normal range. In this manner, when the potential of the point 3711 becomes low, a current easily flows through the transistor 3702 and then to the transistor 3801.

Alternatively, noise occurs at the point 3711 of the wiring 3710 and the potential of the wiring 3710 becomes higher than that of the wiring 3706. At this time, a source terminal of the transistor 3801 is connected to the wiring 3705, therefore a gate-source voltage thereof does not change. Although a drain-source voltage of the transistor 3801 increases, a current flowing to the wiring 3705 does not increase almost at all because the transistor 3801 operates in the saturation region. Accordingly, a potential of the point 3711 does not decrease easily from the potential higher than VDD. In the transistor 3702, a terminal connected to the wiring 3706 side of the transistor 3702 corresponds to a source terminal, thus a gate terminal and the source terminal have equal potentials. That is to say, Vgs of the transistor 3702 becomes 0 V and the transistor 3702 is turned off. Accordingly, a current does not flow from the point 3711 to the wiring 3706. Therefore, the potential of the point 3711 does not easily decrease from the potential higher than VDD.

That is to say, when the potential of the wiring 3710 becomes higher than that of the wiring 3706, a current flowing to the wiring 3705 does not increase much. A potential of a terminal of the transistor 3702 which is connected to the wiring 3710 side becomes higher than that of a terminal thereof which is connected to the wiring 3706 side, therefore, the terminal connected to the wiring 3706 side corresponds to a source terminal of the transistor 3702 which is an N-channel transistor. The source terminal and the gate terminal of the transistor 3702 are short-circuited through the switch 3704, therefore, the transistor 3702 is turned off and a current does not flow to the wiring 3706 either. Accordingly, it takes time to turn the potential of the point 3711 back within the normal range.

In view of this, by setting a current drive capacity of the rectifying element 3709 shown in FIG. 38 larger than that of the rectifying element 3708 in this embodiment mode, the potential of the wiring 3710 can turn back to the normal potential efficiently in the case where it becomes outside the range of normal operation due to noise. For example, the current drive capacity of the rectifying element 3709 is set twice as large as that of the rectifying element 3708 or larger, or more preferably five times as large or larger. Therefore, the rectifying element 3709 only may be provided in some cases. With this structure also, the potential which became outside the normal range due to noise can turn back within the normal range more rapidly as compared with a conventional structure.

Embodiment Mode 4

Described in this embodiment mode is a method for receiving and discharging a current from another current source without using a rectifying element when a potential of a wiring connected to a current source circuit becomes outside a normal range.

Figure 39:
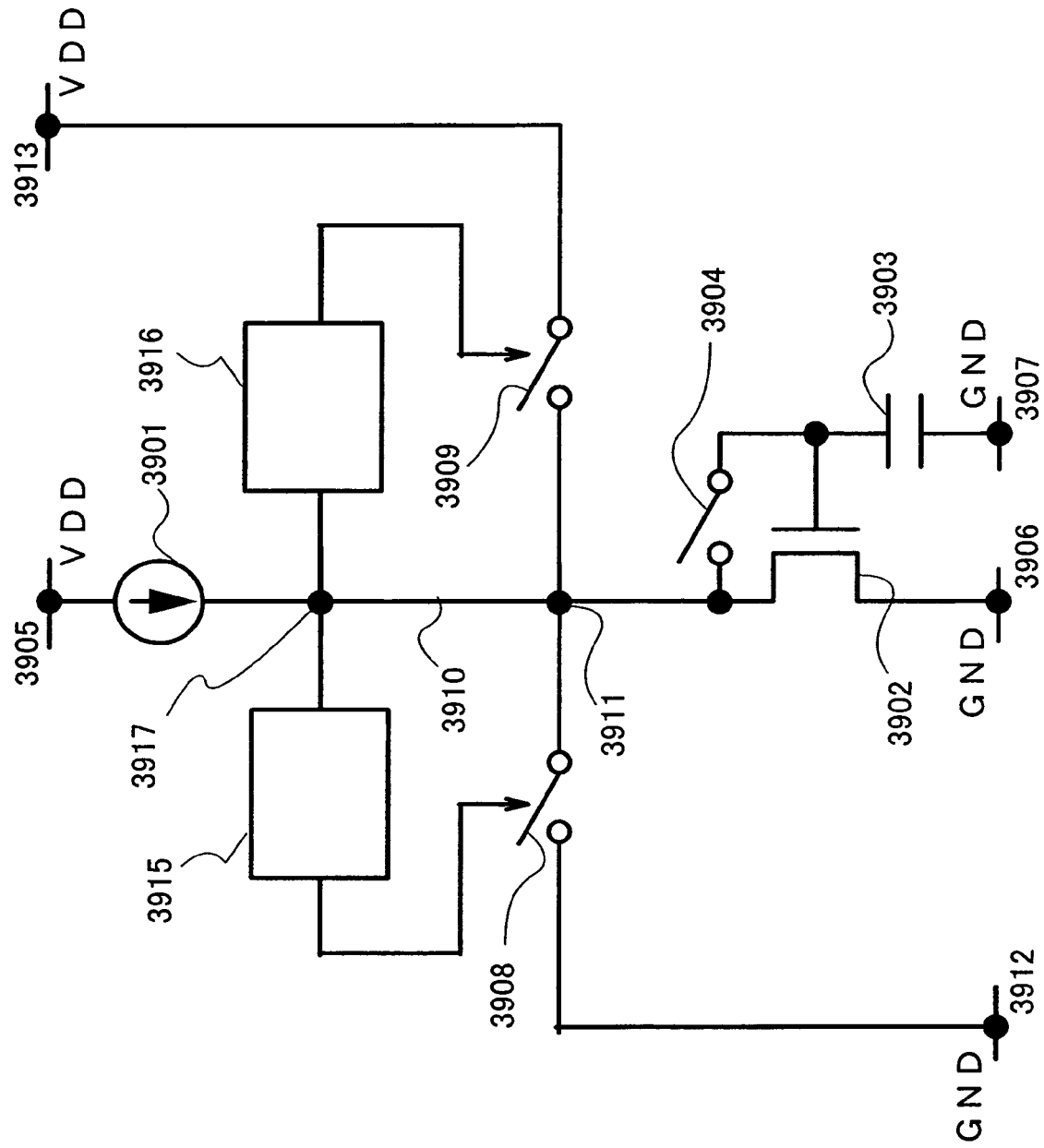
FIG. 39 is a diagram showing the current source circuit of the invention.

First, a configuration for supplying and discharging a current in this embodiment mode is shown in FIG. 39. One side of a wiring 3910 is connected to a wiring 3905 through a reference current source 3901. The other side of the wiring 3910 is connected to a drain terminal of the transistor 3902 and to a gate terminal thereof and one terminal of a capacitor 3903 through a switch 3904. The other terminal of the capacitor 3903 is connected to a wiring 3907. Therefore, the capacitor 3903 can hold a potential of the gate terminal of the transistor 3902. It is to be noted that a source terminal of the transistor 3902 is connected to a wiring 3906. A potential detecting circuit 3915 is connected to the wiring 3910 while a potential detecting circuit 3916 is connected to the wiring 3910 at a point 3917. The potential detecting circuits 3915 and 3916 each detects a potential of the point 3917 of the wiring 3910. When the potential becomes lower than a potential of a wiring 3912, an output from the potential detecting circuit 3915 turns on a switch 3908. Then, a current is supplied from the wiring 3912 to the point 3911, thereby the potential of the wiring 3910 can turn back within the normal range rapidly. When the potential of the point 3911 becomes higher than that of a wiring 3913, an output of the potential detecting circuit 3916 turns on a switch 3909. Then, a current flows to the wiring 3913, thereby the potential of the wiring 3910 can turn back within the normal range rapidly.

Figure 40:
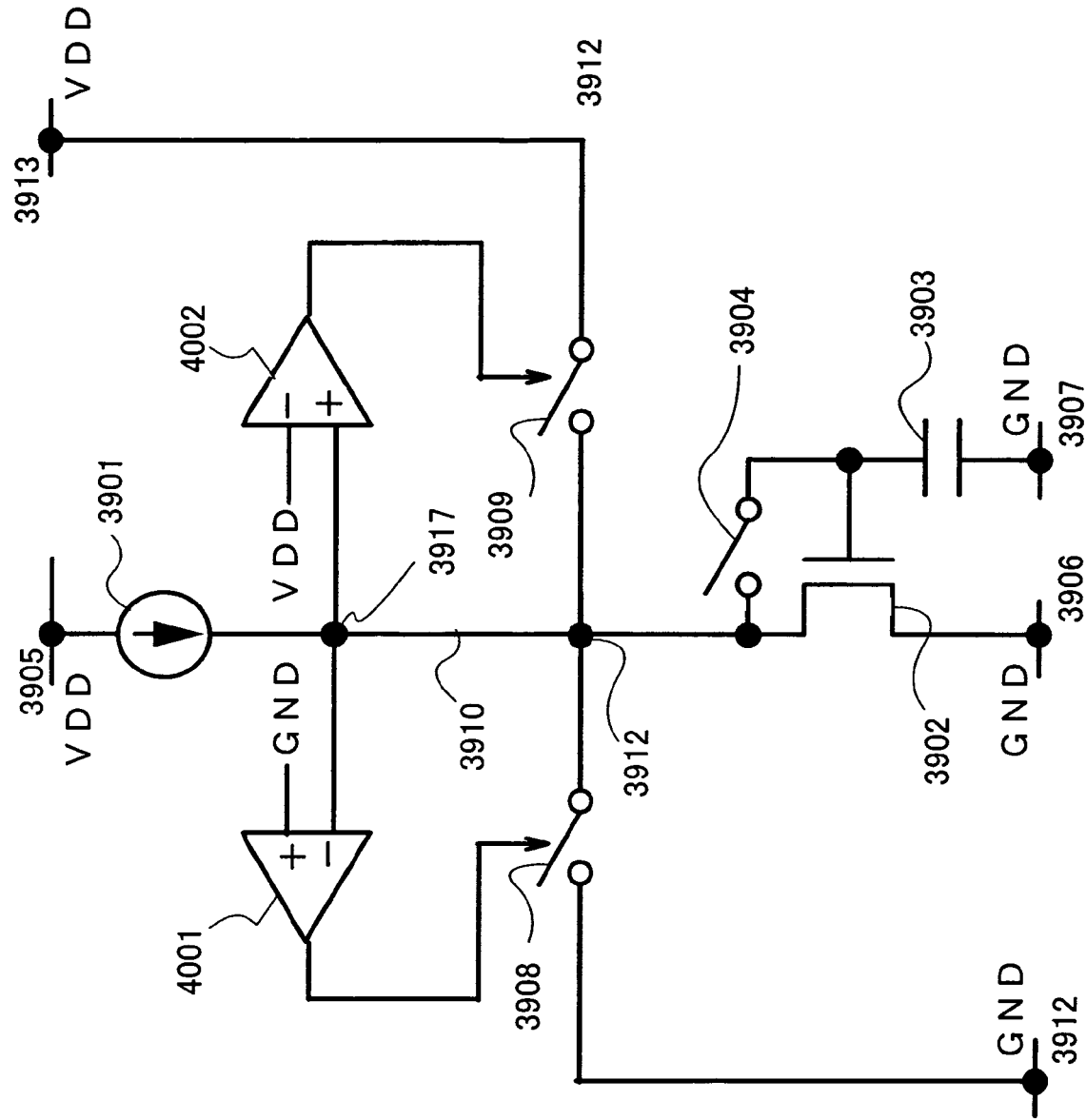
FIG. 40 is a diagram showing the current source circuit of the invention.

For the potential detecting circuit, a voltage comparator can be used as shown in FIG. 40. The potential detecting circuit 3915 corresponds to a voltage comparator 4001 in FIG. 40 while the potential detecting circuit 3916 corresponds to a voltage comparator 4002 in FIG. 40. A non-inverted input terminal of the voltage comparator 4001 is inputted with GND while an inverted input terminal of the voltage comparator 4002 is inputted with VDD. A potential of the point 3917 of the wiring 3910 is inputted to an inverted terminal of the voltage comparator 4001 and a non-inverted input terminal of the voltage comparator 4002. When the potential of the point 3917 is lower than GND, an H-level signal is inputted from the output of the voltage comparator to the switch 3908, thereby the switch 3902 is turned on. On the other hand, when the potential of the point 3917 is higher than VDD, an H-level signal is inputted from the output of the voltage comparator 4002 to the switch 3909, thereby the switch 3909 is turned on. In this manner, a voltage comparator can function as a potential detecting circuit.

The potential detecting circuit 3915 and the switch 3908 in FIG. 39 as a unit and the potential detecting circuit 3916 and the switch 3909 in FIG. 39 as a unit correspond to the rectifying elements 108 and 109 in Embodiment Mode 1 respectively.

Figure 41:
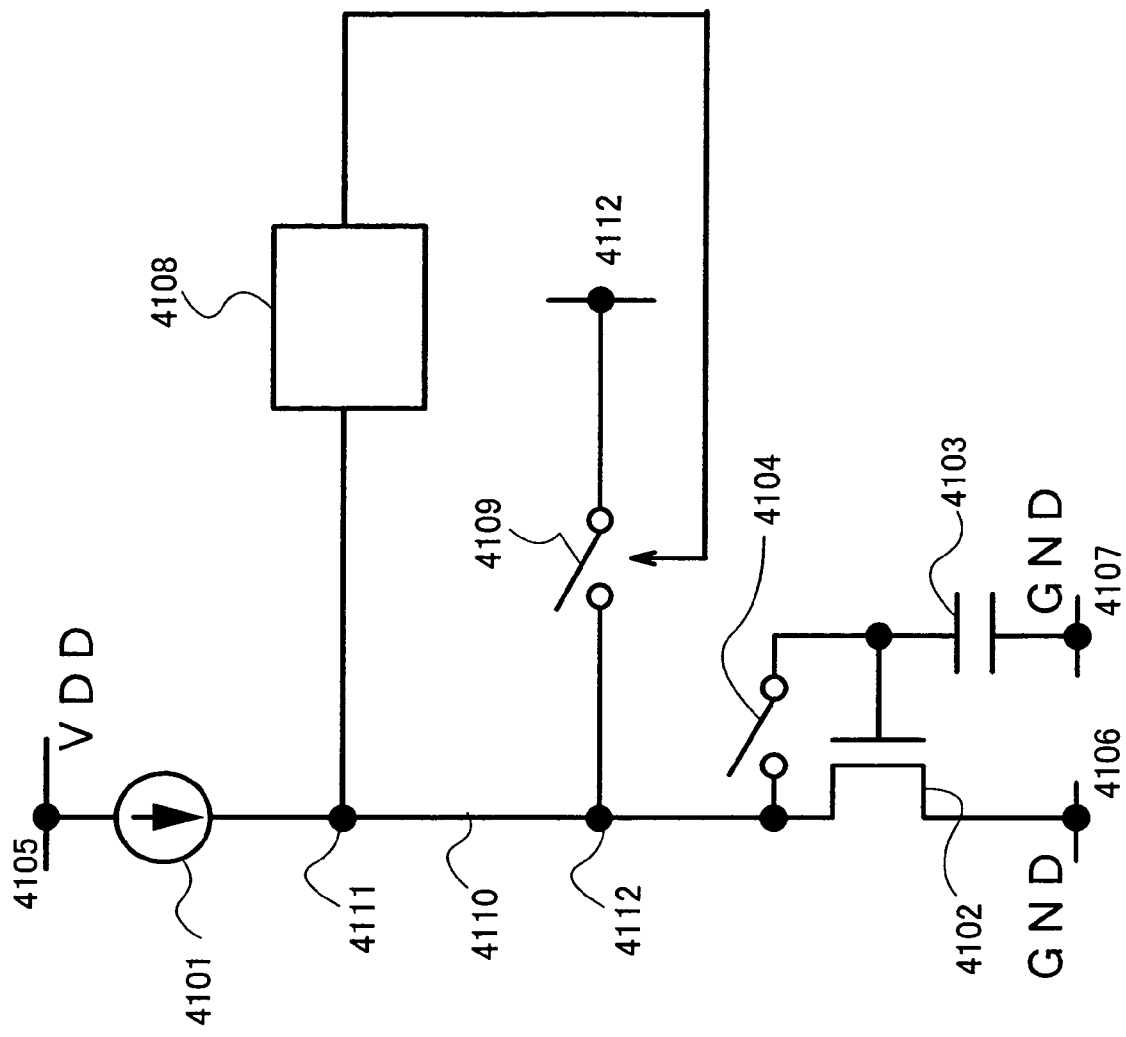
FIG. 41 is a diagram showing the current source circuit of the invention.

FIG. 41 shows another configuration for supplying and discharging a current in this embodiment mode. One side of a wiring 4110 is connected to a wiring 4105 through a reference current source 4101. The other side of the wiring 4110 is connected to a drain terminal of the transistor 4102 and to a gate terminal thereof and one terminal of a capacitor 4103 through a switch 4104. The other terminal of the capacitor 4103 is connected to a wiring 4107. Therefore, the capacitor 4103 can hold a potential of the gate terminal of the transistor 4102. It is to be noted that a source terminal of the transistor 4102 is connected to a wiring 4106. A potential detecting circuit 4108 is connected to the wiring 4110 at a point 4111. A reference potential wiring 4112 is connected to the wiring 4110 at a point 4112 through a switch 4109.

The writing operation to the current source circuit of this configuration is the same as described with reference to FIG. 1, therefore, the description is omitted here.

In this embodiment mode, when a potential of the wiring 4110 becomes outside the normal range, the potential is detected by the potential detecting circuit 4108, thereby the switch 4109 is turned on to supply a current from the reference potential wiring 4112. In this manner, the potential of the wiring 4110 can turn back within the normal range rapidly when the potential becomes outside the normal range.

It is preferable that the reference potential be set between GND and VDD so that the potential of the wiring 4110 can turn back within the normal range rapidly when the potential does not easily turn back. It is needless to say that the reference potential may be set at an intermediate potential between upper and lower limits of the normal range so that the potential can turn back within the normal range rapidly in both cases where it becomes too high and too low.

Figure 42:
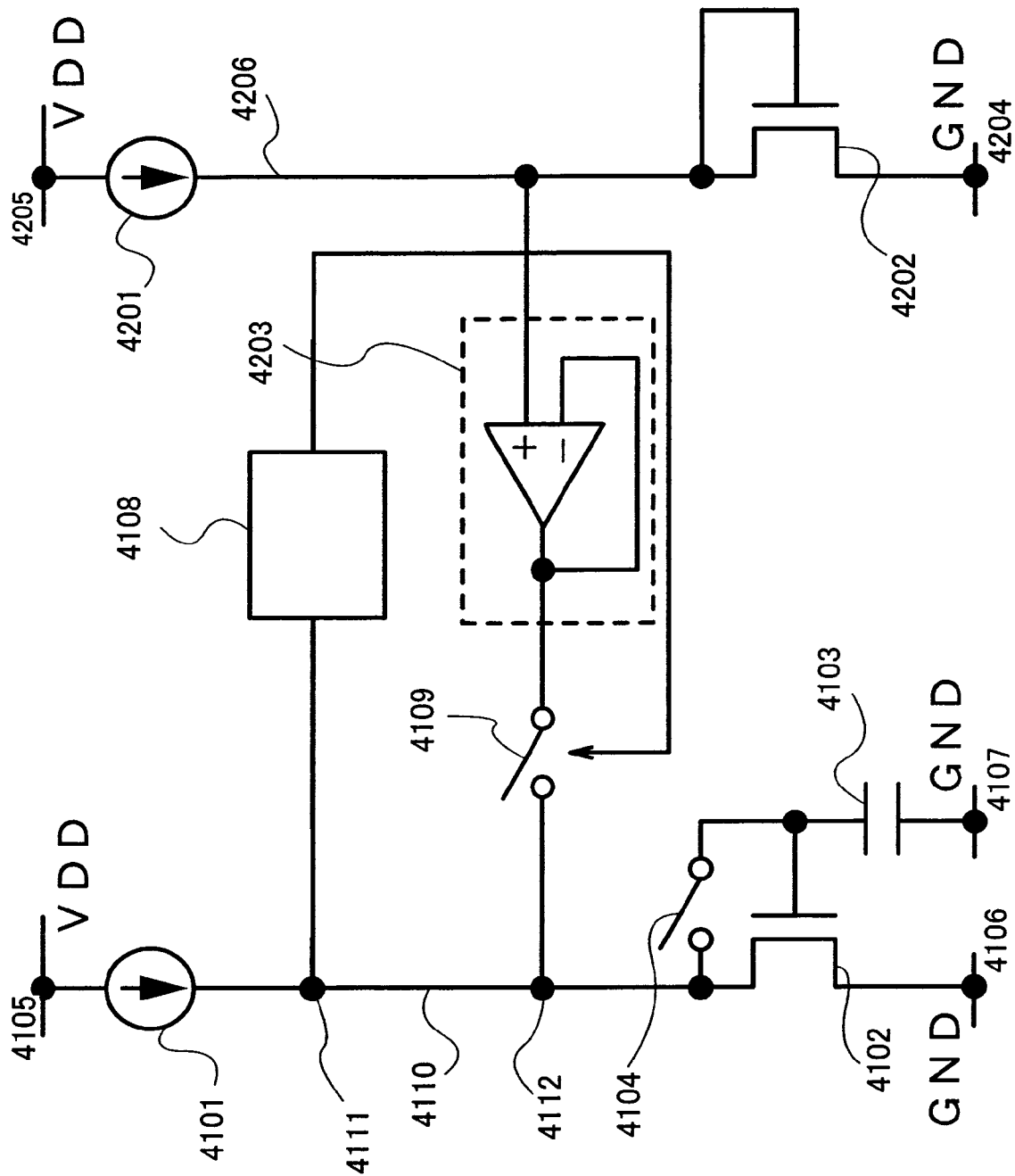
FIG. 42 is a diagram showing the current source circuit of the invention.

Moreover, a variable power source can be used instead of the reference potential wiring 4112 as well. FIG. 42 shows a configuration example in the case of using a variable power source instead of the reference potential wiring 4112. It is to be noted that the same reference numerals are used for the common portions to FIG. 41.

The variable power source includes a second reference current source 4201, a wiring 4206, a transistor 4202 and a voltage follower 4203. The wiring 4206 is connected to a wiring 4204 through the second reference current source 4201 and also to a drain terminal and a gate terminal of the transistor 4202. The drain terminal and the gate terminal of the transistor 4202 are connected, that is, the transistor 4202 is a diode-connected transistor. The source terminal of the transistor 4202 is connected to the wiring 4204. The wiring 4206 connected to the drain terminal of the transistor 4202 and a non-inverted input terminal of the voltage follower 4203 are connected. Therefore, the voltage follower 4203 can output the same potential as a potential of the drain terminal of the transistor 4202. It is to be noted that when a current supplied from a first reference current source 4101 is I1, a current supplied from a second reference current source is I2, a channel length of the transistor 4104 is L1, a channel width thereof is W1, a channel length of the transistor 4202 is L2, and a channel width thereof is W2, it is preferable that I1: W1/L1=I2: W2/L2 be satisfied. Moreover, it is preferable that when I1=I2 is satisfied, W1/L1=W2/L2 be satisfied.

Further, any circuits can be used for the voltage follower as long as a similar function can be provided. For example, a source follower may be used. A circuit which is capable of impedance conversion can be used (high input Imp, low output Imp).

Accordingly, when the potential of the wiring 4110 becomes outside the normal range, this potential is detected by the potential detecting circuit 4108, thereby the switch 4109 is turned on. Then, a current is supplied from the voltage follower 4203, thereby the potential of the wiring 4110 can turn back within the normal range rapidly.

Figure 43:
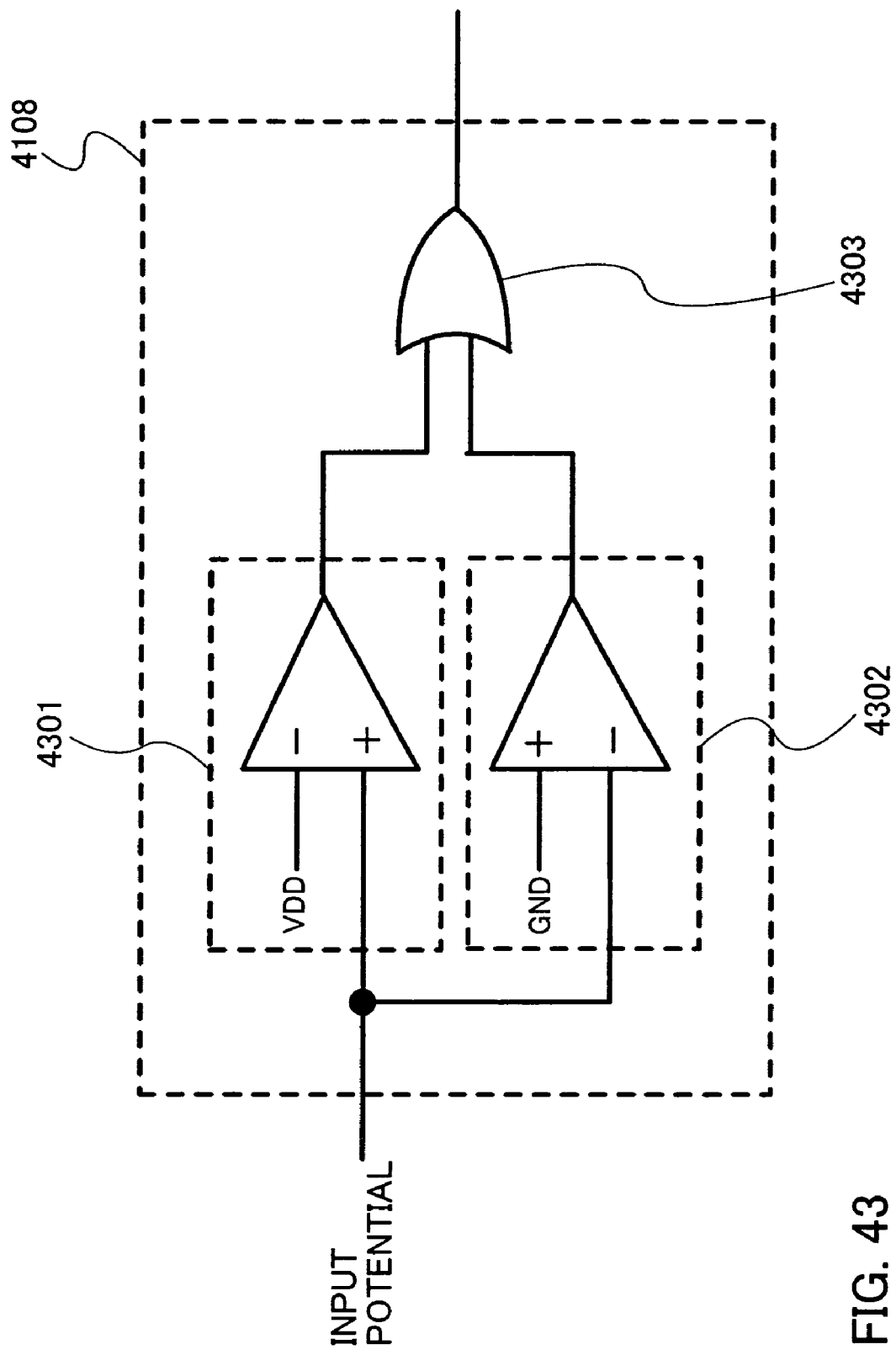
FIG. 43 is a diagram showing a potential detecting circuit which can be applied to the invention.

Here, a configuration example of the potential detecting circuit 4108 is shown in FIG. 43.

The potential detecting circuit 4108 can be configured by a first voltage comparator 4301, a second voltage comparator 4302, and an OR gate. The potential of the point 4111 is inputted to a non-inverted input terminal of the first voltage comparator 4301 and an inverted input terminal of the second voltage comparator 4302. An inverted input terminal of the first voltage comparator 4301 is inputted with VDD and a non-inverted input terminal of the second voltage comparator 4302 is inputted with GND. Here, when a potential higher than VDD is inputted to the non-inverted input terminal of the voltage comparator 4301, an H-level signal is outputted from an output terminal of the voltage comparator 4301. On the other hand, when a potential lower than GND is inputted to the inverted input terminal of the voltage comparator 4302, an H-level signal is outputted from an output terminal of the voltage comparator 4302. Then, when an input potential is between GND and VDD, an L-level signal is inputted to the both input terminals of the OR gate, therefore, an L-level signal is outputted from an output terminal of the OR gate. When the input potential is outside between GND and VDD, an H-level signal is inputted to one of input terminals of the OR gate, thereby an H-level signal is outputted from the OR gate. In this manner, an operation of the potential detecting circuit is provided. It is needless to say that the invention is not limited to such a configuration and a potential detecting circuit of any configuration may be used. For example, a chopper inverter comparator as shown in FIG. 44 may be used.

Figure 44:
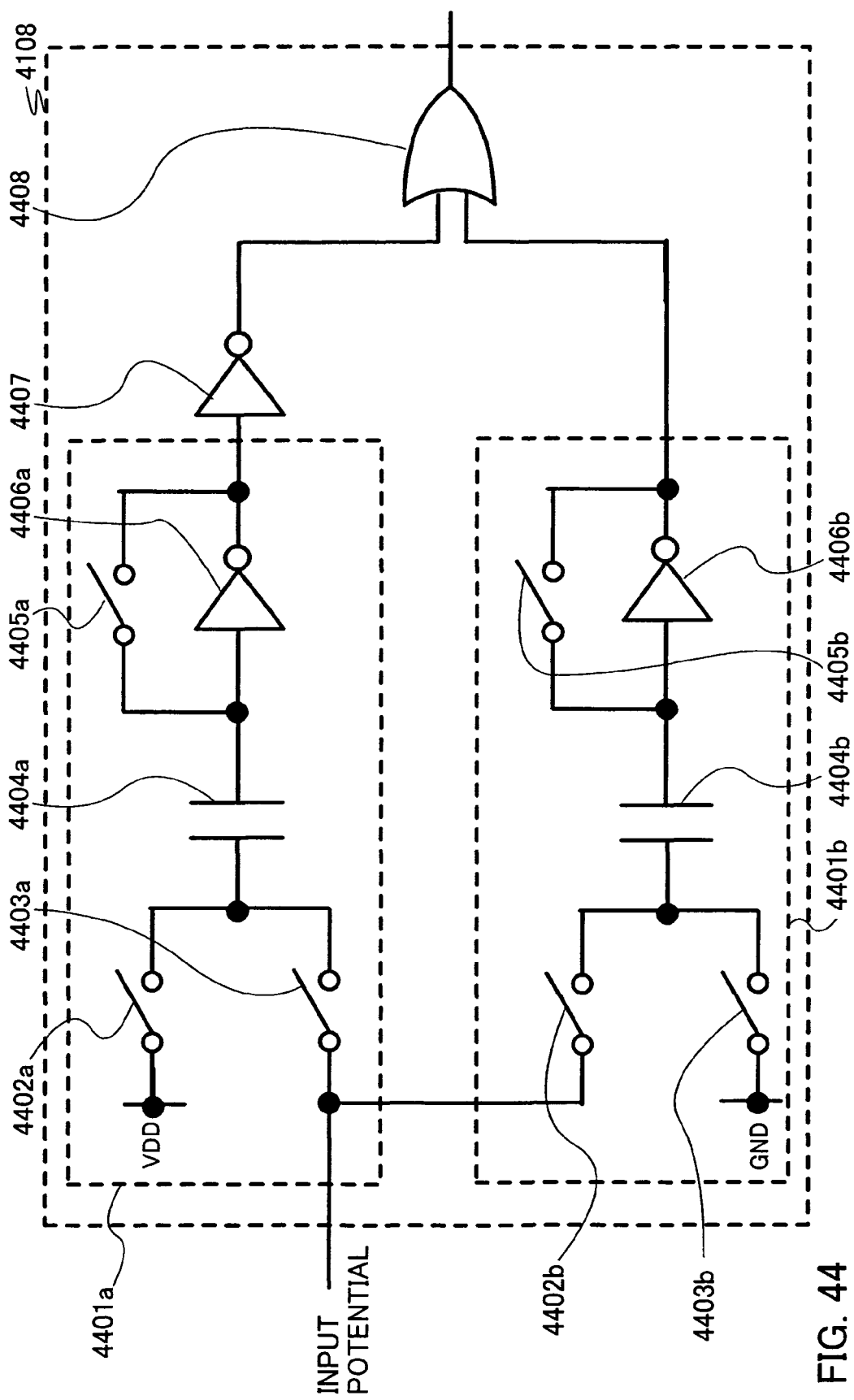
FIG. 44 is a diagram showing a potential detecting circuit which can be applied to the invention.

A configuration and an operation of the potential detecting circuit 4108 shown in FIG. 44 are briefly described.

A chopper inverter comparator 4401a includes switches 4402a and 4403a, a capacitor 4404a, a switch 4405a and an inverter 4406a. A chopper inverter comparator 4401b includes switches 4402b and 4403b, a capacitor 4404b, a switch 4405b and an inverter 4406b. An output terminal of the chopper inverter comparator 4401a is connected to an input terminal of an inverter 4407 while an output terminal of the inverter 4407 is connected to one input terminal of an OR gate 4408. An output terminal of the chopper inverter comparator 4401b is connected to the other input terminal of the OR gate.

When inputting a comparison potential to the chopper inverter comparators 4401a and 4401b (that is, in the case of sampling), the switches 4402a and 4405a, and the switches 4402b and 4405b are turned on. At this time, input terminals and output terminals of the inverters 4406a and 4406b are short-circuited, therefore, an offset cancellation is performed. The capacitor 4404a holds a potential difference (VDD−Va) between a comparison input potential VDD and a potential (Va) on an input side (and output side) of the inverter 4406a which is performed the offset cancellation. The capacitor 4404b holds a potential difference (GND−Vb) between a comparison input potential GND and a potential (Vb) on an input side of the inverter 4406b which is performed the offset cancellation. During a detection period of an input potential, the switches 4402a and 4405a of the chopper inverter comparator 4401a, and the switches 4402b and 4405b of the chopper inverter comparator 4401b are turned off. Then, the switches 4403a and 4403b are turned on.

Then, when the input potential changes, the potentials on the input side of the inverters 4406a and 4406b change while the capacitor 4404a maintains a potential difference (VDD−Va) and the capacitor 4404b maintains a potential difference (GND−Vb).

In this state, when a potential (VDD+α) which is higher than VDD is inputted as the input potential, a potential on the high potential side increases by α while the capacitor 4404a maintains a potential difference (VDD−Va). Thus, a potential on the low potential side of the capacitor 4404a increases by α as well, thereby the potential thereof becomes Va+α. Accordingly, an H-level signal is inputted to the inverter 4406a and an L-level signal is outputted. The level of the signal is inverted by the inverter 4407, thus an H-level signal is inputted to the OR gate 4408. That is to say, an H-level signal is outputted from the OR gate 4408. On the other hand, when a potential (GND−β) which is lower than GND is inputted as the input potential, a potential on the low potential side decreases by β while the capacitor 4404b maintains a potential difference (GND−Vb). Thus, a potential on the high potential side decreases by β as well, thereby the potential becomes Vb−B. Accordingly, an L-level signal is inputted to the inverter 4406b and an H-level signal is outputted. This signal is inputted to the OR gate 4408, thereby an H-level signal is outputted.

It is to be noted that when the input potential is between GND and VDD, the potential on the input side of the inverter 4406a does not increase higher than Va, therefore, an H-level signal is not inputted to the inverter 4406a. In other words, an H-level signal is not inputted to the OR gate 4408. Further, the input potential of the inverter 4406b does not decrease lower than Vb either, therefore, an L-level signal is not inputted to the inverter 4406b. In other words, an H-level signal is not inputted to the OR gate 4408. Accordingly, an H-level signal is not outputted from the OR gate when the input potential is between GND and VDD.

Accordingly, when the potential of the wiring 4110 becomes outside the normal range, this potential is detected by the potential detecting circuit 4108, thereby the switch 4109 is turned on. Then, a current is supplied from the voltage follower 4203, thereby the potential of the wiring 4110 can turn back within the normal range rapidly.

Embodiment Mode 5

In this embodiment mode, configurations and operations of a display device, a signal driver circuit and the like are described. The current source circuit described in Embodiment Modes 1 and 2 can be applied to a portion of the signal driver circuit and a pixel.

Figure 15:
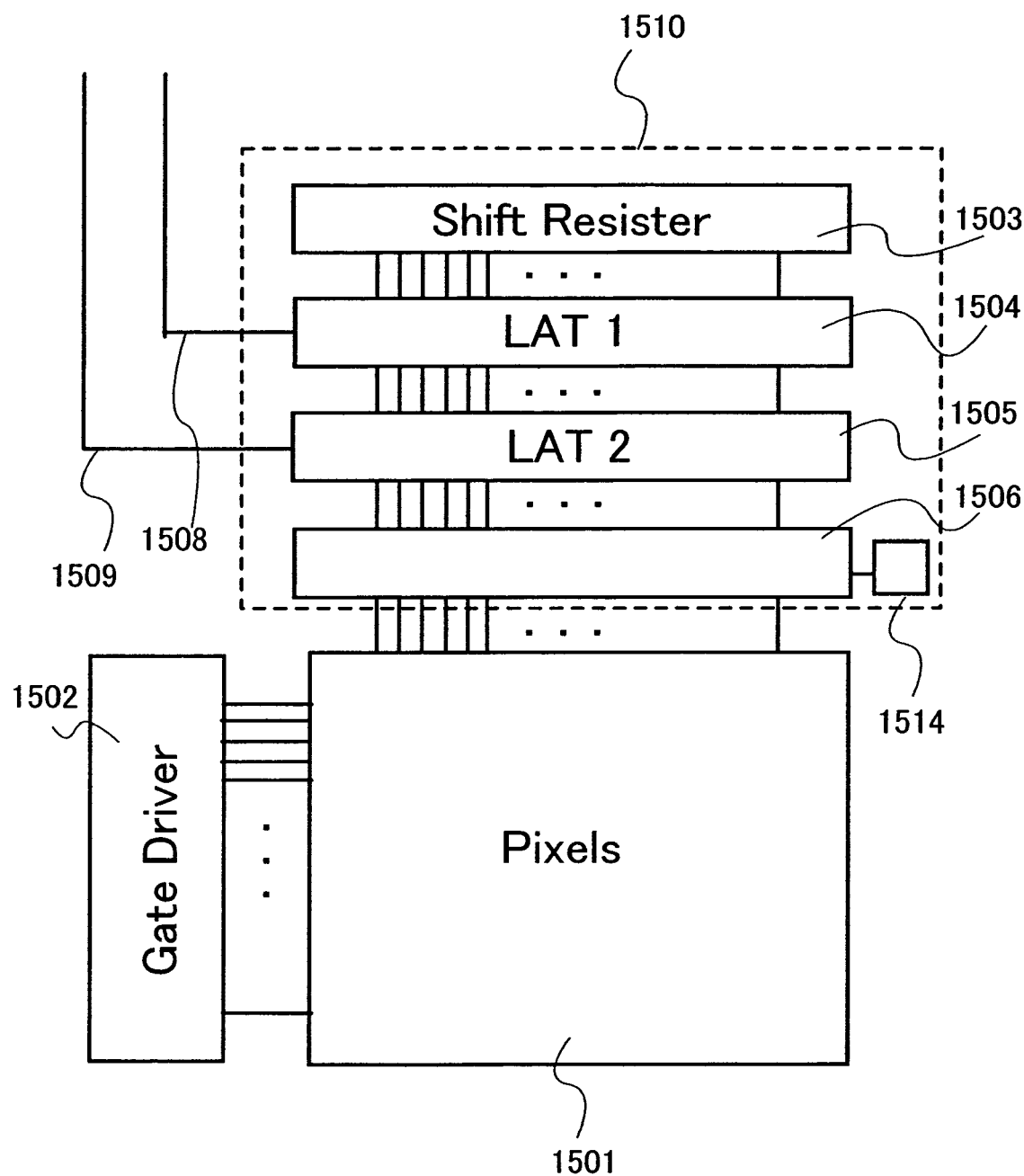
FIG. 15 is a diagram showing a configuration of the display device of the invention.

A display device shown in FIG. 15 includes a pixel arrangement 1501, a gate driver circuit (Gate Driver) 1502, and a signal driver circuit 1510. The gate driver circuit 1502 sequentially outputs selection signals to the pixel arrangement 1501. The signal driver circuit 1510 sequentially outputs video signals to the pixel arrangement 1501. In the pixel arrangement 1501, an image is displayed by controlling the state of light according to the video signals. The video signals inputted from the signal driver circuit 1510 to the pixel arrangement 1501 are often current. That is, a display element and an element which controls the display element provided in each pixel changes their states according to the video signals (current) inputted from the signal driver circuit 1510. As an example of the display element provided in a pixel, an EL element, an element used for FED (Field Emission Display) and the like are used.

It is to be noted that a plurality of the gate driver circuits 1502 and the signal driver circuits 1510 may be provided as well.

The signal driver circuit 1510 can be divided into a plurality of portions. For example, it can be divided into a shift register 1503, a first latch circuit (LAT1) 1504, a second latch circuit (LAT2) 1505, and a digital/analog converter circuit 1506. The digital/analog converter circuit 1506 has a function to convert voltage into current and may have a function to provide a gamma correction as well. That is to say, the digital/analog converter circuit 1506 has a circuit for outputting a current (video signals) to the pixels, that is a current source circuit to which the invention can be applied.

The pixels include display elements such as an EL element. A current source circuit for outputting a current (video signals) to the display elements is also included, to which the invention can be applied.

The operation of the signal driver circuit 1510 is briefly described. The shift register 1503 is formed by using a plurality of columns of flip-flop (FF) circuits and the like and inputted with a clock signal (S-CLK), a start pulse (SP), and a clock inverting signal (S-CLKb). Sampling pulses are outputted in accordance with the timing of these signals.

The sampling pulses outputted from the shift register 1503 are inputted to the first latch circuit (LAT1) 1504. The first latch circuit (LAT1) 1504 is inputted with video signals from a video signal line 1508 and holds video signals in each column in accordance with the timing at which the sampling pulses are inputted. It is to be noted that the video signals have digital values when the digital/analog converter circuit 1506 is provided. The video signals in this stage are often voltage.

In the case where the first latch circuit 1504 and the second latch circuit 1505 can hold analog values, the digital/analog converter circuit 1506 can be often omitted. In that case, the video signals are often current. In the case where data outputted to the pixels 1501 have binary values, that are digital values, the digital/analog converter circuit 1506 can be often omitted.

When video signals are held to the last column in the first latch circuit (LAT1) 1504, latch pulses are inputted from a latch control line 1509 during a horizontal flyback period, thereby the video signals held in the first latch circuit (LAT1) 1504 are transferred to the second latch circuit (LAT2) 1505 all at once. After that, the video signals held in the second latch circuit (LAT2) 1505 are inputted to the digital/analog converter circuit 1506 one row at a time. The signals outputted from the digital/analog converter circuit 1506 are inputted to the pixels 1501.

When the video signals held in the second latch circuit (LAT2) 1505 are inputted to the digital/analog converter circuit 1506 and inputted to the pixels 1501, sampling pulses are outputted in the shift register 1503 again. That is, two operations are performed at the same time. Accordingly, a line sequential operation can be performed. This operation is repeated after that.

In the case where the current source circuit included in the digital/analog converter circuit 1506 performs a set operation and an output operation, a circuit for supplying a current to the current source circuit is required. In that case, a reference current source circuit 1514 is provided.

As already described above, a transistor used in the invention may be any type of transistor and may be formed on any substrates. Therefore, the circuit of FIG. 15 may be entirely formed over any substrates such as a glass substrate, a plastic substrate, a single crystalline substrate, and an SOI substrate. Otherwise, a portion of the circuit of FIG. 15 may be formed on a certain substrate while the other part thereof is formed on another substrate. In other words, the circuit of FIG. 15 is not required to be entirely formed over the same substrate. For example, the pixel arrangement 1501 and the gate driver circuit 1502 may be formed by using TFTs over a glass substrate while the signal driver circuit 1510 (or a portion thereof) may be formed over a single crystalline substrate and an IC chip formed thereof may be disposed over a glass substrate by COG (Chip On Glass). Alternatively, the IC chip may be connected to a glass substrate by using TAB (Tape Auto Bonding) or a printed substrate.

It is to be noted that the configuration of the signal driver circuit and the like is not limited to FIG. 15.

Figure 16:
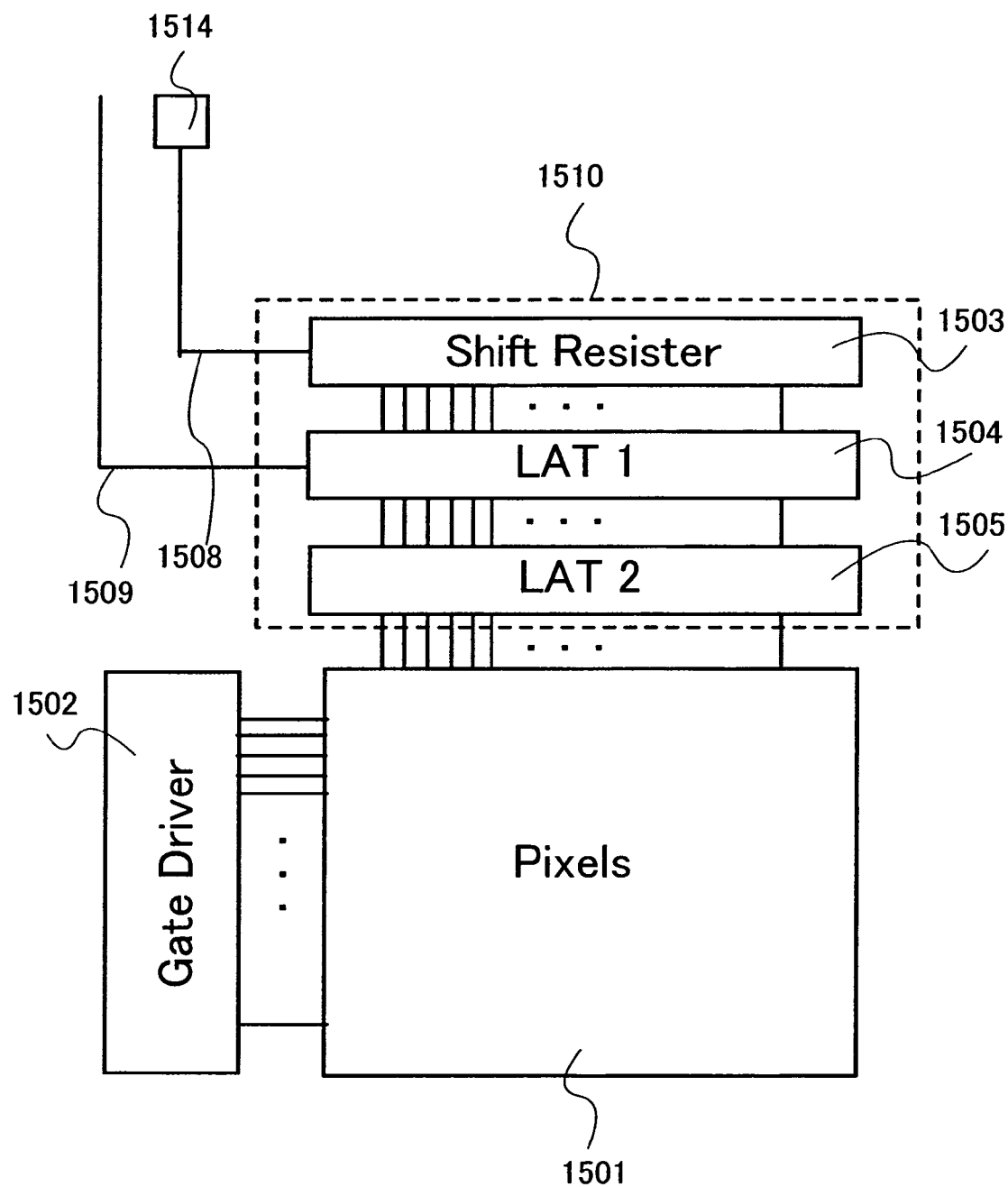
FIG. 16 is a diagram showing a configuration of the display device of the invention.

In the case where the first latch circuit 1504 and the second latch circuit 1505 can store analog values, for example, the video signals (analog current) may be inputted from the reference current source circuit 1514 to the first latch circuit (LAT1) 1504. In FIG. 16, the second latch circuit 1505 is not provided in some cases. In such cases, more current source circuits are often provided for the first latch circuit 1504.

The invention can be applied to the aforementioned current source circuit.

Embodiment Mode 6

In this embodiment mode, a configuration in which the invention is applied to a portion of the signal driver circuit is described.

A configuration in which the current source circuit of FIG. 13A described in Embodiment Mode 1 is applied to a portion of the signal driver circuit is described with reference to FIG. 17. It is to be noted that one current source circuit is shown among the current source circuits for supplying a current to the signal line of each column in FIG. 17.

Figure 17:
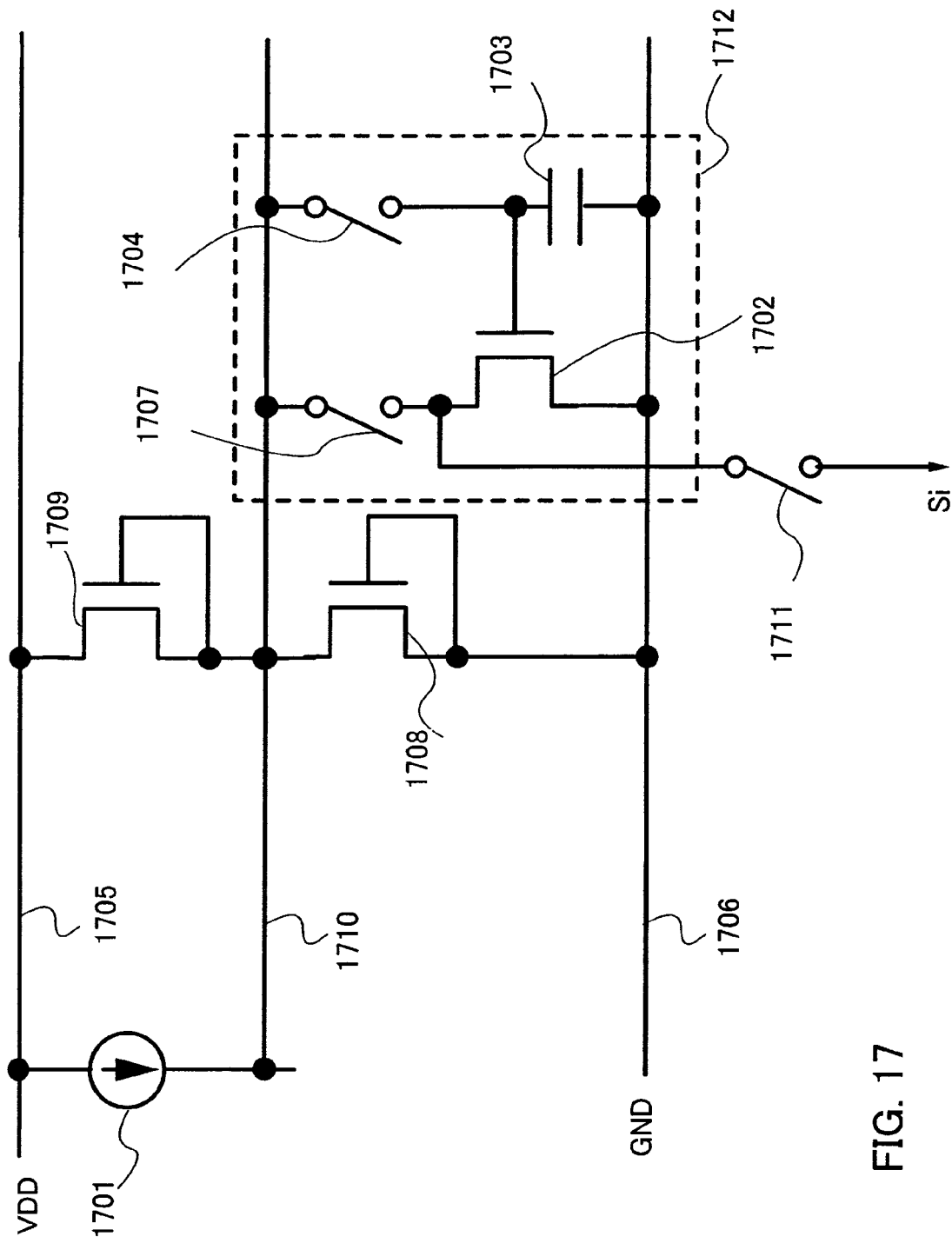
FIG. 17 is a diagram showing a portion of a configuration of the signal driver circuit of the invention.

The reference current source 101 in FIG. 13A corresponds to a reference current source 1701, the wiring 110 corresponds to a wiring 1710, the switch 104 corresponds to a switch 1704, the transistor 102 corresponds to a transistor 1702, the capacitor 103 corresponds to a capacitor 1703, and the transistors 1301 and 1302 correspond to transistors 1708 and 1709 in FIG. 17 respectively. The wirings 105 and 113 shown in FIG. 13 correspond to a wiring 1705 in FIG. 17. Similarly, the wirings 112, 106, and 107 shown in FIG. 13 correspond to a wiring 1706 in FIG. 17. A switch 1707 is connected between the wiring 1710 and a drain terminal of the transistor 1702. The drain terminal of the transistor 1702 is connected to one terminal of a switch 1711 while the other terminal of the switch 1711 is connected to a signal line Si. A dotted line denotes a current source circuit 1712 having a configuration for supplying a current to a signal line of each column.

Here, an operation of the signal driver circuit in FIG. 17 is briefly described. First, a signal from the reference current source 1701 is written to the current source circuit 1712 for supplying a signal current to the signal line Si. At this time, the switches 1704 and 1707 are tuned on while the switch 1711 is turned off. A current from the reference current source 1701 is supplied to the capacitor 1703 and a gate potential of the transistor 1702 is accumulated therein. When the potential of the wiring 1710 becomes outside the normal range due to noise and the like in this writing, the transistor 1708 or 1709 operates so as to turn the potential back within the normal range. That is to say, in the case where the potential of the wiring 1710 becomes higher than that of the wiring 1705, a current flows from the wiring 1710 to the wiring 1705 by the operation of the transistor 1709. In other words, the transistor 1709 functions to decrease the potential of the wiring 1710 to the potential of the wiring 1705. In the case where the potential of the wiring 1710 becomes lower than that of the wiring 1706, a current is supplied from the wiring 1706 to the wiring 1710 by the operation of the transistor 1708. In other words, the transistor 1708 functions to increase the potential of the wiring 1710. In this manner, delay of writing operation due to noise can be reduced.

When supplying a signal current from the current source circuit 1712 to the signal line Si after the writing to the current source circuit 1712 is completed, the switches 1704 and 1707 are turned off so that the capacitor 1703 holds a gate-source voltage of the transistor 1702. By turning on the switch 1711, a signal current can be supplied to the signal line Si.

It is to be noted that the current source circuit used for the signal driver circuit is not limited to the configuration of FIG. 17, but various configurations described in Embodiment Modes 1 and 2 can be used in combination.

Hereinafter described are various arrangement examples of a current supply transistor and a current discharge transistor in the signal driver circuit to which the invention is applied.

Figure 18:
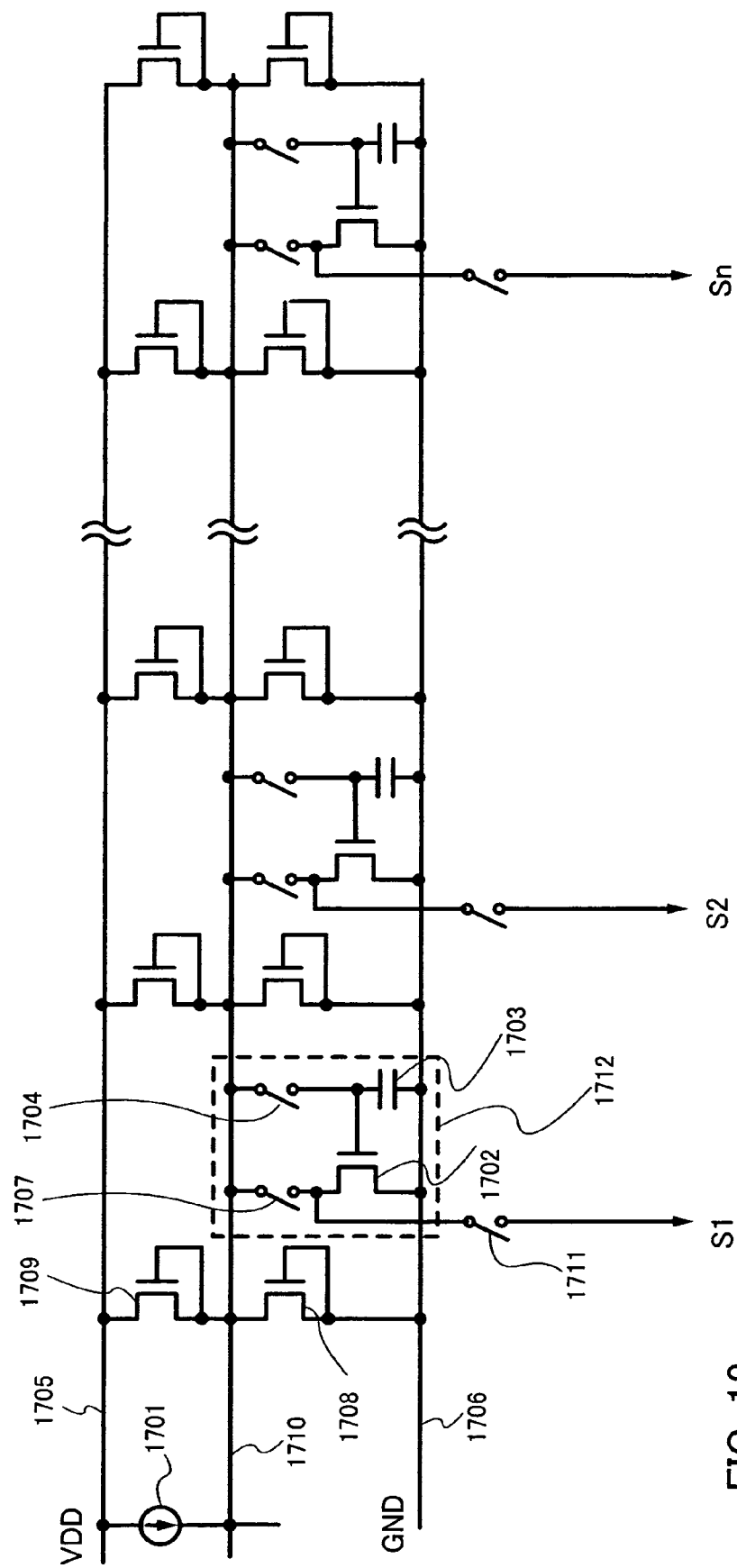
FIG. 18 is a diagram showing a portion of a configuration of the signal driver circuit of the invention.

FIG. 18 shows a configuration in which a pair of the current supply transistor 1708 and the current discharge transistor 1709 shown in FIG. 17 are disposed through the current source circuit 1712 of each column. With this arrangement, the operation for turning the potential which is outside the normal range due to noise back within the normal range can be performed at approximately equal speed in each column. In particular, in the case where wiring resistance and intersection capacitance of the wiring 1710 are large, the potential of the wiring 1710 does not easily turn back normal at a position far from the transistor 1708 or 1709. Accordingly, by disposing a number of the transistors 1708 and 1709 on the wiring 1710 with a certain space, the potential of the wiring 1710 can turn back easily within the normal range at any position of the wiring 1710.

Figure 19:
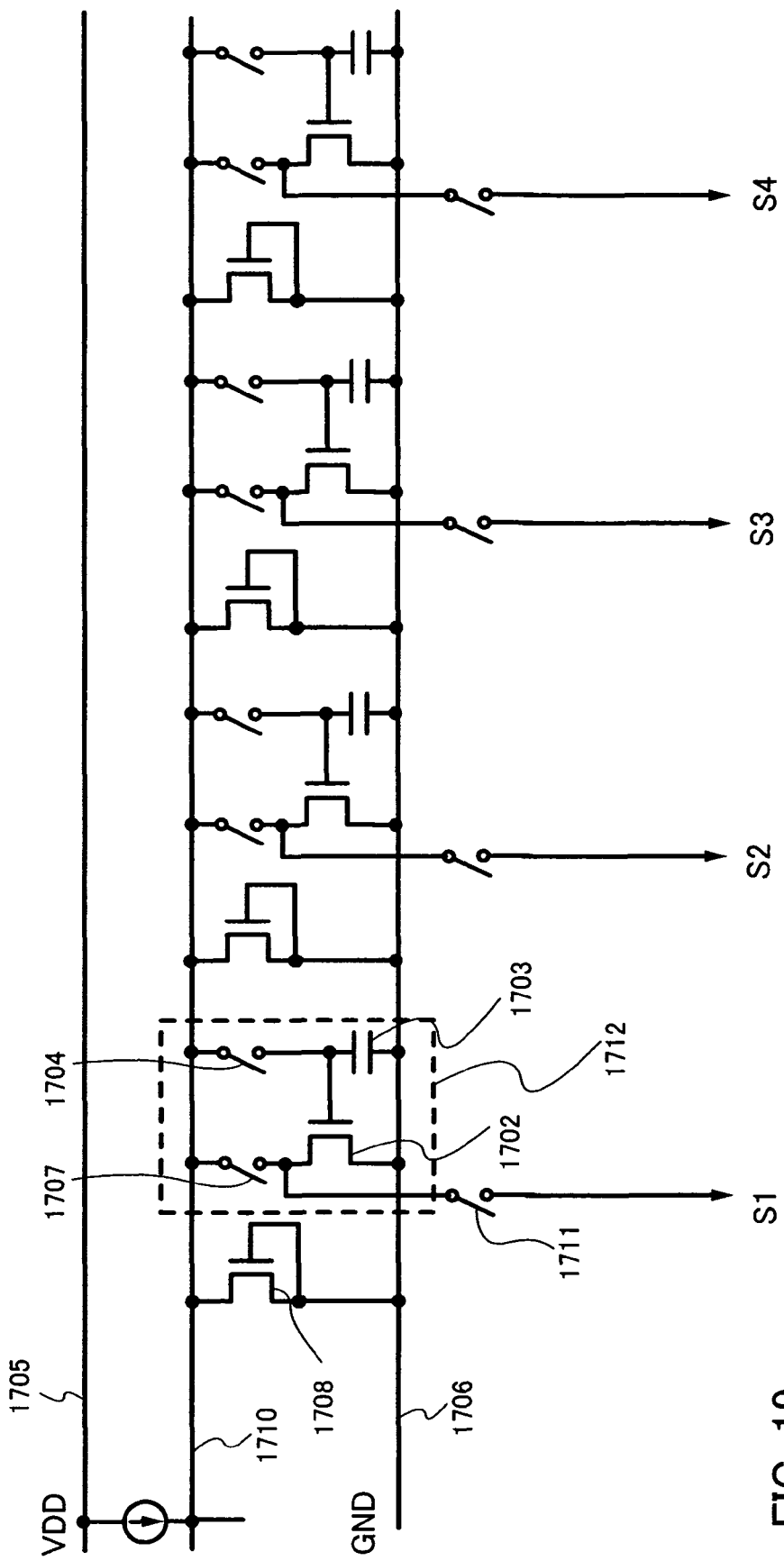
FIG. 19 is a diagram showing a portion of a configuration of the signal driver circuit of the invention.

When the current supply transistor 1708 and the current discharge transistor 1709 cannot be disposed in each column, only the current supply transistor 1708 may be disposed in each column of the current source circuit 1712 as shown in FIG. 19. This configuration is also effective when the potential of the wiring 1710 does not turn back within the normal range easily as described in Embodiment Mode 1. In other words, this configuration is effective as the potential of the wiring 1710 can turn back within the normal range when it becomes lower than the normal range. That is to say, by disposing the effective transistors 1708 widely on the wiring 1710, the potential of the wiring 1710 can turn back within the normal range easily.

Figure 20:
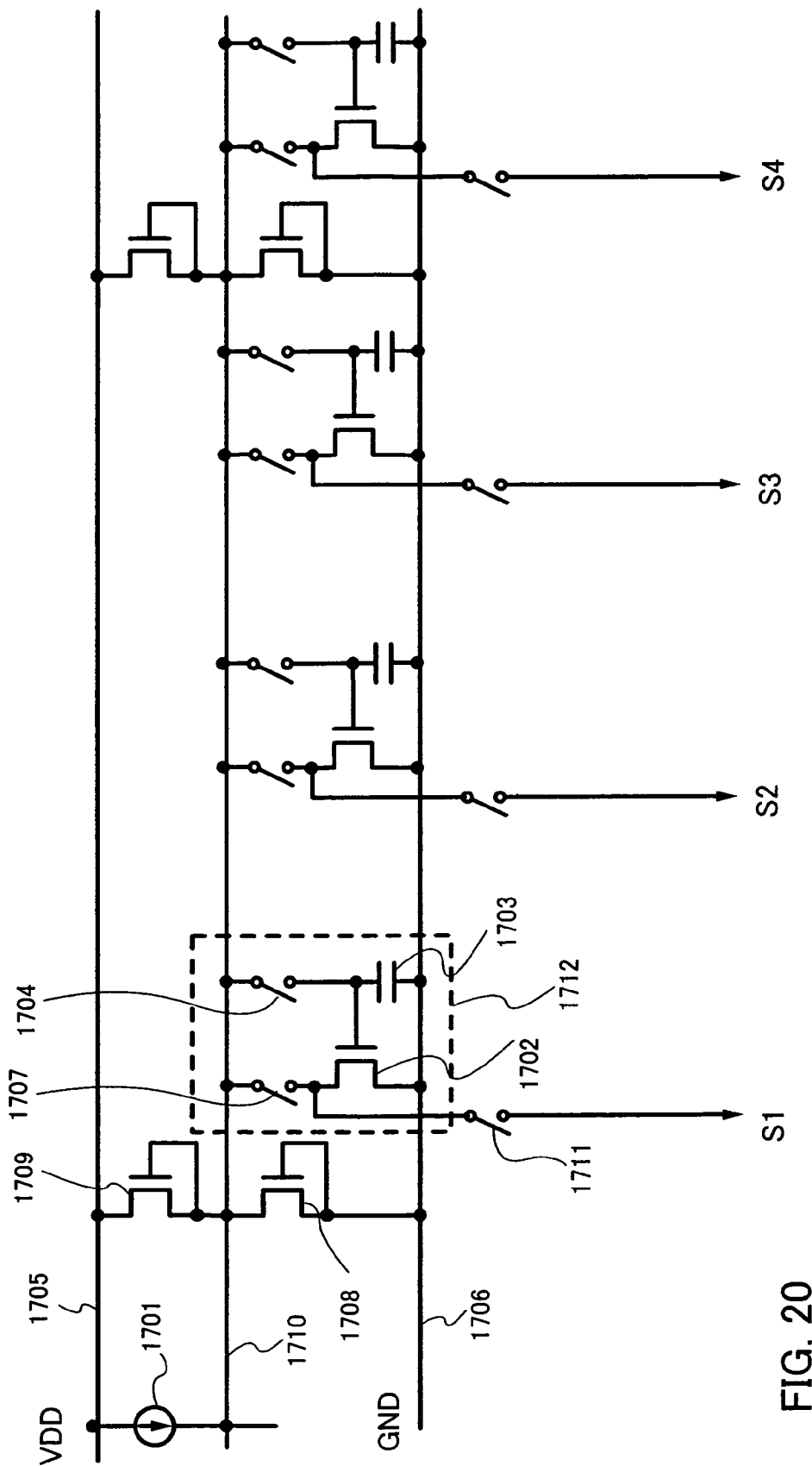
FIG. 20 is a diagram showing a portion of a configuration of the signal driver circuit of the invention.

As shown in FIG. 20, a pair of the current supply transistor 1708 and the current discharge transistor 1709 may be disposed for a plurality of columns of the current source circuits 1712. In FIG. 20, one current supply transistor 1708 and the current discharge transistor 1709 are disposed for three columns of the current source circuits 1712, however, the number of columns can be appropriately selected.

Figure 21:
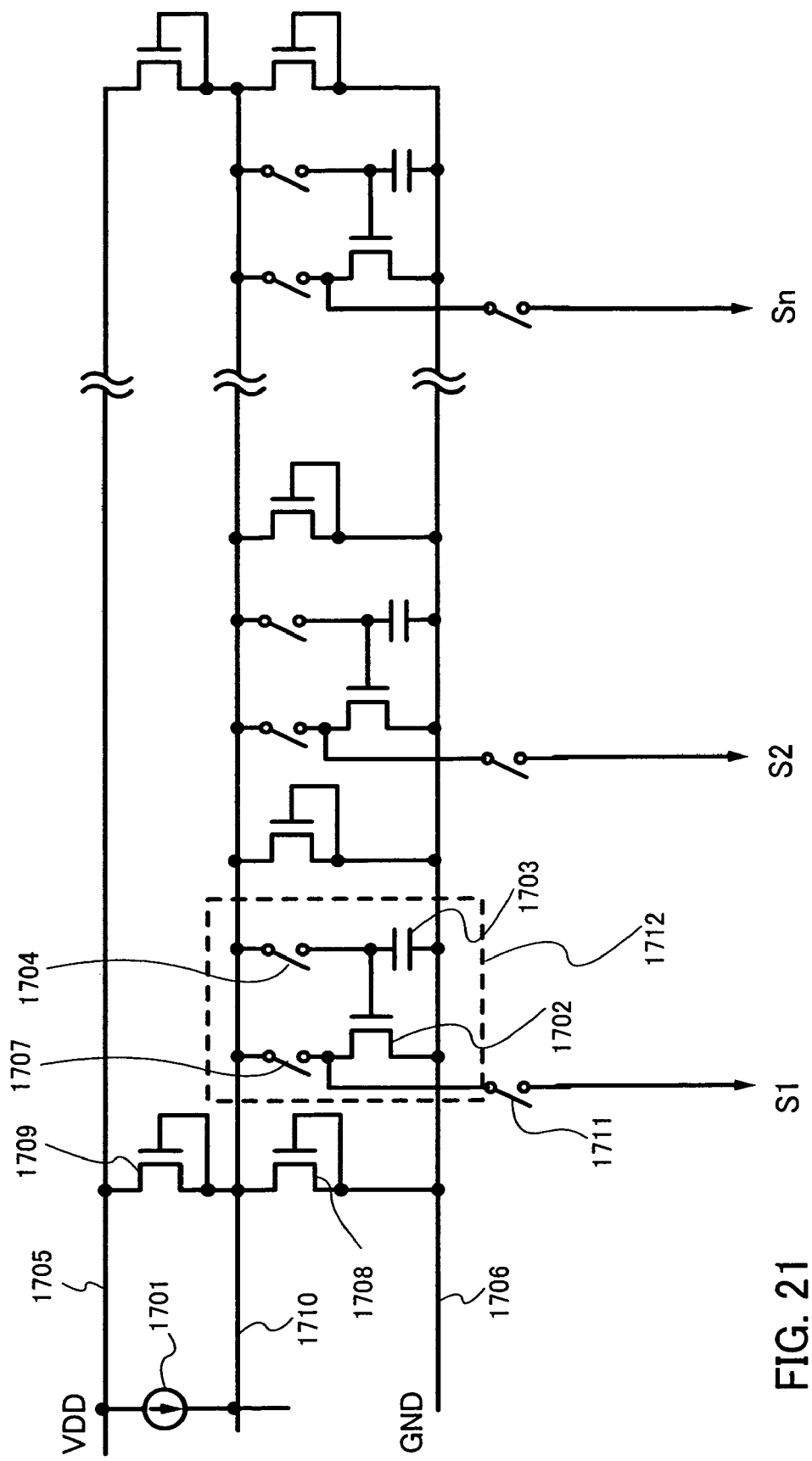
FIG. 21 is a diagram showing a portion of a configuration of the signal driver circuit of the invention.

As shown in FIG. 21, only the current supply transistor 1708 may be disposed in each column of the current source circuit 1712 and then the current supply transistor 1708 and the current discharge transistor 1709 may be disposed at both ends. In this manner, when the potential of the wiring 1710 becomes lower than the normal range, the potential can turn back within the normal range, thereby a current drive capacity can be increased.

The current drive capacities of the transistors 1708 and 1709 can be set by adjusting the ratio of the channel length L and the channel width W thereof. In order to increase the current drive capacity, W/L is to be increased while the current drive capacity is reduced by decreasing W/L.

Accordingly, the effect of the invention can further be enhanced by appropriately setting the number of the current supply transistors 1708 and the current discharge transistors 1709 to be disposed and the ratio of W/L. It is preferable that W/L be set as large as possible because a current does not flow almost at all through the transistors 1708 and 1709 in the normal operation. However, off currents of the transistors 1708 and 1709 should not be too large. In order to reduce the off currents, the transistors 1708 and 1709 may have multi-gate structures, otherwise a low concentration impurity region (also referred to as LDD) may be provided.

For example, it is preferable to dispose the current supply transistor 1708 and the current discharge transistor 1709 for each current source circuit. Alternatively, it is preferable to dispose only a transistor which flows current when the potential of the wiring in the current source circuit does not easily turn back within the normal range, for each current source circuit. Otherwise, the transistor may be disposed for each source signal line. In specific, it is preferable to dispose 100 to 2000 current supply transistors 1708 and the current discharge transistors 1709. More preferably, 300 to 1000 current supply transistors 1708 and the current discharge transistors 1709 are disposed, and most preferably 600 to 700 current supply transistors 1708 and the current discharge transistors 1709 are disposed. More specifically, the current supply transistor 1708 and the current discharge transistor 1709 are provided in accordance with the resolution of a display device. For example, when the resolution is VGA (video Graphics Array), horizontal dots×vertical dots=640×480. A source signal line of RGB is provided per dot, therefore, 1920 current supply transistors 1708 and the current discharge transistors 1709 are provided. Similarly, 528 current supply transistors 1708 and the current discharge transistors 1709 are provided in the case of QCIF (Quarter Common Intermediate Format), 3072 current supply transistors 1708 and the current discharge transistors 1709 are provided in the case of XGA (eXtended Graphics Array), and 4800 current supply transistors 1708 and the current discharge transistors 1709 are provided in the case of UXGA (Ultra XGA), or more transistors are provided. However, 1920 current source circuits are not always connected to one wiring in VGA. For example, about 640, 320, or 160 current source circuits are connected in some cases. In such a case, 640 current supply transistors 1708 and the current discharge transistors 1709 or an integer fraction thereof (320, 160, 80 and the like) may be disposed. Accordingly, 176, 88, 44, or 42 transistors in the case of QCIF, 1024, 512, 256, or 128 transistors in the case of XGA, and 1600, 800, 400, or 200 transistors in the case of UXGA may be disposed. Alternatively, it is preferable to dispose only a transistor which supplies a current when the potential of the wiring in the current source circuit does not turn back within the normal range easily.

For example, it is preferable that W be 5 to 800 μm, more preferably 50 to 800 μm, and L be 5 to 20 μm, more preferably 5 to 10 μm. It is preferable that W/L be 1 to 150, more preferably 50 to 150.

It is to be noted that only one current source circuit is shown in each column of signal lines in FIGS. 17 to 21, however, by providing a plurality of current source circuits in parallel and operating them alternately, an output operation can be performed at the same time as a set operation and the like. The invention is not limited to this configuration and various configurations described in Embodiment Modes 1 and 2 can be applied as well.

Figure 22:
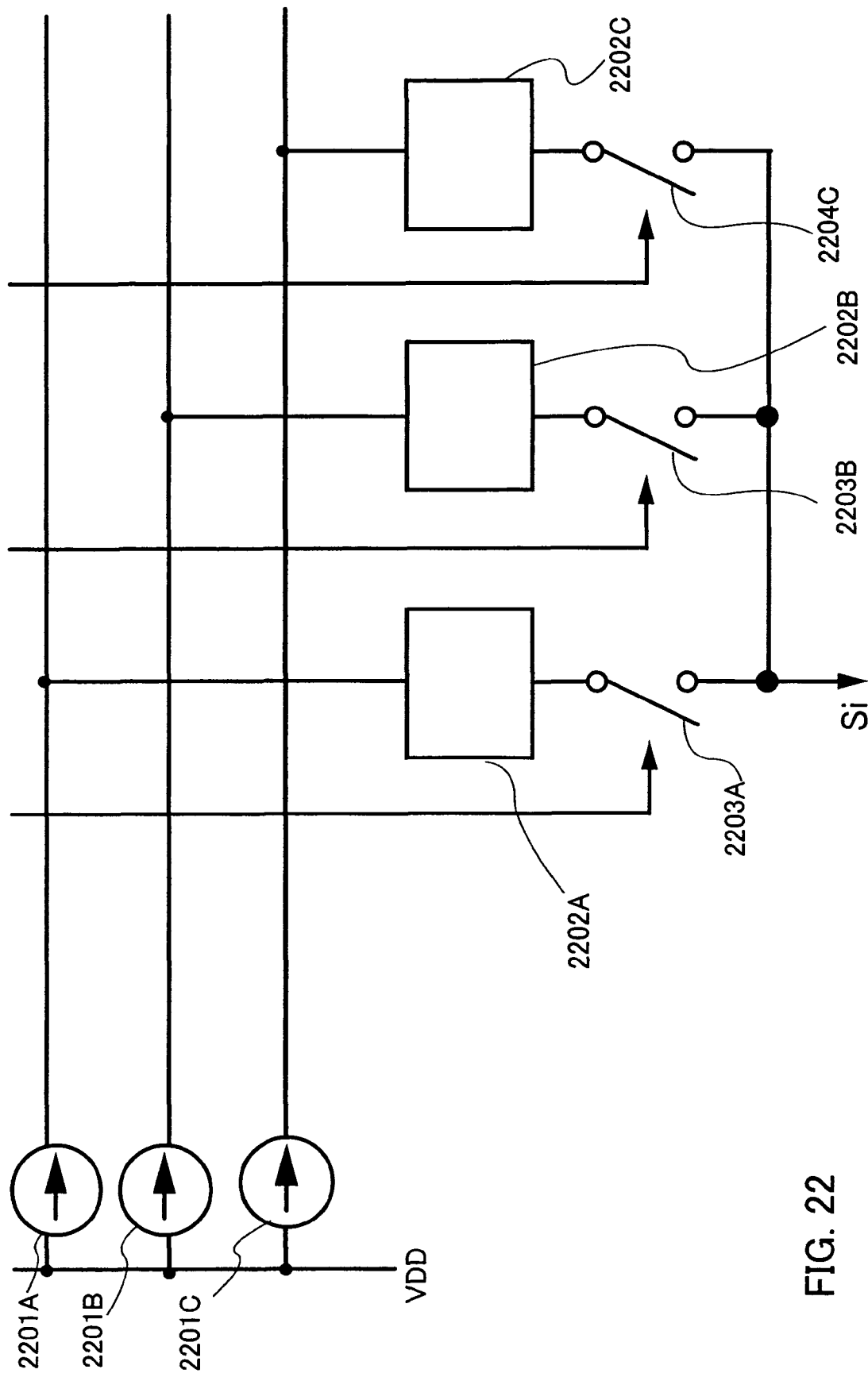
FIG. 22 is a diagram showing a portion of a configuration of the signal driver circuit of the invention.

Moreover, when outputting an analog current to a load (pixel), a configuration as shown in FIG. 22 is employed. FIG. 22 shows the case of 3-bit for simplification. That is to say, reference current source circuits 2201A, 2201B, and 2201C are provided and the size of current in the set operation is Ic, 2×Ic, and 4×Ic respectively. Current source circuits 2202A, 2202B, and 2202C are connected respectively. The current source circuit 1712 shown in FIG. 17 can be applied to the current source circuits 2202A, 2202B, and 2202C. Therefore, the current source circuits 2202A, 2202B, and 2202C output currents the size of Ic, 2×Ic, and 4×Ic respectively. Switches 2203A, 2203B, and 2203C are connected in series with each current source circuit. These switches are controlled by a video signal outputted from the second latch circuit (LAT2) 1505 shown in FIG. 15. The sum of current outputted from each current source circuit and the switches is outputted to a load, which is a pixel. By operating as described above, an analog current is outputted as a video signal to the pixel.

It is to be noted that operations such as a set operation and an output operation can be performed at the same time by arranging the current source circuits in parallel similarly to FIG. 17.

FIG. 22 shows the case of 3-bit for simplification, however, the invention is not limited to this. The number of bits can be easily changed with a similar configuration.

Embodiment Mode 7

In this embodiment mode, the case of applying the invention to a current source circuit provided between a source signal driver circuit and pixels.

Figure 23:
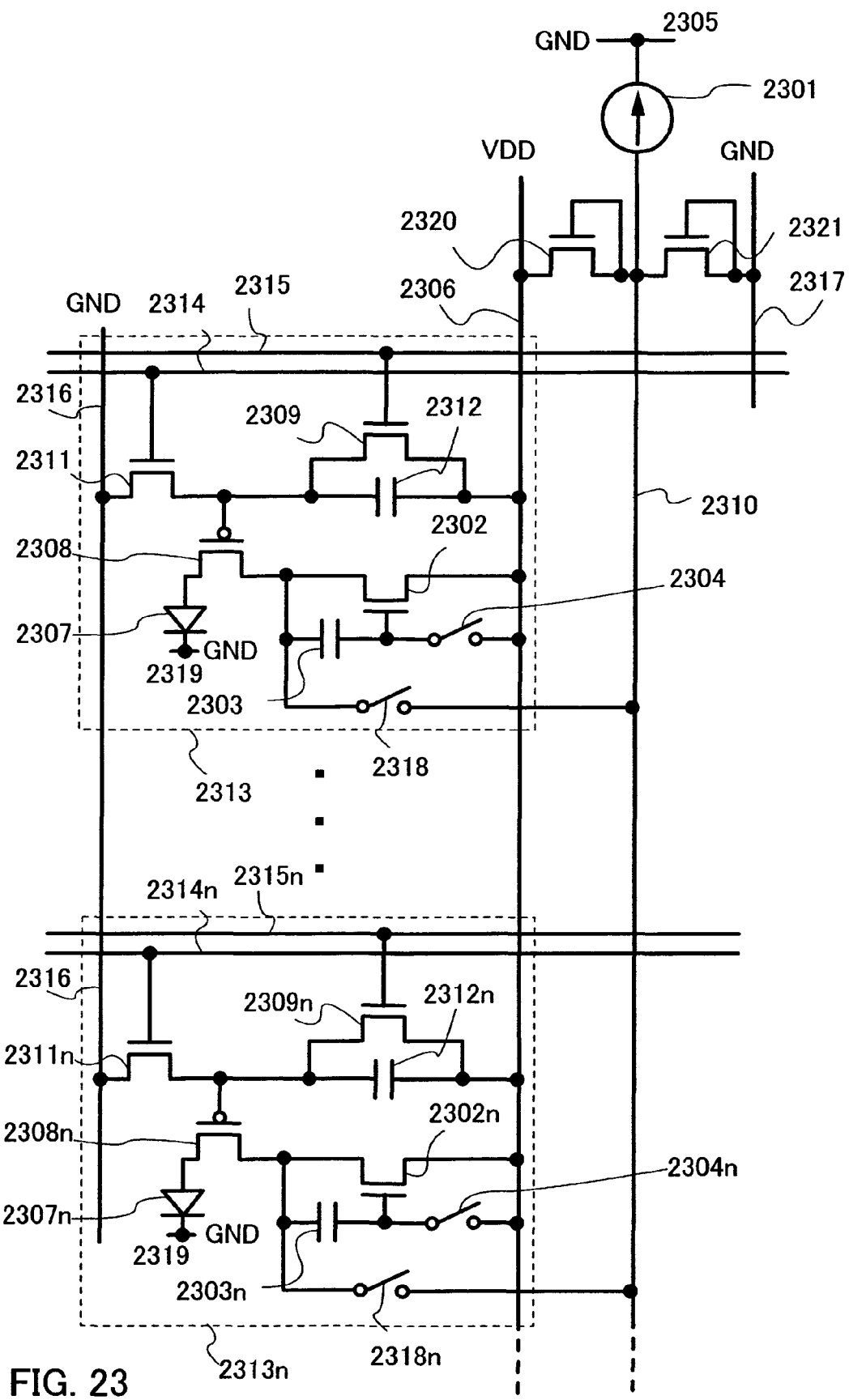
FIG. 23 is a diagram showing the pixel configuration of the invention.

A first pixel configuration to which the invention is applied is shown in FIG. 23.

A pixel 2313 includes a first gate signal line 2314, a second gate signal line 2315, a current supply line 2310, a source signal line 2316, a power source line 2306, a switching TFT 2311, an erasing TFT 2309, a first capacitor 2312, a driving TFT 2308, a current source TFT 2302, a second capacitor 2303, a first switch 2304, a second switch 2318, a light emitting element 2307, and a reference current source 2301.

A pixel configuration and an operation of this embodiment mode are briefly described. In this configuration, an image is displayed when the current source TFT 2302 supplies a current to the light emitting element 2307. A current from the reference current source 2301 is supplied to the current source TFT 2302 and the second capacitor 2303, thereby an appropriate gate-source voltage of the current source TFT 2302 is set. Accordingly, a current supplied by the second current source TFT 2302 is set. When the second gate signal line 2315 is selected, the switching transistor 2311 is turned on, thereby a digital image signal (normally a voltage value) is inputted from the source signal line 2316 to the first capacitor 2312. It is to be noted that the first capacitor 2312 can be omitted by using gate capacitance of a transistor and the like. By using the digital image signal which is stored, the switching transistor 2311 is turned on/off. That is to say, the switching transistor 2311 controls whether to flow a current supplied by the current source TFT 2302 to the light emitting element 2307. Accordingly, an image can be displayed.

In this embodiment mode, one side of the current supply line 2310 is connected to the wiring 2305 through the reference current source 2301 while the other side thereof is connected to one terminal of the second capacitor 2303, a source terminal of the current source TFT 2302, and a source terminal of the driving TFT 2308 through the second switch 2318. The current supply line 2310 is connected to a current supply TFT 2321 and a current discharge TFT 2320. These TFTs are diode-connected TFTs. A gate terminal of the current supply TFT 2321 is short-circuited with a source terminal thereof and connected to a wiring 2317. A drain terminal of the current discharge TFT 2320 is connected to the wiring 2306. The other terminal of the capacitor 2303 is connected to the power source line 2306 through a gate terminal of the current source TFT 2302 and the first switch 2304. A drain terminal of the power source TFT 2302 is connected to the power source line 2306. A drain terminal of the driving TFT 2308 is connected to an anode of the light emitting element 2307 while a cathode of the light emitting element 2307 is connected to a wiring 2319. A source terminal of the switching TFT 2311 is connected to the source signal line 2316 while a gate terminal thereof is connected to the first gate signal line 2314. A drain terminal of the switching TFT 2311 is connected to a gate terminal of the driving TFT, a source terminal of the erasing TFT 2309, and one terminal of the first capacitor 2312. The other terminal of the first capacitor 2312 and a drain terminal of the erasing TFT 2309 are connected to the power source line 2306 while a gate terminal of the erasing TFT 2309 is connected to the second gate wiring 2315.

Here, an operation of writing a signal current of the reference current source 2301 to the pixel 2301 is described.

When writing a signal current of the reference current source 2301 to the current source circuit of the pixel 2301, the first switch 2304 and the second switch 2318 are turned on. Then, a current flows to the capacitor 2303 from the wiring 2306, thereby a gate potential of the current source TFT 2302 is accumulated therein. When a steady state is obtained, the writing is completed. Then, the switches 2304 and 2318 are turned off. In this manner, a gate-source voltage of the current source TFT 2302 is held in the capacitor 2303. In other words, a gate-source voltage for supplying a signal current to the current source TFT 2302 is held.

When writing a signal current of the reference current source 2301 to the current source TFT 2302 in pixels sequentially in rows, it is assumed that an output operation (light emission operation) starts in a first row when a signal current is being written to a pixel 2313n of an n-th row. When the output operation is not performed, the first gate signal line 2314 has a GND potential. When the output operation is performed, a VDD signal is inputted to the first gate signal line 2314, thereby the switching TFT 2311 is turned on and a current starts flowing from the second power source line 2306 to the first capacitor 2312. A gate potential of the driving TFT 2308 is accumulated in the first capacitor 2312 and the driving TFT 2308 is turned on when the gate potential exceeds a threshold voltage of the driving TFT 2308, thereby a signal current is supplied from the current source TFT 2302 to the light emitting element 2307 to emit light.

Here, when a VDD signal is inputted to the first gate signal line 2314, the current supply line 2310 which intersects the wiring 2314 and parasitic capacitance is formed thereby as shown in FIG. 6 has a higher potential than VDD.

When the potential of the current supply line 2310 becomes higher than VDD, a terminal of the current source TFT 2302n which is connected to the power source line 2306 corresponds to a source terminal thereof. At this time, a signal current is being written to the current source circuit of the pixel 2313n, therefore, a gate terminal of the current source TFT 2302n and the terminal thereof connected to the power source line 2306 are short-circuited by a first switch 2304n. Accordingly, when the potential of the current supply line 2310 becomes higher than VDD, the current source TFT 2302n is turned off and a current does not flow. As the current source 2301, an N-channel transistor is often used as described in Embodiment Mode 1 with reference to FIG. 9. Then, a potential of a source terminal of an N-channel transistor is fixed constant at a potential of the wiring 2305, therefore, a current flowing reversely to the signal current does not increase much when the potential of the current supply line 2310 connected to a drain terminal side of the N-channel transistor becomes high.

Accordingly, it takes time to turn the potential of the current supply line 2310 within the normal range. Then, the writing operation to the n-th row is terminated and a writing operation to the next row starts before completion of the writing operation to the n-th row (before the steady state is obtained). Consequently, desired data cannot be written to a second capacitor 2303n in which a gate potential of a desired current source TFT 2302n is accumulated, therefore an accurate display cannot be performed.

However, when the current discharge TFT 2320 is connected to the current supply line 2310 as shown in FIG. 23, the potential of the current supply line 2310 can turn back within the normal range rapidly. When the potential of the current supply line 2310 becomes higher than VDD which is a potential of the power source line 2306, the current discharge TFT 2320 which is diode-connected has a terminal connected to the power source line 2306 side as a source terminal, thereby a potential difference generates between the gate and source thereof. Accordingly, a current flows to the current discharge TFT 2320 and an operation to turn the potential of the current supply line 2310 back within the normal range, thus a delay of writing a signal current can be reduced.

In an actual circuit, a plurality of wirings intersect each other and a signal changes between VDD and GND in a complex manner. Accordingly, the potential of the current supply line 2310 becomes lower or higher than the normal range.

When the potential of the current supply line 2310 becomes lower than GND, a current flows to the second capacitor 2303 and the current source TFT 2302 is turned on. When a current flows through the current source TFT 2302, the potential of the current supply line 2310 can turn back within the normal range. In the case of using an N-channel transistor for the reference current source 2301, a terminal thereof connected to the current supply line 2310 corresponds to a source terminal. Therefore, a gate-source voltage becomes higher than the case where a signal current flows, which results in supplying a larger current through the N-channel transistor reversely to the signal current. Moreover, a terminal of the current supply TFT 2321 which is connected to the current supply line 2310 side corresponds to a source terminal. Thus, a current flows through the current supply TFT 2321, which operates to turn the potential of the current supply line 2310 back to GND rapidly.

Therefore, when the potential of the current supply line 2310 becomes lower than GND, it turns back within the normal range rather easily than the case where it becomes higher than VDD.

Therefore, in FIG. 23, it is preferable that a current drive capacity of the current discharge TFT 2320 which operates to turn the potential of the current supply line 2310 back within the normal range when it becomes higher than the normal range be larger than that of the current supply TFT 2321. It is needless to say that only the current discharge TFT 2320 may be provided without providing the current supply TFT 2321. Otherwise, a pair of the current supply TFT 2321 and the current discharge TFT 2320, or only the current discharge TFT 2320 may be provided at the top and bottom of the pixel portion. Moreover, a pair or one of the current supply TFT 2321 and the current discharge TFT 2320 may be provided in each pixel. In this pixel configuration, only the current discharge TFT 2320 may be provided.

Figure 28:
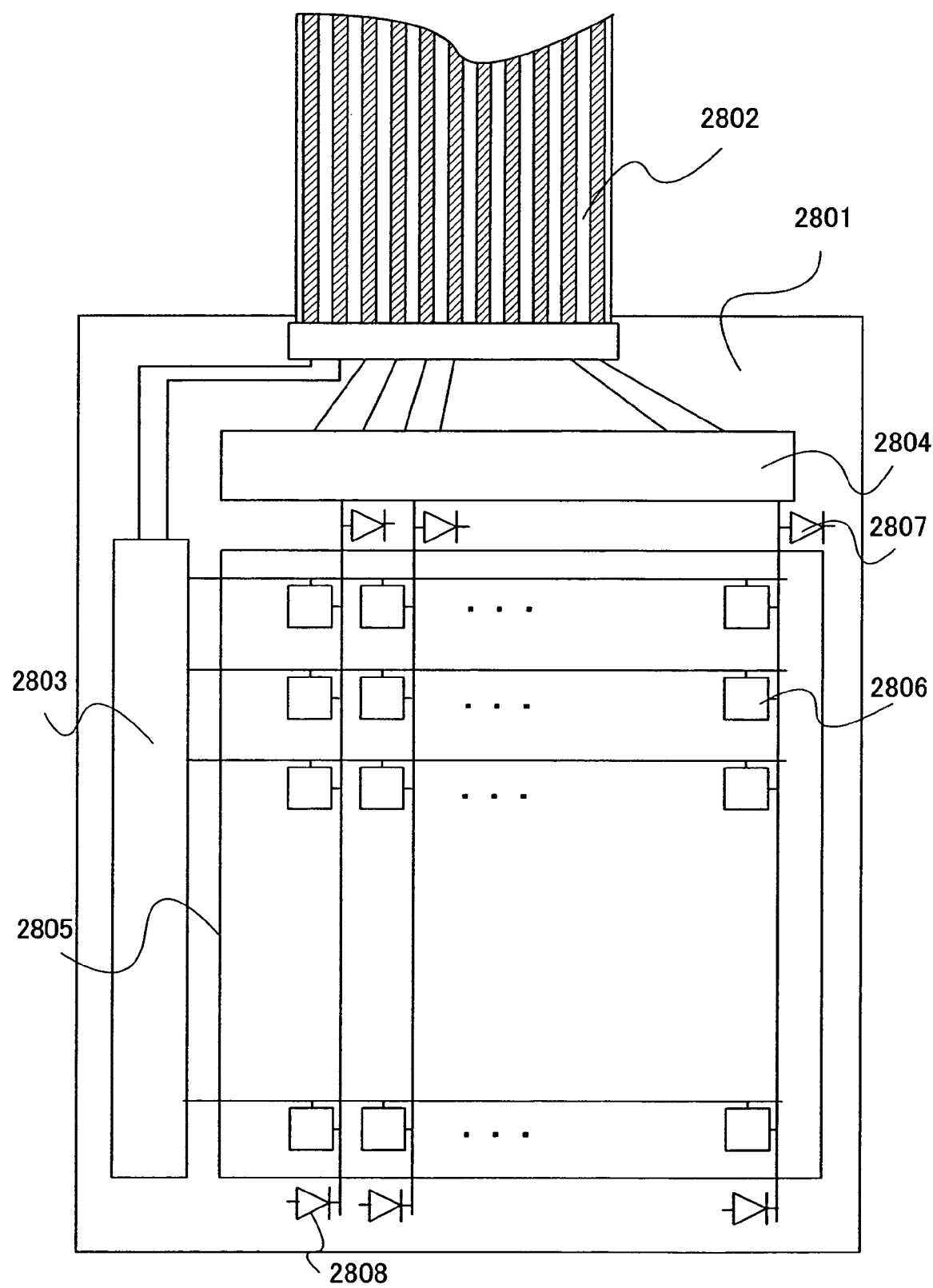
FIG. 28 is a schematic diagram of the display device of the invention.

Here, FIG. 28 shows a schematic diagram of a display device having a plurality of pixels. The display device includes a substrate 2801, an FPC (Flexible Printed Circuit) 2802, a gate driver circuit 2803, a source signal driver circuit 2804, a pixel portion 2805, a pixel 2806, and rectifying elements 2807 and 2808. It is to be noted that the pixel 2806 is arranged in matrix corresponding to a gate line and a source signal line.

As shown in FIG. 28, a current discharge transistor 2807 is provided at the top of the pixel portion for each source signal line while a current supply transistor 2808 is provided at the bottom thereof. It is needless to say that the opposite structure may be employed or a pair of the current discharge transistor 2807 and the current supply transistor 2808 may be provided at the top and bottom of the pixel portion. It is to be noted that the current discharge transistor 2807 and the current supply transistor 2808 can be formed by diode-connected transistors.

However, other rectifying elements may be used instead of the current discharge transistor 2807 and the current supply transistor 2808.

It is to be noted that a diode-connected TFT is used in this embodiment as the current supply TFT and the current discharge TFT, however, anything can be used as long as it has a rectifying effect, such as a PN or PIN junction diode, a Schottky diode, and a carbon nanotube diode.

Figure 24:
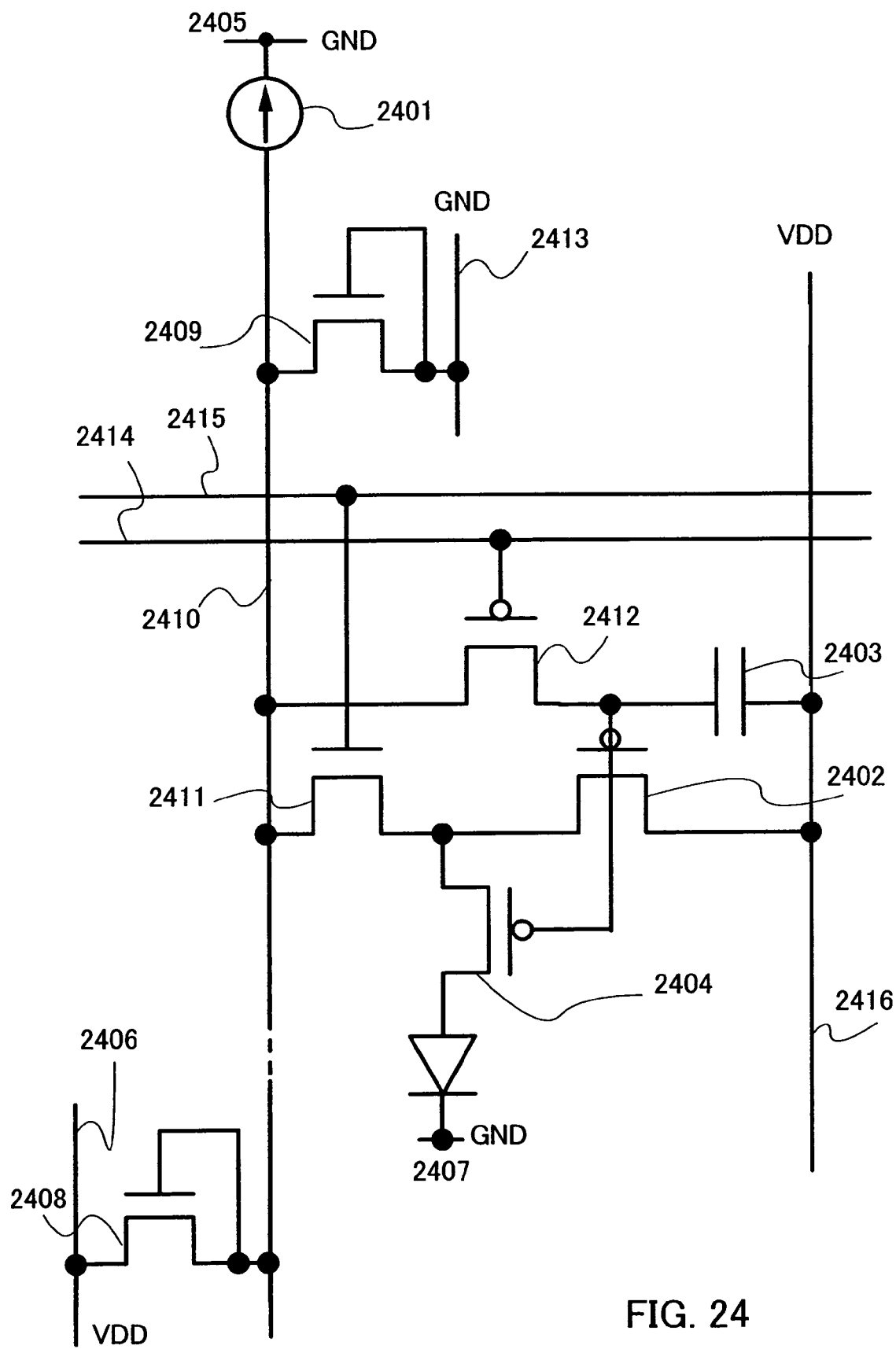
FIG. 24 is a diagram showing the pixel configuration of the invention.

A second pixel configuration to which the invention is applied is shown in FIG. 24.

A pixel shown in FIG. 24 includes a source signal line 2410, a first gate signal line 2414, a second gate signal line 2415, a power source line 2416, a switching TFT 2411, a holding TFT 2412, a driving TFT 2404, a current source TFT 2402, a capacitor 2403, a light emitting element 2417, and a video signal input current source 2401.

A gate terminal of the switching TFT 2411 is connected to the second gate signal line 2415, a source terminal thereof is connected to the source signal line 2410, and a drain terminal thereof is connected to a source terminal of the driving TFT 2404 and a drain terminal of the current source TFT 2402. A gate terminal of the holding TFT 2412 is connected to the first gate signal line 2414, a source terminal thereof is connected to a gate terminal of the driving TFT 2411 and a gate terminal of the current source TFT 2402, and a drain terminal thereof is connected to the source signal line 2410. A drain terminal of a driving TFT 2424 is connected to an anode of a light emitting element 2417. A source terminal of the current source TFT 2402 is connected to the power source line 2416. The capacitor 2403 is connected between the gate terminal and the source terminal of the current source TFT 2402 and holds a gate-source voltage of the current source TFT 2402. The power source line 2416 and a cathode of the light emitting element 2417 are inputted with predetermined potentials respectively and have a potential difference therebetween.

Here, a detailed driving method is disclosed in Japanese Patent Laid-Open No. 2004-054200, therefore, the description thereon is omitted here.

When writing a signal current to the pixel, a gate potential of the current source TFT 2402 is accumulated in the capacitor 2403 by writing by the video signal input current source 2401. At this time, noise may occur in the source signal line 2410 which may cause a potential of the source signal line 2410 to be outside the normal range. In the case where the potential of the source signal line 2410 becomes lower than the normal range, a gate-source voltage of the current source TFT 2402 increases, thereby a current is supplied from the wiring 2416. Therefore, the potential of the source signal line 2410 turns back within the normal range rather easily.

On the other hand, in the case where the potential of the source signal line 2410 becomes higher than the normal range, an N-channel transistor which operates in the saturation region is often used for the video signal input current source 2401 connected to a low potential side as described in Embodiment Mode 2. Accordingly, a current flowing to the N-channel transistor does not change much when the potential of the source signal line 2410 becomes high, as described above. It is to be noted that the switching TFT 2411 and the holding TFT 2412 are on in the writing operation. Therefore, a terminal of the current source TFT 2402 which is connected to the switching TFT 2411 corresponds to a source terminal, thus a gate terminal and the source terminal thereof are short-circuited. The current source TFT 2402 is turned off and a current does not flow. A current flows to the capacitor 2403 reversely to the signal current. Accordingly, the writing operation is delayed even after the potential of the source signal line 2410 turns back within the normal range.

However, in the configuration of FIG. 24, a current supply TFT 2409 which supplies a current when the potential of the source signal line 2410 becomes lower than that of a wiring 2413 and a current discharge TFT 2408 which discharges a current when the potential of the source signal line 2410 becomes higher than that of a wiring 2406 are connected to the current supply line 2310. Therefore, when the potential of the source signal line 2410 becomes outside the normal range, a current flows through the current supply TFT 2409 and the current discharge TFT 2408, thereby the potential can turn back within the normal range rapidly. It is preferable to increase the current drive capacity of the current discharge TFT 2408. The current drive capacity is preferably increased overall the circuit such that the number of TFTs may be increased as well as W/L of a TFT is increased. The invention is not limited to the configuration of FIG. 24, but the current discharge TFT 2408 may be provided at the top of the pixel while the current supply TFT 2409 is provided at the bottom thereof, a pair of the current discharge TFT 2408 and the current supply TFT 2409 may be provided at the top and bottom of the pixel, or only the current discharge TFT 2408 may be provided as well. Further, a pair or one of the current supply TFT 2409 and the current discharge TFT 2408 may be provided for each pixel. In this pixel configuration, only the current discharge TFT 2408 may be provided as well.

A third configuration is described with reference to FIG. 25.

Figure 25:
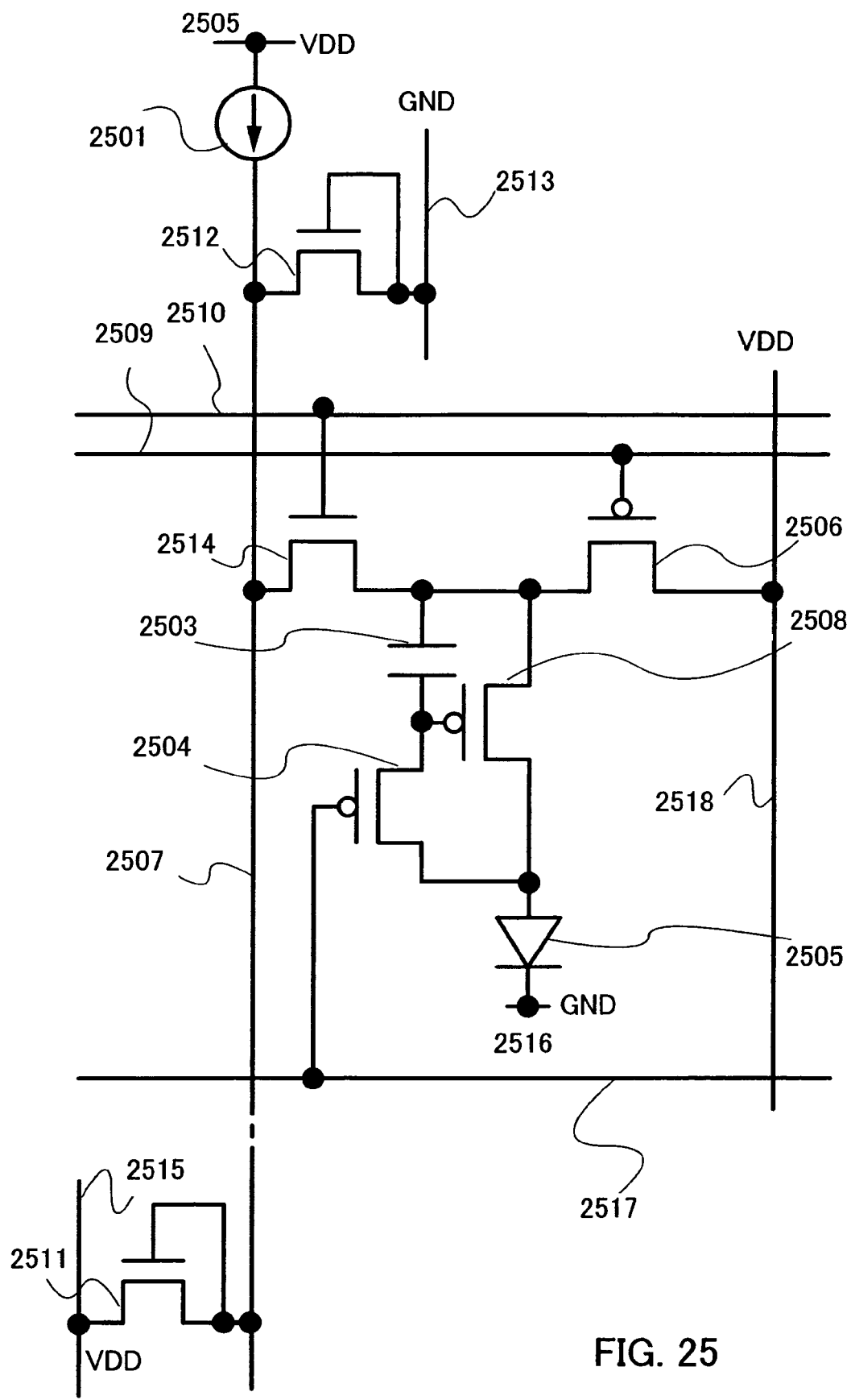
FIG. 25 is a diagram showing the pixel configuration of the invention.

FIG. 25 shows a third configuration example. A pixel in FIG. 25 includes a source signal line 2507, a first gate signal line 2510, a second gate signal line 2509, a third gate signal line 2517, a power source line 2518, a first TFT 2514, a second TFT 2506, a third TFT 2502, a fourth TFT 2504, a capacitor 2503, a light emitting element 2505, and a video signal input current source 2501.

A gate terminal of the first TFT 2514 is connected to the first gate signal line 2510, a source terminal thereof is connected to the source signal line 2507, and a drain terminal thereof is connected to a drain terminal of the second TFT 2506 and a source terminal of the third TFT 2502. A gate terminal of the third TFT 2502 is connected to the second gate signal line 2509 and a source terminal thereof is connected to the power source line 2518. A gate terminal of the fourth TFT 2504 is connected to the third gate signal line 2517, a source terminal thereof is connected to a gate terminal of the third TFT 2502, and a drain terminal thereof is connected to the drain terminal of the third TFT 2508 and an anode of the light emitting element 2505. The capacitor 2503 is connected between the gate terminal and the source terminal of the third TFT 2508 and holds a gate-source voltage of the third TFT 2508. The power source line 2518 and a cathode of the light emitting element 2505 are inputted with predetermined potentials respectively and have a potential difference therebetween.

Here, a detailed driving method is disclosed in Japanese Patent Laid-Open No. 2004-054200, therefore, the description thereon is omitted here.

When writing a signal current to the pixel, a gate potential of the third TFT 2502 is accumulated in the capacitor 2503 by writing by the video signal input current source 2501. At this time, noise may occur in the source signal line 2507 which may cause a potential of the source signal line 2507 to be outside the normal range. In the case where the potential of the source signal line 2507 becomes lower than the normal range, a P-channel transistor which operates in the saturation region is often used for the video signal input current source 2501 connected to a high potential side as described in Embodiment Mode 1. Accordingly, a current flowing through the P-channel transistor does not change at this time, as described above. Further, the terminal of the second TFT 2506 which is connected to the power source line 2518 still corresponds to a source terminal, therefore, a current flowing through the second TFT 2506 does not increase much either. As the capacitor 2503 in which the gate potential of the third TFT 2508 is accumulated releases the charge, therefore, the third TFT 2502 is turned off and a current does not flow through the third TFT 2302 either. As the fourth TFT 2504 is on when writing a signal current, a current flows to the capacitor 2503 reversely to the signal current. Accordingly, the writing operation is delayed even after the potential of the source signal line 2407 turns back within the normal range. However, a current supply TFT 2513 is provided in FIG. 25 to which the invention is applied, which can supply a current until the potential can turn back to GND rapidly in the case where the potential of the source signal line 2507 becomes lower than the normal range.

On the other hand, in the case where the potential of the source signal line 2507 becomes higher than the normal range, a current flows to the capacitor 2503 and a gate potential of the current source TFT 2502 is accumulated therein, thus the third TFT 2502 is turned on. Then, a current flows to the third TFT 2502. As a gate-source voltage of the second TFT 2506 increases, a current flowing to the second TFT 2506 increases as well. As a terminal of the P-channel transistor as the video signal input current source, which is connected to the source signal line 2507 corresponds to a source signal line, a gate-source voltage increases, which increases a current flowing to the P-channel transistor. Accordingly, when the potential of the source signal line 2507 becomes higher than the normal range, the potential can turn back within the normal range rather easily than the case where it becomes lower than the normal range. Moreover, as a current discharge TFT 2511 is provided which supplies a current until the potential of the source signal line 2507 turns back to VDD, the potential can turn back within the normal range rapidly.

In the configuration of FIG. 25, a current drive capacity of the current supply TFT 2513 is increased. The current drive capacity is preferably increased overall the circuit such that the number of TFTs may be increased as well as W/L of a TFT is increased. The invention is not limited to the configuration of FIG. 25, but the current discharge TFT 2511 may be provided at the top of the pixel while the current supply TFT 2513 is provided at the bottom thereof, a pair of the current discharge TFT 2511 and the current supply TFT 2513 may be provided at the top and bottom of the pixel, or only the current supply TFT 2513 may be provided as well. Further, a pair or one of the current supply TFT 2513 and the current discharge TFT 2511 may be provided for each pixel. In this pixel configuration, only the current supply TFT 2513 may be provided as well.

A fourth configuration is described with reference to FIG. 26.

Figure 26:
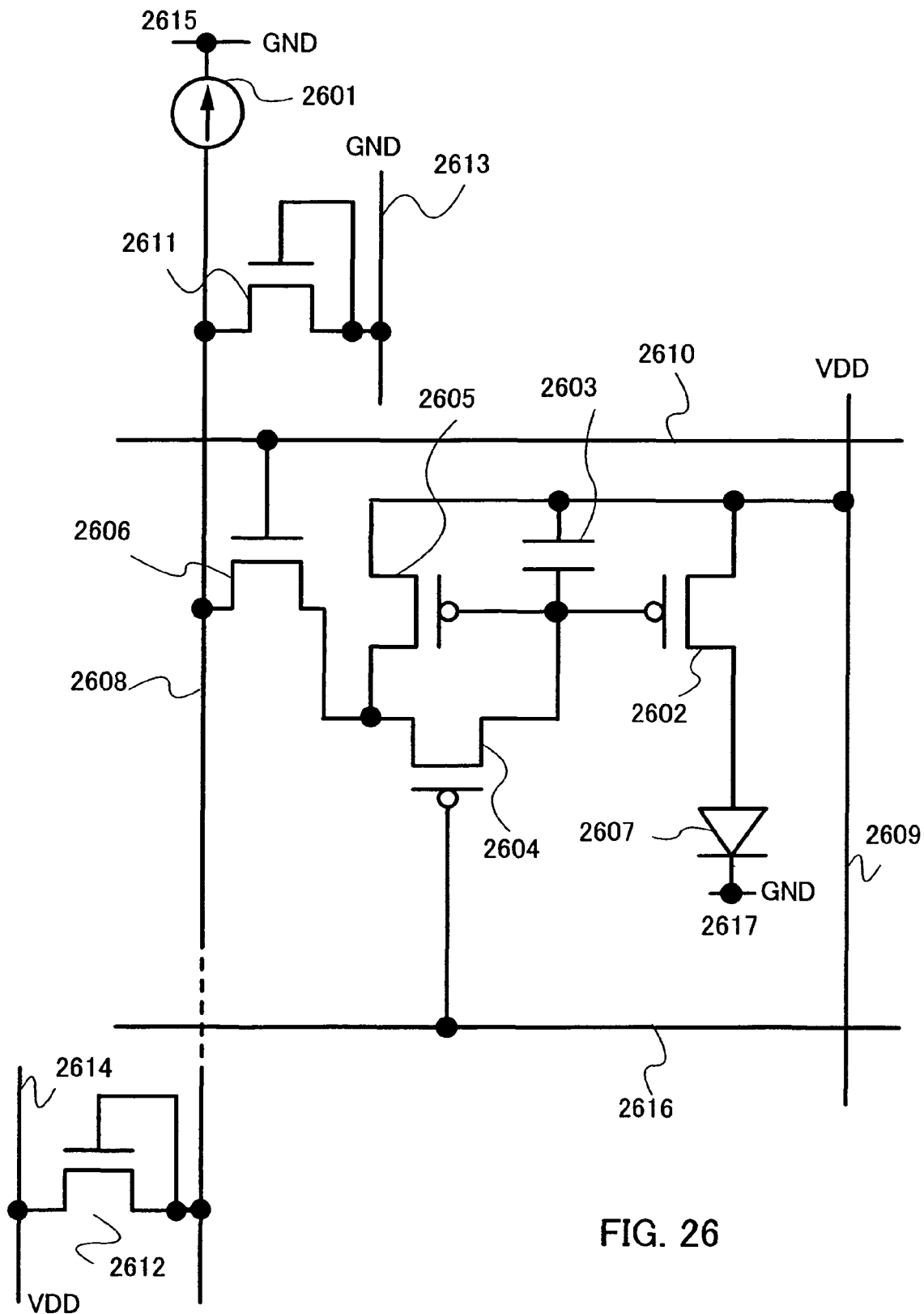
FIG. 26 is a diagram showing the pixel configuration of the invention.

A pixel in FIG. 26 includes a source signal line 2608, a first gate signal line 2610, a second gate signal line 2616, a power source line 2609, a first TFT 12606, a second TFT 2605, a third TFT 2604, a fourth TFT 2602, a capacitor 2603, a light emitting element 2607, and a video signal input current source 2601.

A gate terminal of the first TFT 2606 is connected to the first gate signal line 2610, a source terminal thereof is connected to the source signal line 2608, a drain terminal thereof is connected to a drain terminal of the second TFT 2605 an a drain terminal of the third TFT 2604. A gate terminal of the third TFT 2604 is connected to the second gate signal line 2616, a source terminal thereof is connected to a gate terminal of the second TFT 2605 and a gate terminal of the fourth TFT 2602. Source terminals of the second TFT 2605 and the fourth TFT 2602 are connected to the power source line 2609. A drain terminal of the fourth TFT 2602 is connected to an anode of the light emitting element 2607. The capacitor 2603 is connected to the gate terminals of the second TFT 2605 and the fourth TFT 2602 and between the second TFT 2605 and the source terminal of the fourth TFT 2602, and holds a gate-source voltage of the second TFT 2605 and the fourth TFT 2602. The power source line 2609 and a cathode of the light emitting element 2607 are inputted with predetermined potentials respectively and have a potential difference therebetween.

Here, a detailed driving method is disclosed in Japanese Patent Laid-Open No. 2004-054200, therefore, the description thereon is omitted here.

When writing a signal current to the pixel, gate potentials of the second TFT 2605 and the fourth TFT 2602 are accumulated in the capacitor 2603 by writing by the video signal input current source 2601. First, when the potential of the source signal line 2608 becomes lower than the normal range, a gate potential of the second TFT 2605 becomes lower than the normal range since the gate terminal of the second TFT 2605 is connected to the source signal line 2608 through the first TFT 2606 and the third TFT 2604. As a source terminal of the second TFT 2605 is connected to the power source line 2609, a gate-source voltage of the second TFT 2605 increases, which increases a current flowing from the power source line 2609 to the second TFT 2605. Accordingly, the potential of the source signal line 2608 turns back within the normal range rather easily.

On the other hand, in the case where the potential of the source signal line 2608 becomes higher than the normal range, an N-channel transistor which operates in the saturation region is often used for the video signal input current source 2601 connected to a low potential side as described in Embodiment Mode 2. Accordingly, a current flowing through the N-channel transistor does not change much when the potential of the source signal line 2608 becomes high, as described above. In the writing operation, the first TFT 2606 and the third TFT 2604 are on. The terminal of the second TFT 2605 which is connected to the drain terminal of the first TFT 2606 corresponds to a source terminal, therefore, the gate and source are short-circuited through the third TFT 2604 which functions as a switch. Accordingly, the second TFT 2605 is turned off and a current does not flow. Moreover, a current flows to the capacitor 2603 reversely to the signal current. Accordingly, the writing operation is delayed even after the potential of the source signal line 2608 turns back within the normal range.

However, in the configuration in FIG. 26, a current supply TFT 2611 which supplies a current when the potential of the source signal line 2608 becomes lower than that of a wiring 2613, and a current discharge TFT 2612 which discharges a current when the potential of the source signal line 2608 becomes higher than that of the wiring 2614 are connected to the source signal line 2608. Accordingly, in the case where the potential of the source signal line becomes outside the normal range, a current is supplied to the current supply TFT 2611 and the current discharge TFT 2608, thereby the potential can turn back within the normal range rapidly. It is preferable to increase the current drive capacity of the current discharge TFT 2612. The current drive capacity is preferably increased overall the circuit such that the number of TFTs may be increased as well as W/L of a TFT is increased. The invention is not limited to the configuration of FIG. 26, but the current discharge TFT 2612 may be provided at the top of the pixel while the current supply TFT 2611 is provided at the bottom thereof, a pair of the current discharge TFT 2612 and the current supply TFT 2611 may be provided at the top and bottom of the pixel, or only the current discharge TFT 2612 may be provided as well. Further, a pair or one of the current supply TFT 2611 and the current discharge TFT 2612 may be provided for each pixel. In this pixel configuration, only the current discharge TFT 2612 may be provided as well.

A fifth configuration is described with reference to FIG. 27.

Figure 27:
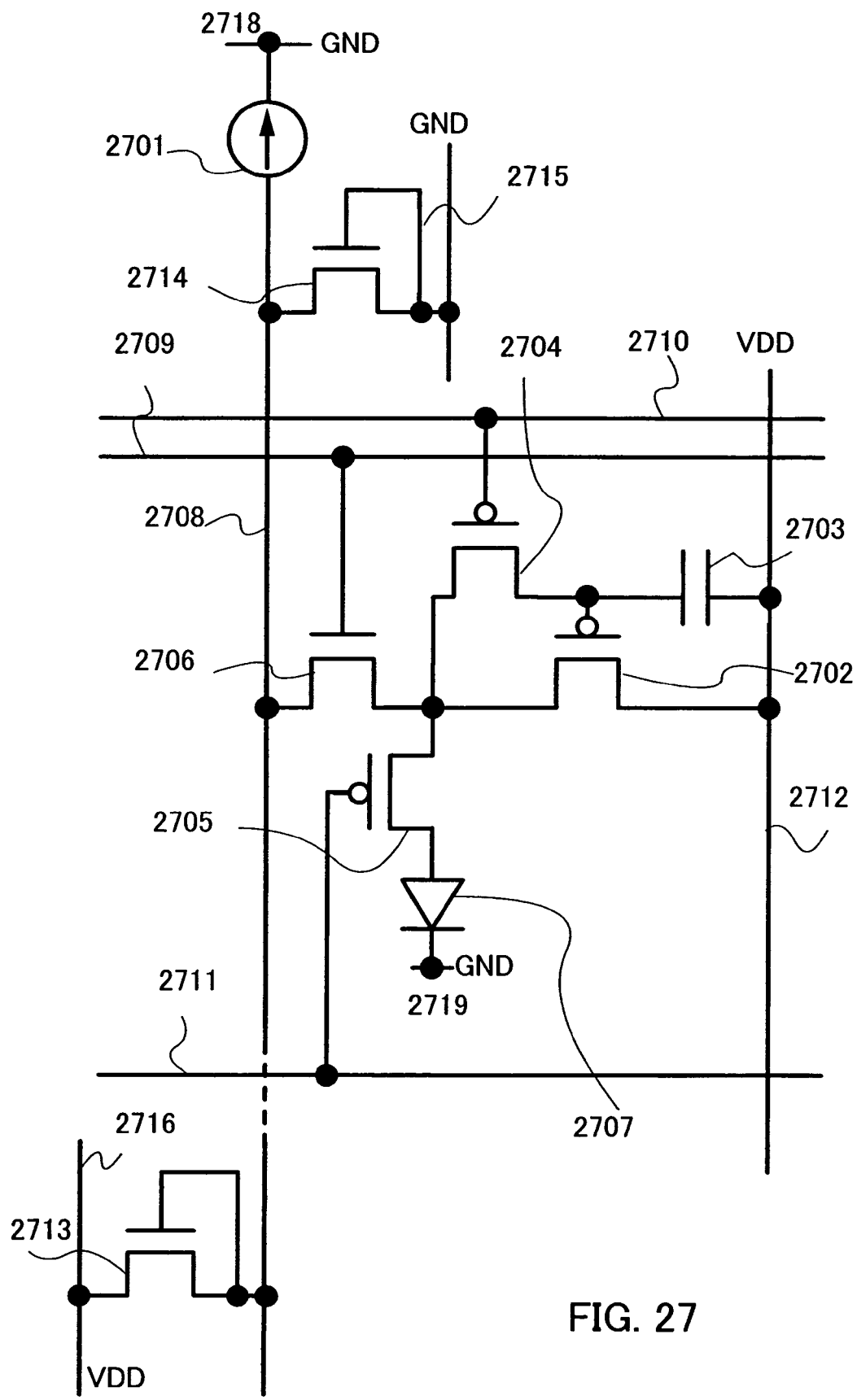
FIG. 27 is a diagram showing the pixel configuration of the invention.

FIG. 27 shows a fifth configuration. A pixel in FIG. 27 includes a source signal line 2708, a first gate signal line 2709, a second gate signal line 2710, a third gate signal line 2711, a power source line 2712, a first TFT 2706, a second TFT 2704, a third TFT 2705, a fourth TFT 2702, a capacitor 2703, a light emitting element 2707, and a video signal input current source 2701.

A gate terminal of the first TFT 2706 is connected to the first gate signal line 2709, a source terminal thereof is connected to the source signal line 2708, and a drain terminal thereof is connected to a drain terminal of the second TFT 2704, a drain terminal of the third TFT 2705, and a source terminal of the fourth TFT 2702. A gate terminal of the second TFT 2704 is connected to the second gate signal line 2710 and a source terminal thereof is connected to a gate terminal of the fourth TFT 2702. A source terminal of the fourth TFT 2702 is connected to the power source line 2712. A gate terminal of the third TFT 2705 is connected to the third gate signal line 2711 and a drain terminal thereof is connected to an anode of the light emitting element 2707. The capacitor 2703 is provided between a gate terminal of the fourth TFT 2703 and the power source line 2712 and holds a gate-source voltage of the fourth TFT 2702. The power source line 2712 and a cathode of the light emitting element 2707 are inputted with predetermined potentials respectively and have a potential difference therebetween.

Here, a detailed driving method is disclosed in Japanese Patent Laid-Open No. 2004-054200, therefore, the description thereon is omitted here.

When writing a signal current to the pixel, a gate potential of the fourth TFT 2702 is accumulated in the capacitor 2703 by writing by the video signal input current source 2701. First, when a potential of the source signal line 2708 becomes lower than the normal range, the gate terminal of the fourth TFT 2702 is connected to the source signal line 2708 through the first TFT 2706 and the second TFT 2704, therefore, the gate potential of the fourth TFT 2702 becomes lower than the normal range. As the source terminal of the fourth TFT 2702 is connected to the power source line 2712, a gate-source voltage of the fourth TFT 2702 increases, therefore, a current flowing from the power source line 2712 to the fourth TFT 2702 increases as well. Accordingly, the potential of the source signal line 2708 turns back within the normal range rather easily.

On the other hand, in the case where the potential of the source signal line 2708 becomes higher than the normal range, an N-channel transistor which operates in the saturation region is often used for the video signal input current source 2701 connected to a low potential side as described in Embodiment Mode 2. Accordingly, a current flowing to the N-channel transistor does not change much when the potential of the source signal line 2708 becomes high, as described above. It is to be noted that the first TFT 2706 and the second TFT 2704 are on in the writing operation. Therefore, a terminal of the fourth TFT 2702 which is connected to the drain terminal of the first TFT 2706 corresponds to a source terminal, thus a gate and the source thereof are short-circuited through the second TFT 2704 which functions as a switch.

The fourth TFT 2702 is turned off and a current does not flow. A current flows to the capacitor 2703 reversely to the signal current. Accordingly, the writing operation is delayed even after the potential of the source signal line 2708 turns back within the normal range.

However, in the configuration in FIG. 27, a current supply TFT 2715 which supplies a current when the potential of the source signal line 2716 becomes lower than that of a wiring 2716, and a current discharge TFT 2713 which discharges a current when the potential of the source signal line 2708 becomes higher than that of the wiring 2716 are connected to the source signal line 2708. Accordingly, in the case where the potential of the source signal line becomes outside the normal range, a current is supplied to the current supply TFT 2715 and the current discharge TFT 2713, thereby the potential can turn back within the normal range rapidly. It is preferable to increase the current drive capacity of the current discharge TFT 2713. The current drive capacity is preferably increased overall the circuit such that the number of TFTs may be increased as well as W/L of a TFT is increased. The invention is not limited to the configuration of FIG. 27, but the current discharge TFT 2713 may be provided at the top of the pixel while the current supply TFT 2715 is provided at the bottom thereof, a pair of the current discharge TFT 2713 and the current supply TFT 2715 may be provided at the top and bottom of the pixel, or only the current discharge TFT 2713 may be provided as well. Further, a pair or one of the current supply TFT 2715 and the current discharge TFT 2713 may be provided for each pixel. In this pixel configuration, only the current discharge TFT 2713 may be provided as well.

Embodiment Mode 8

The invention can be applied to various electronic apparatuses. In specific, the invention can be applied to pixels and a signal driver circuit which form a display portion of an electronic apparatus. Such electronic apparatuses include a video camera, a digital camera, a goggle type display (a head mounted display), a navigation system, an audio reproducing apparatus (a car audio set, an audio component system and the like), a laptop computer, a game machine, a portable information terminal (a portable computer, a portable phone, a portable game machine, an electronic book, and the like), an image reproducing apparatus provided with a recording medium (specifically, an apparatus which reproduces a recording medium such as a DVD (Digital Versatile Disc) and has a display capable of displaying the reproduced image), and the like. In particular, the information terminal which is often viewed at a slant is required to have a wide viewing angle, therefore, the display device of the invention is preferably used. Specific examples of these electronic apparatuses are shown in FIGS. 30A to 30H.

Figure 30A:
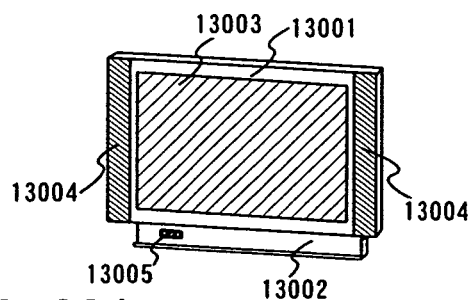
FIGS. 30A to 30H are views showing electronic apparatuses to which the invention is applied.

FIG. 30A illustrates a display including a housing 13001, a support 13002, a display portion 13003, speaker portions 13004, a video input terminal 13005 and the like. By using the invention in a power source circuit of the display portion 13003 of a display, operation defects due to noise can be reduced, which results in suppressing display unevenness. The display device of the invention can be a liquid crystal display device or a light emitting device. It is to be noted that the display includes display devices for displaying information such as for personal computer, receiving TV broadcast, and advertisement.

Figure 30B:
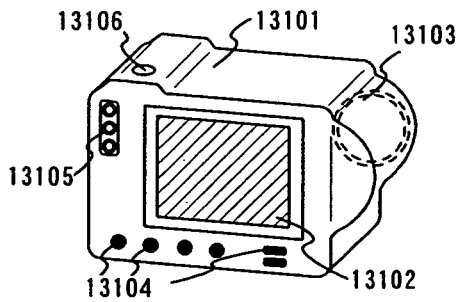

FIG. 30B illustrates a digital still camera including a main body 13101, a display portion 13102, an image receiving portion 13103, operating keys 13104, an external connecting port 13105, a shutter 13106 and the like. By using the invention in a power source circuit of the display portion 13102 of a display, operation defects due to noise can be reduced, which results in suppressing display unevenness.

Figure 30C:
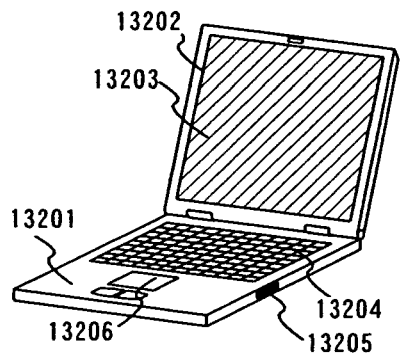

FIG. 30C illustrates a laptop computer including a main body 13201, a housing 13202, a display portion 13203, a keyboard 13204, an external connecting port 13205, a pointing mouse 13206 and the like. By using the invention in a power source circuit of the display portion 13203 of a display, operation defects due to noise can be reduced, which results in suppressing display unevenness.

Figure 30D:
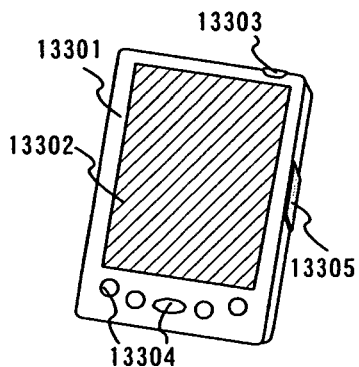

FIG. 30D illustrates a portable computer including a main body 13301, a display portion 13302, a switch 13303, operating keys 13304, an infrared port 13305 and the like. By using the invention in a power source circuit of the display portion 13302 of a display, operation defects due to noise can be reduced, which results in suppressing display unevenness.

Figure 30E:
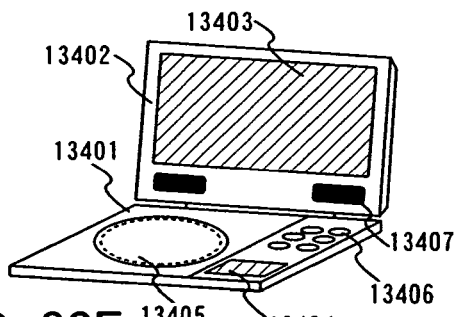

FIG. 30E illustrates a portable image reproducing apparatus provided with a recording medium (specifically a DVD reproducing apparatus), including a main body 13401, a housing 13402, a display portion A 13403, a display portion B 13404, a recording medium (DVD and the like) reading portion 13405, an operating key 13406, a speaker portion 13407 and the like. The display portion A 13403 mainly displays image data while the display portion B 13404 mainly displays text data. By using the invention in a power source circuit of the display portions A 13403 and B 13404 of a display, operation defects due to noise can be reduced, which results in suppressing display unevenness. Note that the image reproducing apparatus provided with a recording medium includes a home game machine and the like.

Figure 30F:
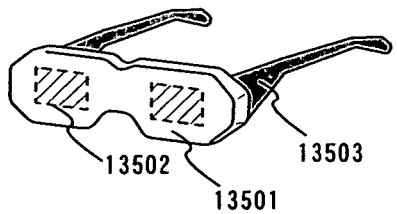

FIG. 30F illustrates a goggle type display (a head mounted display), including a main body 13501, a display portion 13502, and an arm portion 13503. By using the invention in a power source circuit of the display portion 13502 of a display, operation defects due to noise can be reduced, which results in suppressing display unevenness.

Figure 30G:
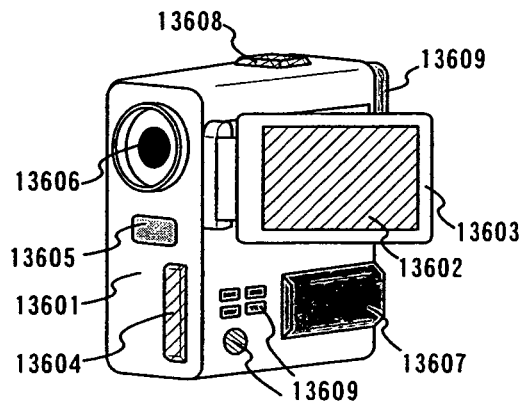

FIG. 30G illustrates a video camera including a main body 13601, a display portion 13602, a housing 13603, an external connecting port 13604, a remote control receiving portion 13605, an image receiving portion 13606, a battery 14607, an audio input portion 13608, operating keys 13609 and the like. By using the invention in a power source circuit of the display portion 13602 of a display, operation defects due to noise can be reduced, which results in suppressing display unevenness.

Figure 30H:
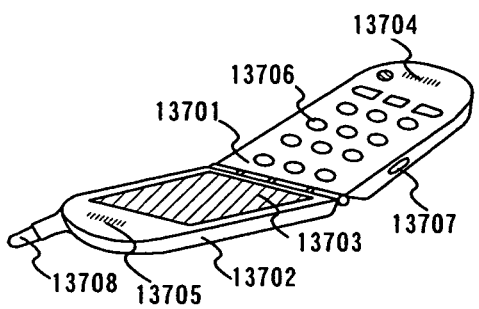
Figure 31:
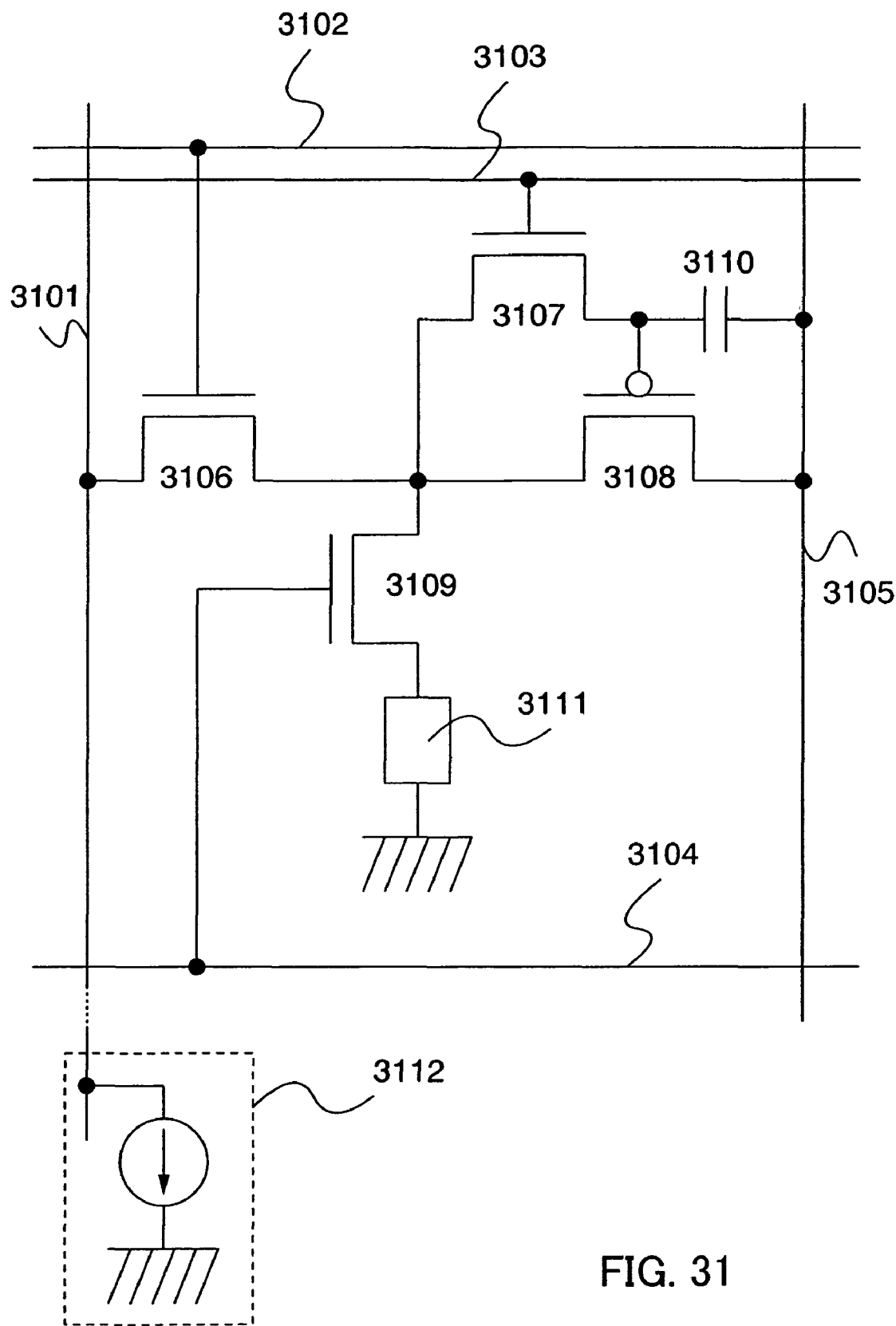
FIG. 31 is a diagram showing a conventional pixel configuration.
Figure 32A:
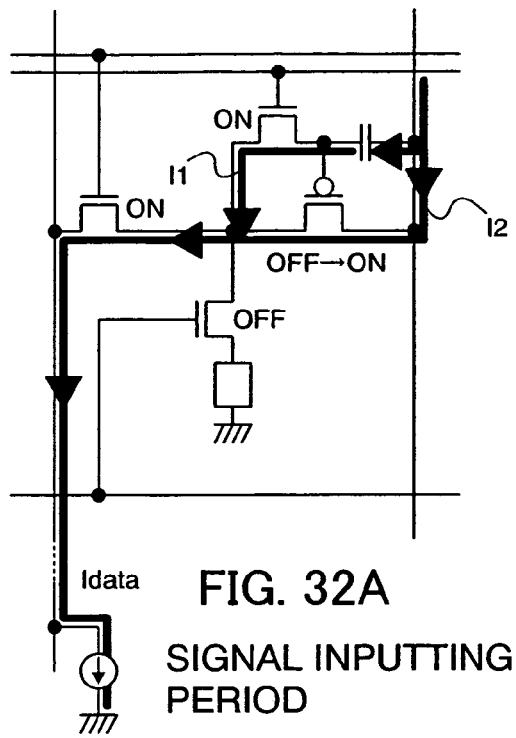
FIGS. 32A to 32E are diagrams each showing a conventional pixel configuration.
Figure 32B:
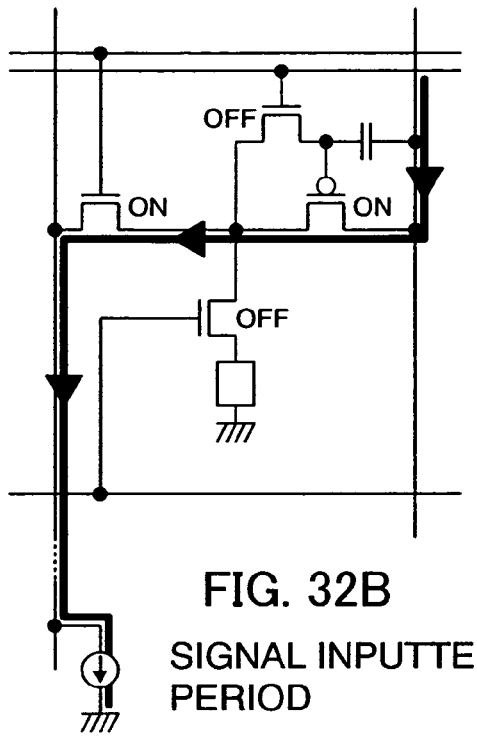
Figure 32C:
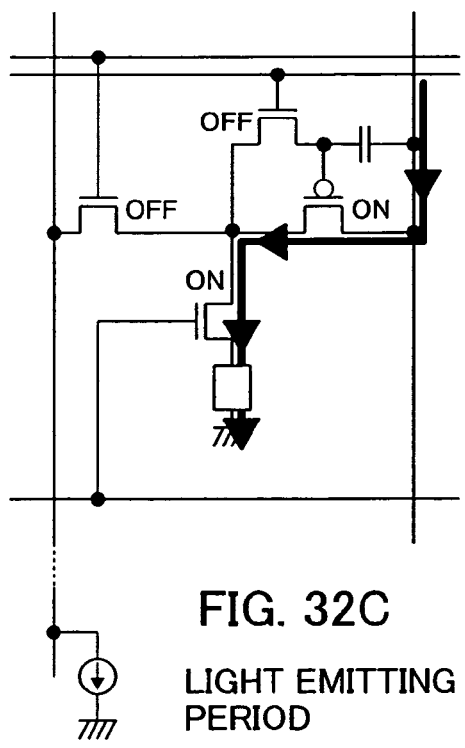
Figure 32D:
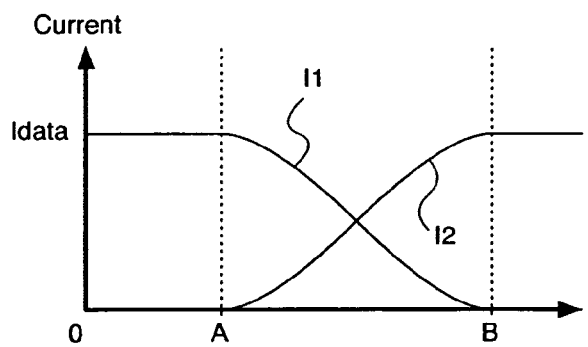
Figure 32E:
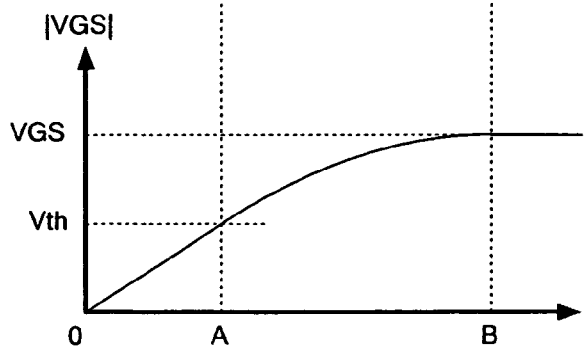

FIG. 30H illustrates a portable phone including a main body 13701, a housing 13702, a display portion 13703, an audio input portion 13704, an audio output portion 13705, an operating key 13706, an external connecting port 13707, an antenna 13708 and the like. By using the invention in a power source circuit of the display portion 13703 of a display, operation defects due to noise can be reduced, which results in suppressing display unevenness.

As described above, the invention can be applied to various electronic apparatuses.

Embodiment 1

In this embodiment, a mask layout of the diode-connected transistors 1708 and 1709 described in Embodiment Mode 4 with reference to FIG. 21 is described with reference to FIG. 29.

Figure 29:
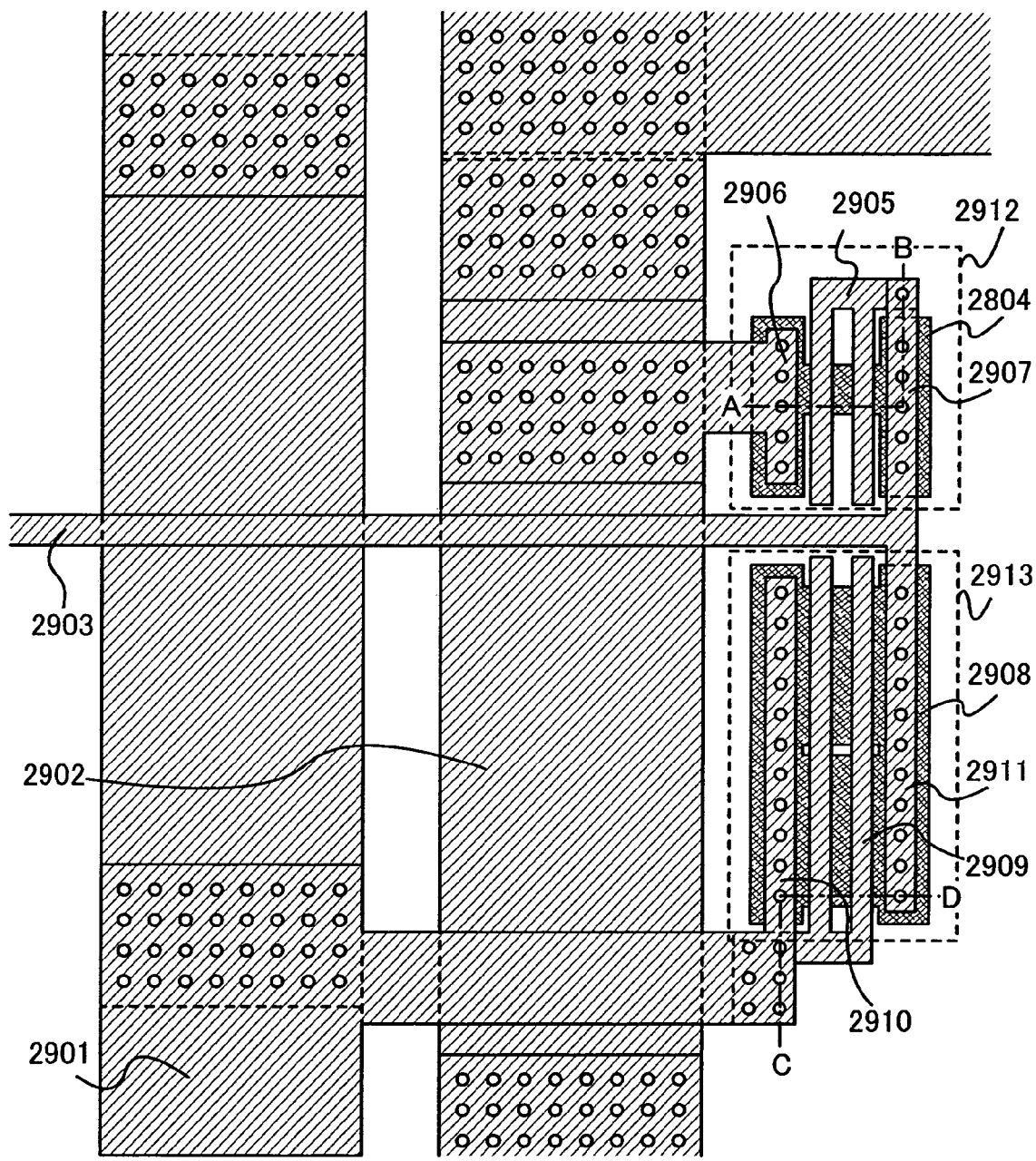
FIG. 29 is a mask layout of a diode-connected transistor which can be applied to the invention.

A transistor 2912 shown in FIG. 29 corresponds to the transistor 1709 disposed at the last column of the current source circuit 1712 shown in FIG. 18 while a transistor 2913 corresponds to the transistor 1708 disposed at the last column of the current source circuit 1712. The transistor 2912 described in this embodiment includes a semiconductor layer 2904, a gate electrode 2905, a source electrode 2907, and a drain electrode 2906. The gate electrode 2905 and the source electrode 2907 are connected through a contact hole. Moreover, the drain electrode 2906 is connected to a high potential (VDD) power source line 2902 through a contact hole. It is to be noted that the gate electrode 2905 has a double-gate structure in which a gate width of one gate is 6 µm. In other words, the channel length of the transistor 2912 is 12 µm and a channel width is 10 µm.

A transistor 2913 includes a semiconductor layer 2908, a gate electrode 2909, a source electrode 2910, and a drain electrode 2911. The gate electrode 2909 and the source electrode 2910 are connected through a contact hole. Moreover, the drain electrode 2906 is connected to a low potential (GND) power source line 2901 through a contact hole. It is to be noted that the gate electrode 2909 has what is called a double-gate structure, each of which has a gate width of 6 µm. In other words, the channel length of the transistor 2913 is 12 µm and a channel width is 100 µm.

The source electrode 2907 of the transistor 2912, the drain electrode 2911 of the transistor 2913, and the wiring 2903 are formed by patterning the same conductive film and connected to each other.

When noise occurs in the wiring 2903 and a potential thereof becomes outside the normal range, a current flows through the transistors 2912 and 2913 to turn the potential of the wiring 2903 back within the normal range. That is to say, when the potential of the wiring 2903 becomes higher than the high potential (VDD) power source line 2902, a current flows through the transistor 2912. In other words, the transistor 2912 can turn the potential of the wiring 2903 back to VDD. On the other hand, when the potential of the wiring 2903 becomes lower than the low potential (GND) power source line 2901, a current flows through the transistor 2913. In other words, the transistor 2913 can turn the potential of the wiring 2903 back to GND.

It is to be noted that the mask layout of this embodiment is only an example and the invention is not limited to this.

FIG. 50A shows a sectional view taken along a broken line A-B in FIG. 29 and FIG. 50B shows a sectional view taken along a broken line C-D of the same.

A base film 5002 is formed over a substrate 5001. As the substrate 5001, an insulating substrate such as a glass substrate, a quartz substrate, a plastic substrate, and a ceramics substrate, a metal substrate, a semiconductor substrate and the like can be used. The base film 5002 can be formed by CVD or sputtering. For example, a silicon oxide film, a silicon nitride film, a silicon oxynitride film and the like formed by CVD using $SiH_4$, $N_2O$, and $NH_3$ as a source material can be applied. Moreover, a stacked-layer of these films may be used as well. It is to be noted that the base film 5002 is provided for preventing impurities from dispersing from the substrate 5001 into a semiconductor layer and it is not required to be provided in the case of using a glass substrate or a quartz substrate for the substrate 5001.

An island shape semiconductor layer is formed over the base film 5002. The semiconductor layer includes an N-channel forming region 5003, an impurity region 5004 to be a source region or a drain region of an N-channel transistor, a low concentration impurity region (LDD region) 5005, a P-channel forming region 5011, and an impurity region 5012 to be a source region or a drain region of a P-channel transistor. A gate electrode 5007 is formed over the channel forming region 5003 and the channel forming region 5011 with the gate insulating film 5005 interposed therebetween. A first wiring 5014 and a second wiring 5015 which extend from the gate electrode 5007 are formed. For the gate insulating film 5006, a silicon oxide film, a silicon nitride film, a silicon oxynitride film and the like formed by CVD or sputtering can be used. For the gate electrode 5007, the first wiring 5014 and the second wiring 5015, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film and the like can be used.

A side wall 5008 is formed on a side of the gate electrode 5007. The side wall 5008 can be formed by forming a silicon oxide film, a silicon nitride film, or a silicon oxynitride film so as to cover the gate electrode 5007 and then etching back.

It is to be noted that the LDD region 5005 is provided under the side wall 5008. That is, the LDD region 5005 is formed in a self-aligned manner.

An interlayer insulating film 5009 is formed over the gate electrode 5007, the first wiring 5014, the second wiring 5015, the side wall 5008 and the gate insulating film 5006. The interlayer insulating film 5009 includes an inorganic insulating film as a bottom layer and a resin film as a top layer. For the inorganic insulating film, a silicon nitride film, a silicon oxide film, a silicon oxynitride film or a stacked-layer of these films can be used. For the resin film, polyimide, polyamide, acryl, polyimide amide, epoxy and the like can be used.

A third wiring 5010 and a fourth wiring 5013 are formed over the interlayer insulating film 5009. It is to be noted that the third wiring 5010 is electrically connected to the impurity region 5004 through contact holes. The third wiring 5010 is connected to the impurity region 5004 and the first wiring 5014 through contact holes. The fourth wiring 5013 is connected to the impurity region 5012 and the second wiring 5015 through contact holes. For the third wiring 5010 and the fourth wiring 5013, a titanium (Ti) film, an aluminum (Al) film, a copper (Cu) film, an aluminum film containing Ti and the like can be used. It is preferable to use low resistant copper in the case of providing a wiring such as a signal line in the same layer as the third wiring 5010 and the fourth wiring 5013.

Embodiment 2

In this embodiment, description is made with reference to FIGS. 46A and 46B on a structure of a display panel of a display device including the current source circuit of the invention in a pixel and a portion of a signal driver circuit.

FIG. 46A is a top plan view of a display panel and FIG. 46B is a sectional view taken along a broken line A-A' in FIG. 46A. A signal driver circuit 4601, a pixel portion 4602, a scan driver circuit 4606 shown by a dotted line are provided. A sealing substrate 4604 and a sealing member 4605 which surrounds a space 4607 are provided.

It is to be noted that a wiring 4608 transmits signals inputted to the scan driver circuit 4606 and the signal driver circuit 4601 and receives a video signal, a clock signal, a start signal and the like from an FPC (Flexible Printed Circuit) 4609 as an external input terminal. An IC chip (a semiconductor chip in which a memory circuit, a buffer circuit and the like are formed) 4646 is mounted on a connecting portion between the FPC 4609 and the display panel by COG (Chip On Glass) and the like. It is to be noted that a printed wiring board (PWB) may be attached to the FPC, although only the FPC is shown here. A display device in this specification includes not only a main body of a display panel, but also an FPC or a PWB attached to it. Moreover, an IC chip and the like may be included as well.

Next, a sectional structure is described with reference to FIG. 46B. A pixel portion 4602 and a peripheral driver circuit (the scan driver circuit 4606 and the signal driver circuit 4601) are formed over the substrate 4610, however, only the signal driver circuit 4601 and the pixel portion 4602 are shown here.

It is to be noted that the signal driver circuit 4601 is formed of a unipolar transistor such as an N-channel TFT 4620 and an N-channel TFT 4621. It is to be noted that the scan driver circuit 4606 is formed by an N-channel transistor similarly. As a unipolar transistor can be used by applying the pixel configuration of the invention, a unipolar display panel can be fabricated.

In this embodiment mode, a display panel in which a peripheral driver circuit is integrated on the substrate is shown, however, the invention is not limited to this and all or a portion of the peripheral driver circuit may be formed by an IC chip and the like and mounted by COG and the like. In that case, a driver circuit is not required to be unipolar, but a P-channel transistor can be used in combination. Although the transistors 1301 and 1302 in the display device shown in FIG. 13 are not shown in the display device of this embodiment, a transistor is provided for each peripheral driver circuit.

The pixel portion 4602 includes a plurality of circuits which constitute pixels each of which has a switching TFT 4611 and a driving TFT 4612. A source electrode of the driving TFT 4612 is connected to the first electrode 4613. Further, an insulator 4614 is formed of a positive type photosensitive acryl resin film so as to cover end portions of the first electrode 4613.

In order to obtain a favorable coverage, top or bottom portion of the insulator 4616 is formed to have a curvature. For example, in the case of using a positive type photosensitive acryl as a material for the insulator 4616, it is preferable that only the top portion of the insulator 4616 have a curvature (0.2 to 3 μm). Either of a negative type photosensitive acryl which is insoluble to etchant by photosensitive light and a positive type photosensitive acryl which is soluble to etchant by light can be used for the insulator 4616.

A layer 4616 containing an organic compound and a second electrode 4617 are formed over the first electrode 4613. Here, it is preferable to use a high work function material as a material for the first electrode 4613 which functions as an anode. For example, a single layer of an ITO (Indium Tin Oxide) film, an indium zinc oxide (IZO) film, a titanium nitride film, a chromium film, a tungsten film, a Zn film, a Pt film and the like, a stacked-layer of the aforementioned film and a film containing titanium nitride and aluminum as main components, a three-layer structure of the aforementioned film, a film containing titanium nitride and aluminum as main components, and a titanium nitride film, and the like can be used. It is to be noted that the stacked-layer structure makes the resistance of wiring low, provides a favorable ohmic contact, and can function as an anode.

The layer 4616 containing an organic compound is formed by deposition using a deposition mask or ink-jetting. A metal complex belonging to a group four of a periodic table is used for a portion of the layer 4616. Moreover, a high or low molecular weight material may be used in combination. For a material used for the layer containing an organic compound, an organic compound is often used in a single layer or a stacked-layer, however, an inorganic compound may be contained in a portion of the film formed of an organic compound as well in this embodiment mode. Further, a known triplet material can be used.

For a material used for a second electrode (cathode) 4617 formed over the layer 4616 containing an organic compound, a low work function material (Al, Ag, Li, and Ca) or an alloy of these (MgAg, MgIn, AlLi, CaF$_2$, or CaN) is to be used. In the case where light generated in the layer 4616 containing an organic compound transmits the second electrode 4617, a stacked-layer of a metal thin film having a thin film thickness and a light-transmitting conductive film (ITO (indium tin oxide), indium tin oxide zinc oxide alloy (In$_2$O$_3$—ZnO), zinc oxide (ZnO) and the like) is preferably used.

By attaching the sealing substrate 4604 to the substrate 4610 with the sealing material 4605, a light emitting element 4618 is provided in the space 4607 surrounded by the substrate 4610, the sealing substrate 4604, and the sealing material 4605. The space 4607 may be filled with an inactive gas (nitrogen, argon and the like) as well as the sealing material 4605.

It is preferable to use epoxy-based resin for the sealing material 4605. Moreover, it is preferable that the material transmit moisture and oxygen as little as possible. For the sealing substrate 4604, a plastic substrate formed of FRP (Fiberglass-Reinforced Plastics), PVF (Poly Vinyl Fluoride), myler, polyester, acryl or the like can be used as well as a glass substrate and a quartz substrate.

As described above, a display panel having the pixel configuration of the invention can be obtained.

Figure 45:
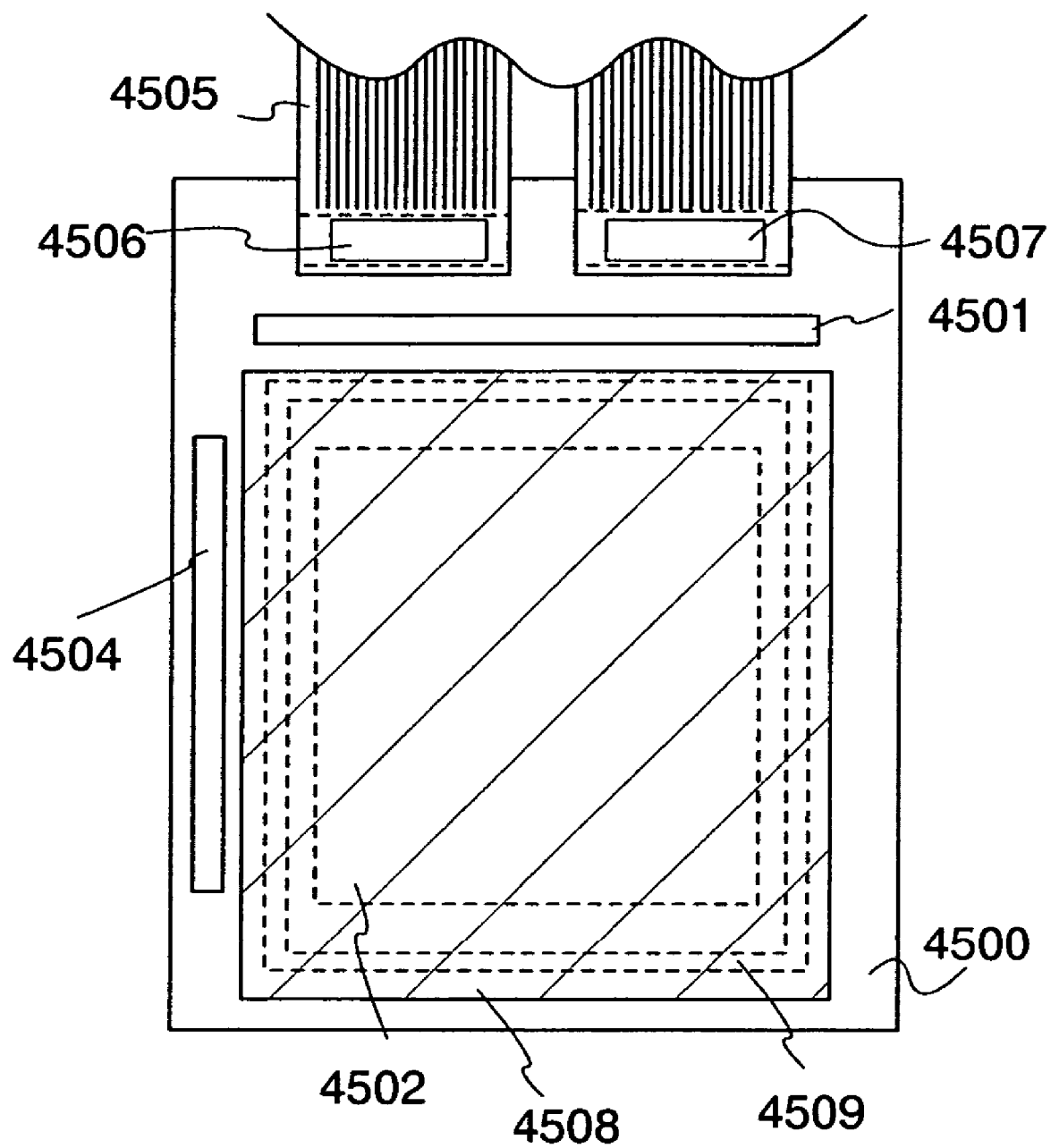
FIG. 45 is a diagram showing the display device of the invention.

The description has been made on the case of integrating the pixel portion and the peripheral driver circuit with a crystalline semiconductor (for example, polysilicon (P-Si:H)) applied to the semiconductor layer of the pixel portion, however, an amorphous semiconductor (for example, amorphous silicon (a-Si:H)) can be applied to the semiconductor layer of the pixel portion in a display device having the current source circuit of the invention in the pixel portion and a portion of a signal driver circuit. In such a case, a pixel portion 4502 is formed over a substrate 4500 and sealed with the substrate 4500 and a sealing substrate 4508 by using a sealing material 4509 as shown in FIG. 45. Moreover, a peripheral driver circuit (a signal driver circuit 4501 and a scan driver circuit 4504) is formed over an IC chip, which is mounted on a substrate by COG and the like. Then, the substrate 4500 and an FPC are connected. It is to be noted that a narrower frame can be obtained by mounting IC chips 4506 and 4507 on a connecting portion of the substrate 4500 and the FPC 4505.

Hereinafter described is a sectional structure of a part of a pixel portion in the case of applying an amorphous semiconductor to a semiconductor layer of the pixel portion.

FIGS. 47A and 47B show top gate transistors while FIGS. 48A, 48B, 49A, and 49B show bottom gate transistors.

FIG. 47A shows a sectional structure of a top gate transistor using an amorphous semiconductor as a semiconductor layer. A base film 4702 is formed over a substrate 4701. A pixel electrode 4703 is formed over the base film 4702. A first electrode 4704 formed of the same material as the pixel electrode 4703 is formed in the same layer as the pixel electrode 4703.

A glass substrate, a quartz substrate, a ceramics substrate and the like can be used for the substrate 4701. For the base film 4702, a single layer or a stacked-layer of aluminum nitride (AlN), silicon oxide (SiO$_2$), silicon oxynitride (SiO$_x$N$_y$) and the like can be used.

A wiring 4705 and a wiring 4706 are formed over the base film 4702, and an end portion of the pixel electrode 4703 is covered with the wiring 4705. N-type semiconductor layers 4707 and 4708 having N-type conductivity are formed over the wirings 4705 and 4706. A semiconductor layer 4709 is formed between the wirings 4705 and 4706 over the base film 4702. A portion of the semiconductor layer 4709 extends over the N-type semiconductor layers 4707 and 4708. It is to be noted that each of these semiconductor layers are formed of a semiconductor film having non-crystallinity, such as amorphous silicon (a-Si:H), and microcrystalline semiconductor (µ-Si:H). A gate insulating film 4710 is formed over the semiconductor layer 4709. An insulating film 4711 formed of the same material as the gate insulating film 4710 is formed over the first electrode 4704 as well. Note that the gate insulating film 4710 is formed of a silicon oxide film, a silicon nitride film and the like.

A gate electrode 4712 is formed over the gate insulating film 4710. A second electrode 4713 formed of the same material as the gate electrode 4712 is formed in the same layer as the gate electrode 4712 over the first electrode 4704 with the insulating film 4711 interposed therebetween. The first electrode 4704 and the second electrode 4713 sandwich the insulating film 4711, thereby a capacitor 4719 is formed. An interlayer insulating film 4714 is formed so as to cover the end portion of the pixel electrode 4703, the driving transistor 4718 and the capacitor 4719.

A layer 4715 containing an organic compound and a counter electrode 4716 are formed over the interlayer insulating film 4714 and the pixel electrode 4703 provided in an aperture of the interlayer insulating film 4714. The pixel electrode 4703 and the counter electrode 4716 sandwich the layer 4715 containing an organic compound, thereby a light emitting element 4717 is formed.

Moreover, the first electrode 4704 shown in FIG. 47A may be formed of a first electrode 4720 as shown in FIG. 47B. The first electrode 4720 is formed of the same material and in the same layer as that of the wirings 4705 and 4706.

FIGS. 48A and 48B show sectional views of bottom gate transistors using an amorphous semiconductor in the semiconductor layer.

A base film 4802 is formed over a substrate 4801. A gate electrode 4803 is formed over the base film 4802. A first electrode 4804 formed of the same material as the gate electrode 4803 is formed in the same layer as the gate electrode 4803. A polycrystalline silicon to which phosphorus is added can be used for the material of the gate electrode 4803. Other than polycrystalline silicon, silicide may be used which is a compound of metal and silicon.

A gate insulating film 4805 is formed so as to cover the gate electrode 4803 and the first electrode 4804. A silicon oxide film, a silicon nitride film and the like are used as the gate insulating film 4805.

A semiconductor layer 4806 is formed over the gate insulating film 4805. A semiconductor layer 4807 formed of the same material as the semiconductor layer 4806 is formed in the same layer as the semiconductor layer 4806.

A glass substrate, a quartz substrate, a ceramics substrate and the like can be used for the substrate 4801. For the base film 4802, a single layer or a stacked-layer of aluminum nitride (AlN), silicon oxide (SiO$_2$), silicon oxynitride (SiO$_x$N$_y$) and the like can be used.

N-type semiconductor layers 4808 and 4809 having N-type conductivity are formed over the semiconductor layer 4806, and an N-type semiconductor layer 4810 is formed over the semiconductor layer 4807.

Wirings 4811 and 4812 are formed over the N-type semiconductor layers 4808, 4809, and 4810 respectively. A conductive layer 4813 formed of the same material as that of the wirings 4811 and 4812 is formed over the N-type semiconductor layer 4810.

A second electrode is formed of the semiconductor layer 4807, the N-type semiconductor layer 4810 and the conductive layer 4813. The second electrode and the first electrode 4804 sandwich the gate insulating film 4802, thereby a capacitor 4820 is formed.

One of end portions of the wiring 4811 extends, on which a pixel electrode 4814 is formed.

An insulator 4813 is formed so as to cover an end portion of the pixel electrode 4814, the driving transistor 4819, and the capacitor 4820.

A layer 4816 containing an organic compound and a counter electrode 4817 are formed over the pixel electrode 4814 and the insulator 4815. The pixel electrode 4814 and the counter electrode 4817 sandwich the layer 4816 containing an organic compound, thereby a light emitting element 4818 is formed.

The semiconductor layer 4807 and the N-type semiconductor layer 4810 which are part of the second electrode of the capacitor are not necessarily provided. That is, the conductive layer 4813 may be used as the second electrode to form a capacitor in which a gate insulating film is sandwiched by the first electrode 4804 and the conductive layer 4813.

In FIG. 48A, by forming the pixel electrode 4814 before forming the wiring 4811, a capacitor 4822 having a structure that the first electrode 4804 and a second electrode 4821 formed of the pixel electrode sandwich the gate insulating film 4805 as shown in FIG. 48B can be formed.

In FIGS. 48A and 48B, an inverted staggered transistor of channel etch structure is shown, however, a transistor of channel protective structure may be used as well. Description is hereafter made with reference to FIGS. 49A and 49B on the case 9 of a transistor of a channel protective structure.

A transistor of channel protective structure shown in FIG. 49A is different than the driving transistor 4819 of channel etch structure shown in FIG. 48A in that an insulator 4901 to be a mask against etching is provided in a region where a channel of the semiconductor layer 4806 of the driving transistor 4819 of channel etch structure is formed. Other common portions are denoted by the same reference numerals.

Similarly, the transistor of channel protective structure shown in FIG. 49B is different than the driving transistor 4819 of channel etch structure shown in FIG. 48B in that the insulator 4901 to be a mask against etching is provided in a region where a channel of the semiconductor layer 4806 of the driving transistor 4819 of channel etch structure is formed. Other common portions are denoted by the same reference numerals.

By using an amorphous semiconductor film as a semiconductor layer (a channel forming region, a source region, a drain region and the like) of a transistor included in the pixel configuration of the invention, a manufacturing cost can be reduced.

It is to be noted that the structures of transistor and capacitor applicable to the pixel configuration of the invention are not limited to the aforementioned, but a transistor and a capacitor of various structures can be used.

This application is based on Japanese Patent Application serial no. 2004-152601 filed in Japan Patent Office on May 21, 2004, the contents of which are hereby incorporated by reference.

What is claimed is:

1. A semiconductor device comprising:
   a transistor;
   a P-channel transistor having one of a source terminal and a drain terminal connected to a high potential power source so that a high potential can be applied to the one of the source terminal and the drain terminal;
   a wiring electrically connecting one of a source terminal and a drain terminal of the transistor and the other of the source terminal and the drain terminal of the P-channel transistor;
   a capacitor having a first terminal electrically connected to a gate terminal of the transistor and a second terminal electrically connected to a first power source line;
   a switch connected between the gate terminal of the transistor and the one of the source terminal and the drain terminal of the transistor;
   a first rectifying element having a third terminal electrically connected to the wiring and a fourth terminal electrically connected to a second power source line; and
   a second rectifying element having a fifth terminal electrically connected to the wiring and a sixth terminal electrically connected to a third power source line;
   wherein a forward current direction of the first rectifying element is a direction flowing from the third terminal to the fourth terminal,
   wherein a forward current direction of the second rectifying element is a direction flowing from the sixth terminal to the fifth terminal,
   wherein the first rectifying element and the second rectifying element comprise a first diode-connected thin film transistor and a second diode-connected thin film transistor, respectively,
   wherein a ratio W/L of a gate width W to a gate length L of the first diode connected thin film transistor is lower than a ratio W/L of the second diode-connected thin film transistor,
   wherein the semiconductor device is configured so that a current flows to at least one of the first rectifying element and the second rectifying element when a potential of the wiring becomes outside a set range so that the potential of the wiring returns back within the set range,
   wherein the second power source line has a higher potential than the first power source line and the third power source line, and
   wherein a current drive capacity of the second rectifying element is at least twice as large as a current drive capacity of the first rectifying element.

2. An electronic apparatus comprising the semiconductor device according to claim 1 in a display portion.

3. The semiconductor device according to claim 1,
   wherein the other of the source terminal and the drain terminal of the transistor is electrically connected to a low potential power source.

4. The semiconductor device according to claim 1,
   wherein the other of the source terminal and the drain terminal of the transistor is electrically connected to a low potential power source,
   wherein the semiconductor device is configured so that a potential of the high potential power source and a potential of the first line are higher than a potential of the low potential power source, a potential of the second line, and a potential of the third line.

5. The semiconductor device according to claim 1,
   wherein the first power source line and the third power source line are a same power source line.

6. A semiconductor device comprising:
   a transistor;
   an N-channel transistor having one of a source terminal and a drain terminal connected to a low potential power source so that a low potential can be applied to the one of the source terminal and the drain terminal;
   a wiring electrically connecting one of a source terminal and a drain terminal of the transistor and the other of the source terminal and the drain terminal of the N-channel transistor;

a capacitor having a first terminal electrically connected to a gate terminal of the transistor and a second terminal electrically connected to a first power source line;

a switch connected between the gate terminal of the transistor and the one of the source terminal and the drain terminal of the transistor;

a first rectifying element having a third terminal electrically connected to the wiring and a fourth terminal electrically connected to a second power source line; and a second rectifying element having a fifth terminal electrically connected to the wiring and a sixth terminal electrically connected to a third power source line;

wherein a forward current direction of the first rectifying element is a direction flowing from the third terminal to the fourth terminal, wherein a forward current direction of the second rectifying element is a direction flowing from the sixth terminal to the fifth terminal, wherein the first rectifying element and the second rectifying element comprise a first diode-connected thin film transistor and a second diode-connected thin film transistor, respectively, wherein a ratio W/L of a gate width W to a gate length L of the first diode connected thin film transistor is higher than a ratio W/L of the second diode-connected thin film transistor, wherein the semiconductor device is configured so that a current flows to at least one of the first rectifying element and the second rectifying element when a potential of the wiring becomes outside a set range so that the potential of the wiring returns back within the set range, wherein the first power source line and the second power source line each have a higher potential than the third power source line, and wherein a current drive capacity of the first rectifying element is at least twice as large as a current drive capacity of the second rectifying element.

7. An electronic apparatus comprising the semiconductor device according to claim 6 in a display portion.

8. The semiconductor device according to claim 6,
wherein the other of the source terminal and the drain terminal of the transistor is electrically connected to a high potential power source.

9. The semiconductor device according to claim 6,
wherein the other of the source terminal and the drain terminal of the transistor is electrically connected to a high potential power source,
wherein the semiconductor device is configured so that a potential of the high potential power source, a potential of the first line, and a potential of the third line are higher than a potential of the low potential power source and a potential of the second line.

10. The semiconductor device according to claim 6,
wherein the first power source line and the second power source line are a same power source line.

11. A display device comprising:
a plurality of pixels arranged in matrix;
a first wiring provided in a row direction for selecting corresponding one of the plurality of the pixels;
a second wiring provided in a column direction for inputting a signal current to corresponding one of the plurality of the pixels;
a current control transistor electrically connecting a potential power source to the second wiring;
a first rectifying element electrically connected between the second wiring and a second power source line; and a second rectifying element electrically connected between the second wiring and a first power source line;

wherein a forward current direction of the first rectifying element is a direction flowing from the second wiring to the second power source line, wherein a forward current direction of the second rectifying element is a direction flowing from the first power source line to the second wiring, wherein the first rectifying element and the second rectifying element are a first diode-connected thin film transistor and a second diode-connected thin film transistor, respectively, wherein a ratio W/L of a gate-width W to a gate length L of the first diode connected thin film transistor is lower than a ratio W/L of the second diode connected thin film transistor, wherein the display device is configured so that a current flows to at least one of the first rectifying element and the second rectifying element when a potential of the second wiring becomes outside a set range so that the potential of the second wiring returns back within the set range, wherein the second power source line has a higher potential than the first power source line, wherein a current drive capacity of the first rectifying element is at least twice as large as a current drive capacity of the second rectifying element when the current control transistor is an N-channel transistor, and wherein a current drive capacity of the second rectifying element is at least twice as large as a current drive capacity of the first rectifying element when the current control transistor is a P-channel transistor.

12. An electronic apparatus comprising the display device according to claim 11 in a display portion.

13. The display device according to claim 11,
wherein the display device is configured so that a potential of the potential power source and a potential of the first line are higher than a potential of the second line when the current control transistor is a P-channel transistor, and
wherein the display device is configured so that the potential of the first line is higher than the potential of the potential power source and the potential of the second line when the current control transistor is an N-channel transistor.

14. A display device comprising:
a plurality of pixels arranged in matrix;
a gate line electrically connected to corresponding one of the plurality of the pixels;
a source signal line for inputting a signal current to corresponding the one of the plurality of the pixels;
a current control transistor electrically connecting a potential power source to the source signal line;
a first rectifying element electrically connected between the source signal line and a second power source line; and
a second rectifying element electrically connected between the source signal line and a first power source line;
wherein a forward current direction of the first rectifying element is a direction flowing from the source signal line to the second power source line,
wherein a forward current direction of the second rectifying element is a direction flowing from the first power source line to the source signal line,
wherein the first rectifying element and the second rectifying element are a first diode-connected thin film transistor and a second diode-connected thin film transistor, respectively, wherein a ratio W/L of a gate width W to a gate length L of the first diode connected thin film transistor is lower than a ratio W/L of the second diode-connected thin film transistor, wherein the display device is configured so that a current flows to at least one of the first rectifying element and the second rectifying element when a potential of the source signal line becomes outside a set range so that the potential of the source signal line returns back within the set range, wherein the second power source line has a higher potential than the first power source line, wherein a current drive capacity of the first rectifying element is at least twice as large as a current drive capacity of the second rectifying element when the current control transistor is an N-channel transistor, and wherein a current drive capacity of the second rectifying element is at least twice as large as a current drive capacity of the first rectifying element when the current control transistor is a P-channel transistor.

15. An electronic apparatus comprising the display device according to claim 14 in a display portion.

16. The display device according to claim 14, wherein the display device is configured so that a potential of the potential power source and a potential of the first line are higher than a potential of the second line when the current control transistor is a P-channel transistor, and wherein the display device is configured so that the potential of the first line is higher than the potential of the potential power source and the potential of the second line when the current control transistor is an N-channel transistor.

17. A display device comprising:
a plurality of pixels arranged in matrix;
a gate line electrically connected to corresponding one of the plurality of the pixels;
a source signal line electrically connected to corresponding one of the plurality of pixels; and
a signal driver circuit, comprising:
a potential power source;
a wiring;
a current control transistor electrically connecting the potential power source to the wiring,
a first rectifying element electrically connected between the wiring and a second power source line; and
a second rectifying element electrically connected between the wiring and a first power source line;
wherein a forward current direction of the first rectifying element is a direction flowing from the wiring to the second power source line,
wherein a forward current direction of the second rectifying element is a direction flowing from the first power source line to the wiring,
wherein the first rectifying element and the second rectifying element are a first diode-connected thin film transistor and a second diode-connected thin film transistor, respectively,
wherein a ratio W/L of a gate-width W to a gate length L of the first diode connected thin film transistor is lower than a ratio W/L of the second diode connected thin film transistor,
wherein the display device is configured so that a current flows to at least one of the first rectifying element and the second rectifying element when a potential of the wiring becomes outside a set range so that the potential of the wiring returns back within the set range,
wherein the second power source line has a higher potential than the first power source line,
wherein a current drive capacity of the first rectifying element is at least twice as large as a current drive capacity of the second rectifying element when the current control transistor is an N-channel transistor, and
wherein a current drive capacity of the second rectifying element is at least twice as large as a current drive capacity of the first rectifying element when the current control transistor is a P-channel transistor.

18. An electronic apparatus comprising the display device according to claim 17 in a display portion.

19. The display device according to claim 17, wherein the display device is configured so that a potential of the potential power source and a potential of the first line are higher than a potential of the second line when the current control transistor is a P-channel transistor, and wherein the display device is configured so that the potential of the first line is higher than the potential of the potential power source and the potential of the second line when the current control transistor is an N-channel transistor.

20. A semiconductor device comprising:
a transistor;
a current source comprising a potential power source and a current control transistor having one of a source and a drain electrically connected to the potential power source;
a wiring electrically connected between one of a source terminal and a drain terminal of the transistor and the current source;
a capacitor having a first terminal electrically connected to a gate terminal of the transistor and a second terminal electrically connected to a first power source line;
a switch connected between the gate terminal of the transistor and the one of the source terminal and the drain terminal of the transistor;
a first rectifying element having a third terminal electrically connected to the wiring and a fourth terminal electrically connected to a second power source line; and
a second rectifying element having a fifth terminal electrically connected to the wiring and a sixth terminal electrically connected to a third power source line;
wherein the first rectifying element and the second rectifying element comprise a first diode-connected thin film transistor and a second diode-connected thin film transistor, respectively,
wherein a ratio W/L of a gate width W to a gate length L of the first diode connected thin film transistor is lower than a ratio W/L of the second diode-connected thin film transistor;
wherein the semiconductor device is configured so that a current flows to at least one of the first rectifying element and the second rectifying element when a potential of the wiring becomes outside a set range so that the potential of the wiring returns back within the set range,
wherein the second power source line has a higher potential than the third power source line,
wherein the semiconductor device is configured so that a current flows to at least one of the first rectifying element and the second rectifying element when a potential of the wiring becomes outside a set range so that the potential of the wiring returns back within the set range,
wherein a current drive capacity of the first rectifying element is at least twice as large as a current drive capacity of the second rectifying element when the current control transistor is an N-channel transistor, and wherein a current drive capacity of the second rectifying element is at least twice as large as a current drive capacity of the first rectifying element when the current control transistor is a P-channel transistor.

21. The semiconductor device according to claim 20, wherein the first rectifying element comprises two diode-connected transistors connected in series between the third terminal and the fourth terminal, and wherein the second rectifying element comprises two diode-connected transistors connected in series between the fifth terminal and the sixth terminal.

22. An electronic apparatus comprising the semiconductor device according to claim 17 in a display portion.

23. The semiconductor device according to claim 20, wherein, when the current control transistor is a P-channel transistor, the first power source line and the third power source line are a same power source line, and wherein, when the current control transistor is an N-channel transistor, the first power source line and the second power source line are a same power source line.

24. A display device comprising:

a source line connected to a low potential power source line through an N-channel transistor;

a power source line;

a first diode-connected thin film transistor comprising a source terminal, a drain terminal, and a gate terminal, the gate terminal being electrically connected to the low potential power source and one of the source terminal and the drain terminal, the other of the source terminal and the drain terminal being electrically connected to the source line;

a second diode-connected thin film transistor comprising a source terminal, a drain terminal, and a gate terminal, the gate terminal being electrically connected to one of the source terminal and the drain terminal and to the source line, the other of the source terminal and the drain terminal being electrically connected to the power source line; and a pixel comprising:

a first transistor comprising one of a source and a drain electrically connected to the source line;

a second transistor comprising one of a source and a drain electrically connected to the other of the source and the drain of the first transistor, and the other of the source and the drain electrically connected to the power source line;

a third transistor comprising one of a source and a drain electrically connected to the other of the source and the drain of the first transistor, and the other of the source and third drain electrically connected to a gate of the second transistor;

a fourth transistor comprising one of a source and a drain electrically connected to the other of the source and the drain of the first transistor; a capacitor comprising a first terminal electrically connected to the gate of the second transistor and a second terminal electrically Connected to the power source line; and a light-emitting element comprising an electrode electrically connected to the other of the source and the drain of the fourth transistor, wherein a forward current direction of the first diode-connected thin film transistor is a direction flowing from the one of the source terminal and drain terminal connected to the low potential power source to the other one of the source terminal and drain terminal connected to the source line, wherein a forward current direction of the second diode-connected thin film transistor is a direction flowing from the one of the source terminal and drain terminal connected to the source line to the other one of the source terminal and drain terminal connected to the power source line, wherein a ratio W/L of a gate width W to a gate length L of the second diode-connected thin film transistor is higher than a ratio W/L of the first diode-connected thin film transistor, wherein the display device is configured so that a current flows to at least one of the first rectifying element and the second rectifying element when a potential of the source line becomes outside a set range so that the potential of the source line returns back within the set range, wherein the power source line has a higher potential than the low potential power source line, and wherein a current drive capacity of the second diode-connected transistor is at least twice as large as a current drive capacity of the first diode-connected transistor.

25. The display device according to claim 24, wherein the second transistor, the third transistor and the fourth transistor are P-channel transistors.

26. The display device according to claim 24, wherein the power source line is a high potential power line; and wherein another electrode of the light-emitting element is connected to a low potential power line.

27. The display device according to claim 24, wherein the first diode-connected transistor is connected to a low voltage potential power line; and wherein the second diode-connected transistor is connected to a high voltage potential power line.

28. An electronic apparatus comprising the display device according to claim 24 in a display portion.

* * * * *

UNITED STATES PATENT AND TRADEMARK OFFICE
CERTIFICATE OF CORRECTION

PATENT NO. : 8,355,015 B2
APPLICATION NO. : 11/128321
DATED : January 15, 2013
INVENTOR(S) : Hajime Kimura et al.

It is certified that error appears in the above-identified patent and that said Letters Patent is hereby corrected as shown below:

At column 2, line 65, "Idata=12" should be --Idata=I2--;

At column 23, line 40, "source is 12" should be --source is I2--;

At column 25, line 3, "Vb-B" should be --Vb-$\beta$--;

At column 34, line 42, "Agate" should be --A gate--;

At column 35, line 57, "12606" should be --2606--;

At column 51, line 15, "according to claim 17" should be --according to claim 20--;

At column 52, line 46, "low voltage potential" should be --low potential--;

At column 52, line 48, "high voltage potential" should be --high potential--.

Signed and Sealed this
Nineteenth Day of March, 2013

Teresa Stanek Rea
*Acting Director of the United States Patent and Trademark Office*

UNITED STATES PATENT AND TRADEMARK OFFICE
CERTIFICATE OF CORRECTION

| | | Page 1 of 1 |
|---|---|---|
| PATENT NO. | : 8,355,015 B2 | |
| APPLICATION NO. | : 11/128321 | |
| DATED | : January 15, 2013 | |
| INVENTOR(S) | : Kimura et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 982 days.

Signed and Sealed this
Eighteenth Day of November, 2014

Michelle K. Lee
*Deputy Director of the United States Patent and Trademark Office*